(12) United States Patent
Kim et al.

(10) Patent No.: US 11,665,925 B2
(45) Date of Patent: May 30, 2023

(54) DISPLAY APPARATUS AND MULTI DISPLAY APPARATUS INCLUDING THE SAME

(71) Applicant: LG Display Co., Ltd., Seoul (KR)

(72) Inventors: Yong-Il Kim, Paju-si (KR); JungHo Bang, Paju-si (KR); EunYoung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 225 days.

(21) Appl. No.: 17/136,361

(22) Filed: Dec. 29, 2020

(65) Prior Publication Data
US 2021/0202906 A1 Jul. 1, 2021

(30) Foreign Application Priority Data

Dec. 31, 2019 (KR) .......................... 10-2019-0180118

(51) Int. Cl.
*H10K 50/844* (2023.01)
*H10K 59/10* (2023.01)
*H10K 59/121* (2023.01)
*H01L 51/52* (2006.01)
*H01L 27/32* (2006.01)

(52) U.S. Cl.
CPC ........ *H01L 51/5253* (2013.01); *H01L 27/326* (2013.01); *H01L 27/3237* (2013.01)

(58) Field of Classification Search
CPC ............. H01L 27/3293; H01L 27/3223; H01L 27/3258; H01L 51/5253
See application file for complete search history.

(56) References Cited

U.S. PATENT DOCUMENTS

| | | | |
|---|---|---|---|
| 2019/0081273 A1 | 3/2019 | Sung et al. | |
| 2019/0140037 A1* | 5/2019 | Lee | ...................... H01L 51/5284 |
| 2019/0214446 A1* | 7/2019 | Kim | ...................... H01L 27/3293 |
| 2020/0051966 A1* | 2/2020 | Lee | ........................ H01L 25/18 |

FOREIGN PATENT DOCUMENTS

| | | | | |
|---|---|---|---|---|
| KR | 10-1441956 B1 | 9/2014 | | |
| KR | 10-2019-0029830 A | 3/2019 | | |
| WO | WO-2018179047 A1 * | 10/2018 | ............... | G09F 9/30 |
| WO | WO-2019094287 A1 * | 5/2019 | ........... | H01L 24/741 |

* cited by examiner

*Primary Examiner* — Mariceli Santiago
(74) *Attorney, Agent, or Firm* — Morgan, Lewis & Bockius LLP

(57) ABSTRACT

A display apparatus includes a first substrate including a plurality of pixel areas provided in a display portion, a second substrate coupled to the first substrate, and a routing portion disposed on an outer surface of the first substrate and an outer surface of the second substrate. The first substrate includes a passivation layer disposed on the display portion, a barrier pattern portion implemented in the passivation layer on an edge portion of the display portion, the barrier pattern portion including a barrier metal pattern, and a light emitting device layer including a light emitting device disposed on the barrier pattern portion and the plurality of pixel areas, and the light emitting device is isolated by the barrier pattern portion.

19 Claims, 12 Drawing Sheets

DISPLAY APPARATUS AND MULTI DISPLAY APPARATUS INCLUDING THE SAME

CROSS-REFERENCE TO RELATED APPLICATIONS

This application claims the benefit of the Korean Patent Application No. 10-2019-0180118 filed on Dec. 31, 2019, which is hereby incorporated by reference as if fully set forth herein.

BACKGROUND

Technical Field

The present disclosure relates to a display apparatus and a multi display apparatus including the same.

Discussion of the Related Art

Recently, with the advancement of multimedia, the importance of display apparatuses is increasing. Therefore, display apparatuses such as liquid crystal display (LCD) apparatuses, organic light emitting display apparatuses, and light emitting diode display apparatuses are being commercialized.

Display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

Display apparatuses may include a display panel which includes a plurality of pixels including a thin film transistor (TFT) connected to a data line and a gate line, a data driving circuit for supplying a data voltage to the data line, and a gate driving circuit for supplying a scan signal to the gate line. The display panel may include a display area which includes the plurality of pixels for displaying an image and a bezel area which surrounds the display area.

A display apparatus of the related art may need a bezel (or a mechanism) for covering a bezel area disposed at a border (or an edge portion) of a display panel, and due to this, a width of the bezel may increase.

Recently, multi-display apparatuses have been commercialized where a large screen is implemented by arranging a plurality of display apparatuses as a lattice type.

However, in a multi-display apparatus of the related art, a boundary portion such as a seam is formed between adjacent display apparatuses due to a bezel area or a bezel of each of a plurality of display apparatuses. The boundary portion causes a sense of discontinuity (or discontinuity) of an image when one image is being displayed on a total screen of the multi-display apparatus, and due to this, the immersion of a viewer watching the image is reduced.

PRIOR ART REFERENCE

Patent Document

Korean Patent Registration No. 10-1441956 (Title of the Invention: multi-panel display apparatus, Int. Cl.: G02F 1/1335, G02F 1/13357)

SUMMARY

Accordingly, embodiments of the present disclosure are directed to providing a display apparatus and a multi display apparatus including the same that substantially obviate one or more problems due to limitations and disadvantages of the related art.

An aspect of the present disclosure is to provide a display apparatus in which a bezel is not provided.

Another aspect of the present disclosure is to provide a multi-display apparatus for displaying an image without a sense of discontinuity.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the disclosure, as embodied and broadly described herein, a display apparatus comprises a first substrate including a plurality of pixel areas provided in a display portion, a second substrate coupled to the first substrate, and a routing portion disposed on an outer surface of the first substrate and an outer surface of the second substrate, wherein the first substrate includes a passivation layer disposed on the display portion, a barrier pattern portion implemented in the passivation layer on an edge portion of the display portion, the barrier pattern portion including a barrier metal pattern, and a light emitting device layer including a light emitting device disposed on the barrier pattern portion and the plurality of pixel areas, and the light emitting device is isolated by the barrier pattern portion.

A display apparatus according to some embodiments of the present disclosure includes a first substrate including a plurality of pixel areas provided in a display portion, a dam pattern disposed in an outermost pixel area of the plurality of pixel areas, a barrier pattern portion disposed in the outermost pixel area to surround the dam pattern, a light emitting device layer including a common electrode and a light emitting device disposed on the plurality of pixel areas, and a second substrate coupled to the first substrate, wherein the barrier pattern portion includes an isolation structure for isolating the light emitting device and the common electrode.

In another aspect, a multi display apparatus comprises a plurality of display modules arranged in at least one direction of a first direction and a second direction intersecting with the first direction, wherein each of the plurality of display modules includes a first substrate including a plurality of pixel areas provided in a display portion, a second substrate coupled to the first substrate, and a routing portion disposed on an outer surface of the first substrate and an outer surface of the second substrate, wherein the first substrate includes a passivation layer disposed on the display portion, a barrier pattern portion implemented in the passivation layer on an edge portion of the display portion, the barrier pattern portion including a barrier metal pattern, and a light emitting device layer including a light emitting device disposed on the barrier pattern portion and the plurality of pixel areas, and the light emitting device is isolated by the barrier pattern portion.

In another aspect, a multi display apparatus comprises a plurality of display modules arranged in at least one direction of a first direction and a second direction intersecting with the first direction, wherein each of the plurality of display modules includes a first substrate including a plurality of pixel areas provided in a display portion, a dam pattern disposed in an outermost pixel area of the plurality of pixel areas, a barrier pattern portion disposed in the outermost pixel area to surround the dam pattern, a light emitting device layer including a common electrode and a light emitting device disposed on the plurality of pixel areas, and a second substrate coupled to the first substrate, wherein the barrier pattern portion includes an isolation structure for isolating the light emitting device and the common electrode.

According to some embodiments of the present disclosure, a display apparatus including no bezel and a multi-display apparatus including the display apparatus may be provided.

According to some embodiments of the present disclosure, the display apparatus may include a barrier pattern portion which is disposed at an edge portion of a display portion to insulate a light emitting device, thereby providing a display apparatus and a multi display apparatus including the display apparatus for preventing the light emitting device from being degraded by the penetration of water in a lateral direction and for enhancing the reliability of the light emitting device.

According to some embodiments of the present disclosure, a multi-display apparatus for displaying an image without a sense of discontinuity may be provided.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Figure 1:
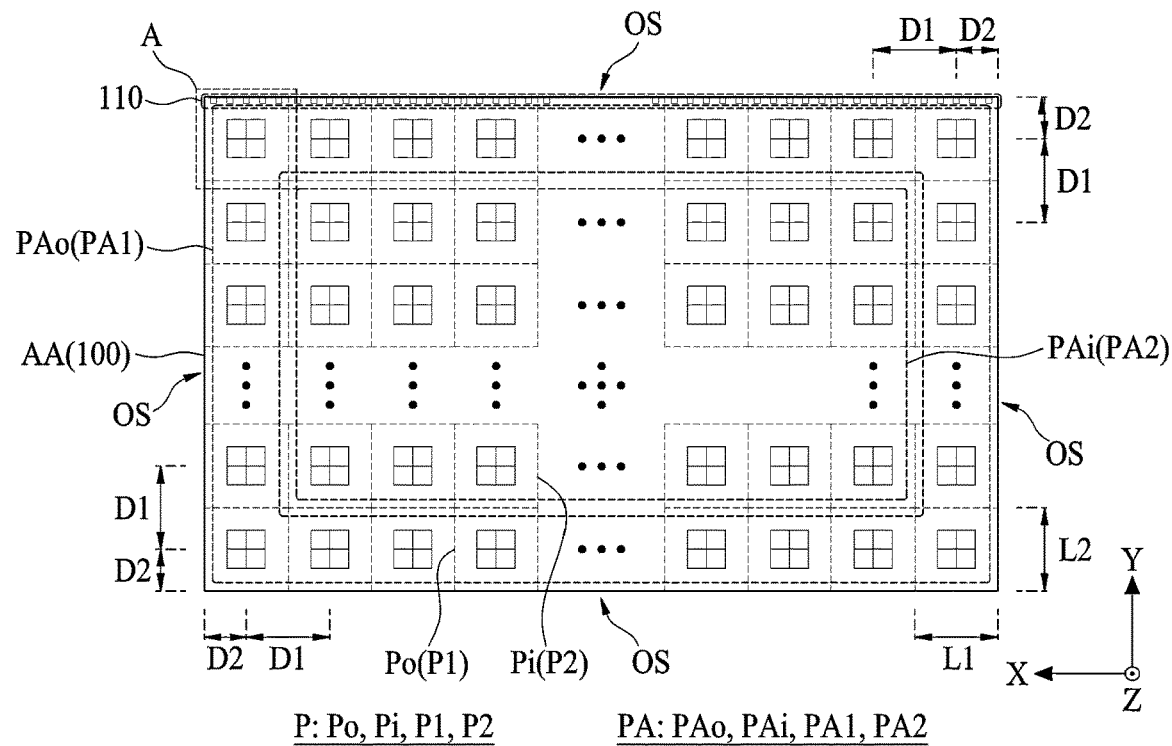
FIG. 1 is a diagram illustrating a display apparatus according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
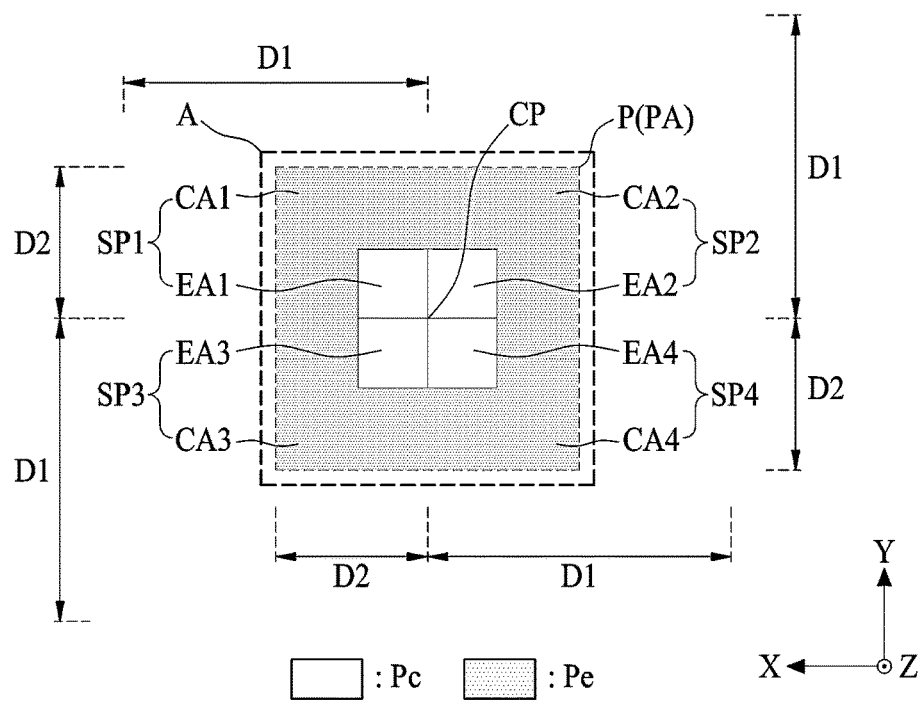
FIG. 2 is an enlarged view of a region 'A' illustrated in FIG. 1.

FIG. 1 is a diagram illustrating a display apparatus according to the present disclosure, and FIG. 2 is an enlarged view of a region 'A' illustrated in FIG. 1.

Referring to FIGS. 1 and 2, the display apparatus according to the present disclosure may include a first substrate 100 including a display area AA, and a plurality of pixels P arranged at a first interval D1 on the display area AA of the first substrate 100.

The first substrate 100 may include a first surface, a second surface, and an outer surface OS. The first surface of the first substrate 100 may be defined as a front surface, a top surface, or an upper surface facing a front surface (or a forward direction) of the display apparatus. The second surface of the first substrate 100 may be defined as a back surface, a rear surface, a bottom surface, or a lower surface facing a back surface (or a rearward direction) of the display apparatus. The outer surface OS of the first substrate 100 may be defined as a side surface, a lateral surface, or a sidewall, which extends to an outer periphery between the first surface and the second surface, faces the lateral surface (or the lateral direction) of the display apparatus, and is exposed to air. For example, when the first substrate 100 has a hexahedral structure, the outer surface OS of the first substrate 100 may include side surfaces of the hexahedral structure.

The outer surface OS of the first substrate 100 may be formed in parallel with a thickness direction Z of the display apparatus. For example, the outer surface OS of the first substrate 100 may include a first outer surface which is parallel to a first direction X, a second outer surface which is parallel to the first outer surface, a third outer surface which is parallel to a second direction Y transverse (or crossing) to the first direction X and is connected between one end of the first outer surface and one end of the second outer surface, and a fourth outer surface which is parallel to the third outer surface and is connected between the other end of the first outer surface and the other end of the second outer surface. The first direction X may be a first lengthwise direction (for example, a widthwise direction), and the second direction Y may be a second lengthwise direction (for example, a lengthwise direction) of the first substrate 100 or the display apparatus.

The display area AA of the first substrate 100 may be an area which displays an image and may be referred to as a display portion or an active portion. A size of the display area AA may be the same as or substantially the same as the first substrate 100 (or the display apparatus). For example, a size of the display area AA may be the same as a total size of the first surface of the first substrate 100. Therefore, the display area AA may be implemented (or disposed) on the whole front surface of the first substrate 100, and thus, the first substrate 100 may not include an opaque non-display area which is provided along an edge portion of the first surface to surround all of the display area AA. Accordingly, a whole front surface of the display apparatus may implement the display area AA.

An end (or an outermost portion) of the display area AA may be the outer surface OS of the first substrate 100. For example, a lateral surface of the display portion AA may be substantially coplanar with the outer surface OS of the first substrate 100. In other words, the lateral surface of the display portion AA and the outer surface OS of the first substrate 100 may be aligned at substantially the same position. The lateral surface of the display portion AA may not be surrounded by a separate mechanism and may be surrounded by only air. As another example, the lateral surface of the display portion AA may overlap or may be substantially aligned with the outer surface OS of the first substrate 100. That is, all lateral surfaces of the display portion AA may be provided in a structure which directly contacts air without being surrounded by a separate mechanism.

With respect to a thickness direction Z of the first substrate 100, a vertical extension line vertically extending from the outer surface OS of the first substrate 100 and an end of the display area AA may overlap or may be aligned with each other. For example, a first end (or an upper end) of the display area AA may be a first outer surface (or an upper sidewall) of the first substrate 100, a second end (or a lower end) of the display area AA may be a second outer surface (or a lower sidewall) of the first substrate 100, a third end (or a left end) of the display area AA may be a third outer surface (or a left sidewall) of the first substrate 100, and a fourth end (or a right end) of the display area AA may be a fourth outer surface (or a right sidewall) of the first substrate 100. Therefore, the outer surface OS of the first substrate 100 corresponding to the end of the display area AA may be surrounded by air, and thus, the display apparatus according to the present disclosure may have an air-bezel structure or a non-bezel structure where the display area AA may be surrounded by air instead of an opaque non-display area.

The display area (or the display portion) AA according to an embodiment may include a plurality of pixel areas PA.

The plurality of pixel areas PA may be arranged (or disposed) in the first interval D1 in the display area AA.

The plurality of pixel areas PA according to an embodiment may be arranged (or disposed) at the first interval D1 in the display area AA of the first substrate 100. Two pixel areas PA adjacent to each other in the first direction X and the second direction Y of the first substrate 100 may have the same first interval D1 without an error range of a manufacturing process. The first interval D1 may be a pitch (or a pixel pitch) between two adjacent pixel areas PA. For example, the first interval D1 may be a shortest distance (or a shortest length) between center portions of two adjacent pixel areas PA. Optionally, the pixel pitch may be a size between one end and the other end of a pixel area PA parallel to the first direction X. Also, as another example, the pixel pitch may be referred to as a size between one end and the other end of a pixel area PA parallel to the second direction Y.

Each of the plurality of pixel areas PA may have a first length L1 parallel to the first direction X and a second length L2 parallel to the second direction Y. Each of the first length L1 and the second length L2 may be the same as the first interval D1. For example, the first length L1 may be referred to as a first width, a widthwise length, or a widthwise width. The second length L2 may be referred to as a second width, a lengthwise length, or a lengthwise width. The first length L1 or the second length L2 of the pixel area PA may be referred to as a pixel pitch.

A second interval D2 between each of outermost pixel areas PAo of the plurality of pixel areas PA and the outer surface OS of the first substrate 100 may be half or less of the first interval D1 so that the whole front surface of the first substrate 100 (or the whole front surface of the display apparatus) is referred to as a display area AA. For example, the second interval D2 may be a shortest distance (or a shortest length) between a center portion of the outermost pixel area PAo and the outer surface OS of the first substrate 100.

When the second interval D2 is greater than half of the first interval D1, the first substrate 100 may have a greater size than that of the display area AA by an area between an end of the outermost pixel area PAo (or the display area AA) and the outer surface OS of the first substrate 100, and thus, an area between the end of the outermost pixel area PAo and the outer surface OS of the first substrate 100 may be provided as a non-display area surrounding all of the display area AA. Therefore, the first substrate 100 may necessarily include a bezel area based on a non-display area surrounding all of the display area AA. On the other hand, when the second interval D2 is half or less of the first interval D1, the end of the outermost pixel area PAo (or the display area AA) may overlap the outer surface OS of the first substrate 100 or may be disposed in a space outside the outer surface OS of the first substrate 100, and thus, the display area AA may be implemented (or disposed) on the whole front surface of the first substrate 100.

The display area (or the display portion) AA according to an embodiment may include the outermost pixel area PAo and an internal pixel area (or an inner pixel area) PAi.

The outermost pixel area PAo may be disposed along an edge portion (or a periphery portion) of the first substrate 100 among the plurality of pixel areas PA. For example, the outermost pixel area PAo may be referred to as a first pixel area PA1.

The internal pixel area PAi may be a pixel area other than the outermost pixel area PAo among the plurality of pixel areas PA, or may be surrounded by the outermost pixel area PAo. The internal pixel area PAi may be referred to as a second pixel area PA2.

Each of a plurality of pixels P may be disposed in a corresponding pixel area PA of the plurality of pixel areas PA defined on the first surface of the first substrate 100. For example, the display area AA may be a pixel array which includes the plurality of pixels P arranged on the first substrate 100. The pixels P of the pixel array may be immediately adjacent to one another in the first direction X and the second direction Y. For example, the pixels P of the pixel array may be immediately adjacent to one another in the first direction X and the second direction Y without a separation space (or a spaced apart space). As another example, a plurality of outermost pixels Po of the pixel array may match to overlap one another on the outer surface of the first substrate 100, or may be aligned on the same plane. For example, each pixel P of the pixel array may be arranged on the first substrate 100 to have a pixel pitch D1 in the first direction X and the second direction Y, and an interval D2 between a center portion of each of the outermost pixels Po and the outer surface OS of the first substrate 100 may be half or less of the pixel pitch D1.

The display area (or the display portion) AA according to an embodiment may include an outermost pixel Po and an internal pixel (or an inner pixel) Pi.

The outermost pixel Po may be disposed at the edge portion (or a periphery portion) of the first substrate 100 among the plurality of pixel areas PA. For example, the outermost pixel Po may be referred to as a first pixel P1 disposed in the outermost pixel area PAo.

The internal pixel Pi may be a pixel other than the outermost pixel Po among the plurality of pixels P, or may be disposed to be surrounded by the outermost pixel Po. For example, the internal pixel Pi may be referred to as a second pixel P2. The internal pixel Pi (or the second pixel P2) may be implemented to have a configuration or a structure, which differs from the outermost pixel Po (or the first pixel P1).

The second interval D2 between each of the outermost pixels Po of the plurality of pixels P and the outer surface OS of the first substrate 100 may be half or less of the first interval D1 so that the whole front surface of the first substrate 100 (or the whole front surface of the display apparatus) is referred to as the display area AA. The first interval D1 may be a shortest distance (or a shortest length) between center portions of two adjacent pixels P. The second interval D2 may be a shortest distance (or a shortest length) between a center portion of the outermost pixel Po and the outer surface OS of the first substrate 100.

Each of the plurality of pixels P according to an embodiment may include a center portion Pc including a plurality of emission areas PA and an edge portion (or a periphery portion) Pe surrounding all of the center portion Pc.

A center of the center portion Pc may overlap a central portion CP of the pixel P. The center portion Pc may be referred to as an opening portion or a light emitting portion of the pixel P.

The center portion Pc according to an embodiment may include first to fourth emission areas EA1 to EA4 which are disposed with respect to the central portion CP of the pixel P. For example, the first to fourth emission areas EA1 to EA4 may be immediately adjacent to one another in the first direction X and the second direction Y. For example, the first to fourth emission areas EA1 to EA4 may be directly contact to one another in the first direction X and the second direction Y without a separation space (or a spaced apart space).

The first to fourth emission areas EA1 to EA4 may each have a square shape and may be disposed in a 2×2 form or a quad form. According to another embodiment, the first to fourth emission areas EA1 to EA4 may each have a rectangular shape which includes a short side parallel to the first direction X and a long side parallel to the second direction Y, and for example, may be disposed a 1×4 form or a 1×4 stripe form.

The first emission area EA1 may be implemented to emit light of a first color, the second emission area EA2 may be implemented to emit light of a second color, the third emission area EA3 may be implemented to emit light of a third color, and the fourth emission area EA4 may be implemented to emit light of a fourth color. For example, each of the first to fourth colors may be different. For example, the first color may be red, the second color may be blue, the third color may be white, and the fourth color may be green. As another example, some of the first to fourth colors may be the same. For example, the first color may be red, the second color may be first green, the third color may be second green, and the fourth color may be blue.

According to another embodiment, the center portion Pc may include first to third emission areas EA1 to EA3 which are disposed with respect to the central portion CP of the pixel P. In this case, the first to third emission areas EA1 to EA3 may each have a rectangular shape which includes a short side parallel to the first direction X and a long side parallel to the second direction Y, and for example, may be disposed a 1×3 form or a 1×3 stripe form. For example, the first color may be red, the second color may be blue, and the third color may be green.

The edge portion Pe may be disposed in the pixel area PA to surround all of the center portion Pc, and thus, may define the center portion Pc of the pixel area PA or the pixel P. The edge portion Pe may have a size which is wider than the center portion Pc. The edge portion Pe may be referred to as a non-opening portion or a pixel separation portion of the pixel P.

Each of a plurality of pixels P according to another embodiment may include first to fourth subpixels SP1 to SP4.

The first to fourth subpixels SP1 to SP4 may have the same size or different sizes in a corresponding pixel P or pixel area PA. The first to fourth subpixels SP1 to SP4 according to an embodiment may have a uniform quad structure, a non-uniform quad structure, a uniform stripe structure, or a non-uniform stripe structure. A size of each of the first to fourth subpixels SP1 to SP4 may be set based on a resolution, emission efficiency, or image quality. For example, when one pixel P includes red, green, blue, and white subpixels arranged in a non-uniform quad structure or a non-uniform stripe structure, the green subpixel may have a smallest size, and the white subpixel may have a largest size.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA. For example, with respect to the central portion CP of the pixel P, the first subpixel SP1 may be a left upper area of the pixel area PA, the second subpixel SP2 may be a right upper area of the pixel area PA, the third subpixel SP3 may be a left lower area of the pixel area PA, and the fourth subpixel SP4 may be a right lower area of the pixel area PA.

The first to fourth subpixels SP1 to SP4 may respectively include a plurality of emission areas EA1 to EA4 and a plurality of circuit areas CA1 to CA4.

The emission areas EA1 to EA4 may be disposed at the center portion Pc of the pixel P, or may be disposed close to the central portion CP of the pixel P.

Each of the circuit areas CA1 to CA4 may be disposed near a corresponding emission area of the emission areas EA1 to EA4. Each of the circuit areas CA1 to CA4 may include a signal line, a power line, and a circuit for allowing a corresponding subpixel to emit light.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 may extend to the circuit areas CA1 to CA4 to overlap some or all of the circuit areas CA1 to CA4. In this case, the emission areas EA1 to EA4 may have a size which is equal to or greater than that of the circuit areas CA1 to CA4.

The display apparatus according to the present disclosure may further include a pad part 110 including a plurality of pads which are disposed in the display area AA and are selectively connected to the plurality of pixels P. For example, the pad part 110 may be a first pad part or a front pad part.

The pad part 110 may be included in the outmost pixels Po disposed at a first edge portion of the first surface of the first substrate 100 parallel to the first direction X. That is, the outermost pixels Po disposed at the first edge portion of the first substrate 100 may include at least one of the plurality of pads. Therefore, the plurality of pads may be disposed or included within the display area AA, and thus, a non-display area (or a bezel area) based on the pad part 110 may not be formed or may not be on the first substrate 100.

For example, when the pad part 110 is not provided within the outermost pixels Po and is disposed between the outermost pixels Po and the outer surface OS of the first substrate 100, the first substrate 100 may include a non-display area corresponding to an area where the pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate structure) for covering the non-display area may be needed. On the other hand, the pad part 110 according to the present disclosure may be disposed between the emission areas EA1 to EA4 of the outermost pixels Po and the outer surface OS of the first substrate 100 and may be included within the outermost pixels Po, and thus, a non-display area (or a bezel area) based on the pad part 110 may not be formed or may not be between the outermost pixels Po and the outer surface OS of the first substrate 100.

Therefore, the display apparatus according to the present disclosure may have an air-bezel structure where a whole first substrate 100 including the pad part 110 is implemented as the display area AA, and thus, all outer surfaces (or outer surfaces of the display panel) OS of the first substrate 100 aligned with an end of the display area AA are surrounded by air.

Figure 3:
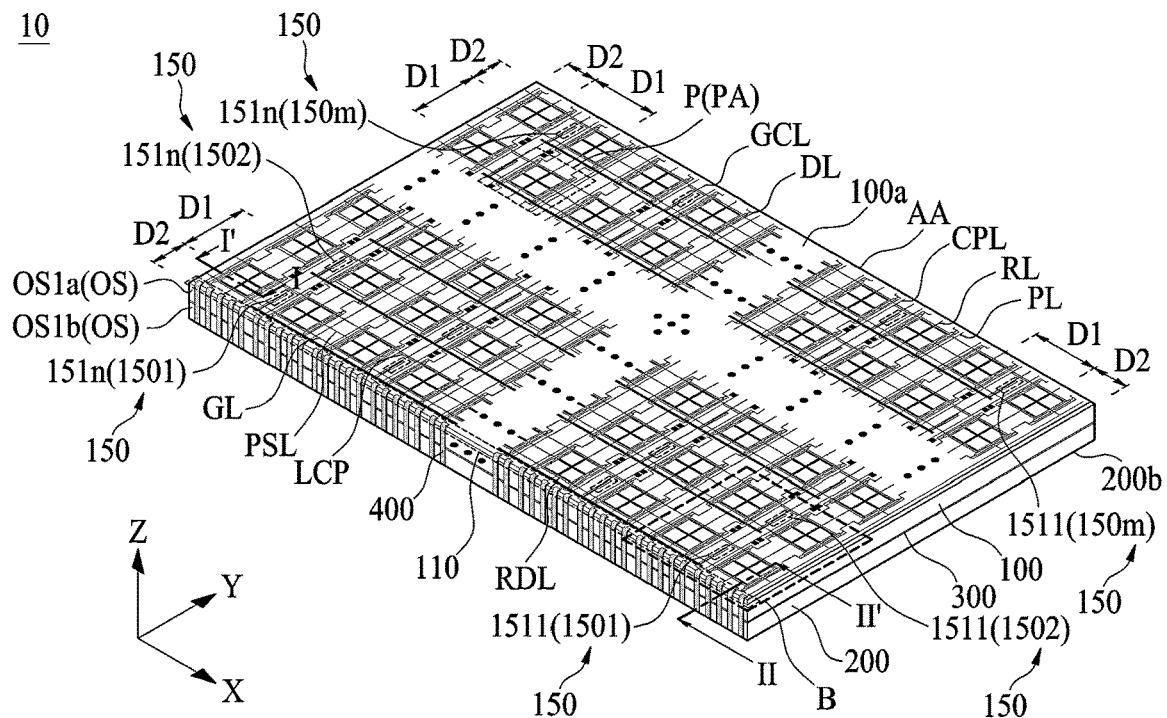
FIG. 3 is a perspective view illustrating a display apparatus according to an embodiment of the present disclosure.
Figure 4:
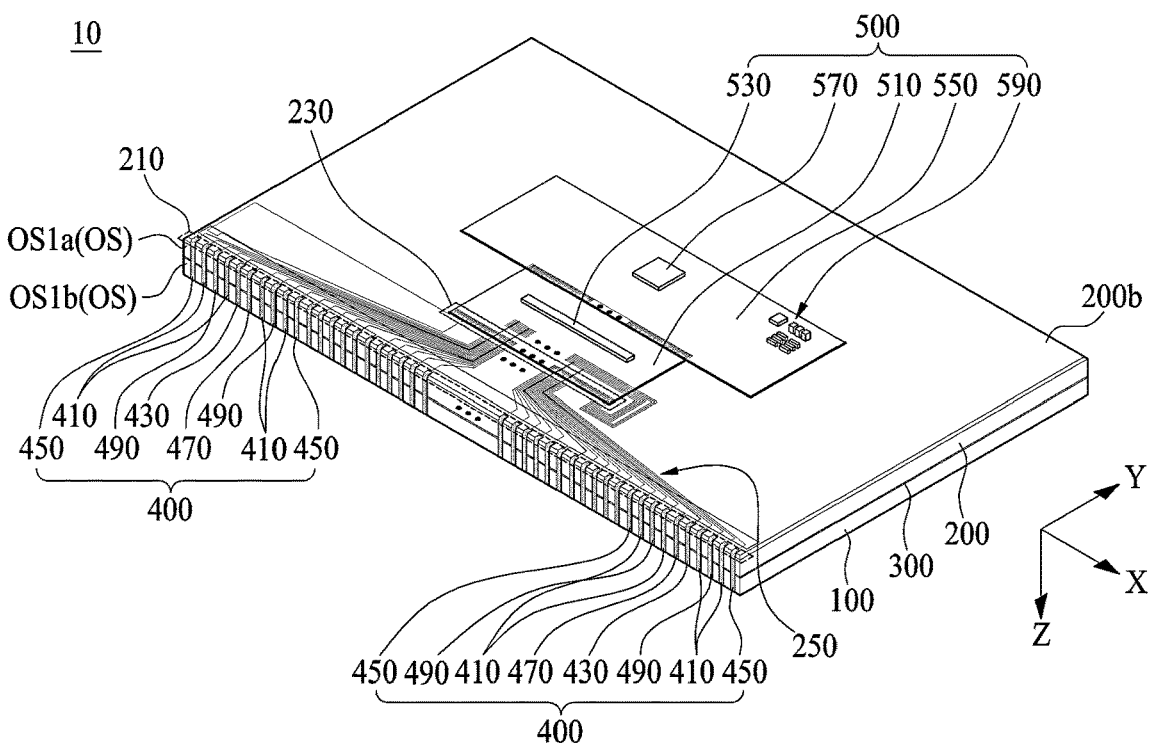
FIG. 4 is a diagram illustrating a rear surface of a display apparatus according to an embodiment of the present disclosure.

FIG. 3 is a perspective view illustrating a display apparatus according to an embodiment of the present disclosure, and FIG. 4 is a diagram illustrating a rear surface of the display apparatus according to an embodiment of the present disclosure.

Referring to FIGS. 3 and 4, the display apparatus 10 according to an embodiment of the present disclosure may include a first substrate 100, a second substrate 200, a coupling member 300, and a routing portion 400.

The first substrate 100 may be referred to as a display substrate, a pixel array substrate, an upper substrate, a front substrate, or a base substrate. The first substrate 100 may include a glass material or a plastic material. The first substrate 100 may be a glass substrate, or may be a thin glass substrate or a plastic substrate, which is bendable or flexible. The first substrate 100 according to an embodiment may be a glass substrate or tempered glass. For example, the tempered glass may include one of sapphire glass and gorilla glass or a stacked glass thereof.

The display apparatus 10 according to an embodiment may include a plurality of pixel driving lines and a plurality of pixels P, which are disposed on the first substrate 100.

The pixel driving lines may be provided on a first surface 100*a* of the first substrate 100 and may transfer a signal needed for driving (emitting light) of each of the plurality of pixels P. For example, the pixel driving line may include a data line DL, a gate line GL, a pixel driving power line (or a first power line) PL, and a pixel common power line (or a second power line) CPL. Additionally, the pixel driving line may further include a reference power line (or a sensing line) RL, based on driving (or operating) of a pixel circuit disposed in a circuit area of the pixel P.

Each of the pixel driving lines according to an embodiment may be electrically connected to a first pad part 110 disposed at a first edge portion of the first surface 100*a* of the first substrate 100. The first pad part 110 may be included in a plurality of outermost pixels Po disposed at the first edge portion of the first substrate 100 parallel to a first direction X. Here, the first edge portion of the first surface 100*a* of the first substrate 100 may include a first outer surface (or one side surface) OS1*a* of an outer surface OS of the first substrate 100.

The first pad part 110 may include a plurality of first pads which are disposed in parallel with one another in the first direction X on a passivation layer 101*d* (see FIG. 12) exposed at the first edge portion of the first surface 100*a* of the first substrate 100.

The plurality of first pads according to an embodiment may be divided (or classified) into a plurality of first data pads, a plurality of first pixel driving power pads, and a plurality of first pixel common power pads. Therefore, the first pad part 110 may include a first data pad part including the plurality of first data pads connected to a plurality of data lines DL, a first pixel driving power pad part including the plurality of first pixel driving power pads connected to the plurality of pixel driving power lines PL, and a first pixel common power pad part including the plurality of first pixel common power pads connected to the plurality of pixel common power lines CPL. Optionally, the first pad part 110 may further include a first reference power pad part including a plurality of first reference power pads connected to a plurality of reference power lines RL.

The plurality of pixels P may be respectively disposed in a plurality of pixel areas PA which are arranged at a first interval (or a first pitch) D1 in the first direction X and a second direction Y. Each of the plurality of pixels P may include a self-light emitting device (or a self-light emitting element), which emits light on the basis of a top emission type based on a signal supplied through corresponding pixel driving line adjacent thereto and irradiates the light onto a portion above the first surface 100*a* of the first substrate 100, and a pixel circuit which is connected to pixel driving lines adjacent thereto to allow the self-light emitting device to emit light. For example, the pixel circuit may include a driving thin film transistor (TFT) which provides the self-light emitting device with a data current corresponding to a data signal supplied through the data line DL.

A distance between an outermost pixel of the plurality of pixels P and the outer surface OS of the first substrate 100 may be half or less of the first interval D1. A second interval D2 between a center portion of the outermost pixel and the outer surface OS of the first substrate 100 may be half or less of the first interval D1, and thus, a whole front surface of the first substrate 100 (or a whole front surface of the display apparatus) may be implemented as the display area AA. Accordingly, the display apparatus 10 according to the present disclosure may have an air-bezel structure where the display area AA is surrounded by air.

The first substrate 100 may further include a first chamfer which is provided at a corner portion between the first surface 100*a* and the outer surface OS. The first chamfer may minimize the damage of the corner portion of the first substrate 100 caused by a physical impact applied from the outside and may prevent a disconnection of the routing portion 400 caused by the corner portion of the first substrate 100. For example, the first chamfer may have a 45-degree angle, but is not limited thereto. The first chamfer may be implemented by a chamfer process using a cutting wheel or a polishing wheel. Accordingly, each of outer surfaces of the first pads of the first pad part 110 disposed to contact the first chamfer may include an inclined surface which is inclined by an angle corresponding to an angle of the first chamfer by removing or polishing a corresponding portion thereof along with the corner portion of the first substrate 100 through the chamfer process. For example, when the first chamfer is formed at an angle of 45 degrees between the outer surface OS and the first surface 100*a* of the first substrate 100, outer surfaces of the first pads may be formed at an angle of 45 degrees.

The first substrate 100 may further include a gate driving circuit 150 which is disposed in the display area AA.

The gate driving circuit 150 may be disposed in the display area AA to supply a scan signal (or a gate signal) to the pixels P disposed on the first substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line GL.

The gate driving circuit 150 according to an embodiment may be implemented with a shift register including a plurality of stage circuit units 150*l* to 150*m* (where m is an integer of 2 or more). That is, the display apparatus according to the present disclosure may include a shift register which is disposed in the display area AA of the first substrate to supply the scan signal to the pixel P.

Each of the plurality of stage circuit units 150*l* to 150*m* may include a plurality of branch circuits 151*l* to 151*n* (where n is an integer of 2 or more) which are disposed apart from one another in each horizontal line of the first substrate 100 in the first direction X. The plurality of branch circuits 151*l* to 151*n* may include at least one TFT (or a branch TFT) and may be disposed between two adjacent pixels P (or pixel areas PA) within one horizontal line along the first direction X. For example, the branch circuits 151*l* to 151*n* may be disposed one by one between two adjacent pixels P (or pixel areas PA) within one horizontal line along the first direction X. Each of the plurality of stage circuit units 150*l* to 150*m* may generate the scan signal in a predetermined order in response to a gate control signal supplied through the first pad part 110 and may supply the scan signal to the gate line GL. For example, the gate control signal may include a start signal, a plurality of shift clocks, at least one gate driving power, and at least one gate common power.

The first substrate 100 may further include a plurality of gate control line groups GCL which are disposed apart from one another between the plurality of pixels P and are connected to the gate driving circuit 150. Each of the gate control line groups GCL may be selectively connected to the plurality of branch circuits 151*l* to 151*n* respectively disposed in the plurality of stage circuit units 150*l* to 150*m*. For example, the plurality of gate control line groups GCL may be distributedly disposed between the plurality of pixels P.

The gate control line group GCL according to an embodiment may include a start signal line, a plurality of shift clock lines, at least one gate driving power line, and at least one gate common power line. The plurality of shift clock lines according to an embodiment may be divided (or classified) into a plurality of scan clock lines and a plurality of carry clock lines. Here, the plurality of carry clock lines may be omitted.

The first pad part 110 may further include a first gate pad part including a plurality of first gate pads connected to the gate control line group GCL.

A plurality of first gate pads according to an embodiment may be divided (classified) into a first start signal pad connected to the start signal line, a plurality of first shift clock pads respectively connected to the plurality of shift clock lines, at least one first gate driving power pad connected to at least one gate driving power line, and at least one first gate common power pad connected to at least one gate common power line. Therefore, the first gate pad part may include a first start signal pad, a plurality of first shift clock pads, at least one first gate driving power pad, and at least one first gate common power pad. The plurality of first shift clock pads according to an embodiment may include a plurality of first scan clock pads respectively connected to the plurality of scan clock lines and a plurality of first carry clock pads respectively connected to the plurality of carry clock lines. Here, the plurality of first carry clock pads may be omitted.

The second substrate 200 may be referred to as a wiring substrate, a link substrate, a lower substrate, a rear substrate, or link glass. The second substrate 200 may include a glass material or a plastic material. The second substrate 200 may be a glass substrate, or may be a thin glass substrate or a plastic substrate, which is bendable or flexible. The second substrate 200 according to an embodiment may include the same material as that of the first substrate 100.

The second substrate 200 may be coupled (or connected) to a second surface of the first substrate 100 by using the coupling member 300. The second substrate 200 may include a front surface which faces the second surface of the first substrate 100 or is coupled to the coupling member 300, a rear surface (or a back surface) opposite to the front surface, and an outer surface OS between the front surface and the rear surface. The second substrate 200 may transfer a signal to the pixel driving lines and may increase the stiffness of the first substrate 100.

The second substrate 200 according to an embodiment may further include a second pad part 210.

The second pad part 210 may be disposed at a first edge portion of a rear surface 200*b* of the second substrate 200 overlapping the first pad part 110 disposed on the first substrate 100. The first edge portion of the rear surface 200*b* of the second substrate 200 may include a first outer surface (or one surface) OS1*b* of the outer surface OS of the second substrate 200.

The second pad part 210 may include a plurality of second pads which are arranged at a certain interval in the first direction X to respectively overlap the pads of the first pad part 110.

The plurality of second pads according to an embodiment may be divided (or classified) into a plurality of second data pads, a plurality of second pixel driving power pads, and a plurality of second pixel common power pads. Therefore, the second pad part 210 may include a second data pad part including the plurality of second data pads, a second gate pad part including the plurality of second gate pads, a second pixel driving power pad part including the plurality of second pixel driving power pads, and a second pixel common power pad part including the plurality of second pixel common power pads. Optionally, the second pad part 210 may further include a second reference power pad part including a plurality of second reference power pads.

A plurality of second gate pads according to an embodiment may be divided (classified) into a second start signal pad, a plurality of second shift clock pads, at least one second gate driving power pad, and at least one second gate common power pad. Therefore, the second gate pad part may include a second start signal pad, a plurality of second shift clock pads, at least one second gate driving power pad, and at least one second gate common power pad. The plurality of second shift clock pads according to an embodiment may be divided (classified) into a plurality of second scan clock pads and a plurality of second carry clock pads. Here, the plurality of second carry clock pads may be omitted.

The display apparatus 10 according to an embodiment may further include a third pad part (or an input pad part) 230 and a link line portion 250 which are disposed on the second substrate 200.

A third pad part 230 may be disposed on the rear surface 200*b* of the second substrate 200. For example, the third pad part 230 may be disposed at a center portion adjacent to the first edge portion of the rear surface 200*b* of the second substrate 200. The third pad part 230 according to an embodiment may include a plurality of third pads (or input pads) which are apart from one another by a certain interval.

The link line portion 250 may be disposed between the second pad part 210 and the third pad part 230 on the rear surface 200*b* of the second substrate 200. For example, the link line portion 250 may include a plurality of link lines which individually (or respectively) connect the second pads of the second pad part 210 to the third pads of the third pad part 230.

The second substrate 200 may further include a second chamfer which is provided at a corner portion between the rear surface 200*b* and the outer surface OS. The second chamfer may minimize the damage of the corner portion of the second substrate 200 caused by a physical impact applied from the outside and may prevent a disconnection of the routing portion 400 caused by the corner portion of the second substrate 200. For example, the second chamfer may have a 45-degree angle, but is not limited thereto.

The coupling member 300 may be disposed between the first substrate 100 and the second substrate 200. The first substrate 100 and the second substrate 200 may be opposite-bonded to each other by the coupling member 300. For example, the second surface of the first substrate 100 may be coupled to one surface of the coupling member 300, and the front surface of the second substrate 200 may be coupled to the other surface of coupling member 300. Accordingly, the first substrate 100 and the second substrate 200 opposite-bonded (or coupled) to each other by the coupling member 300 may be referred to as a display panel.

The routing portion 400 may be disposed to surround the outer surface OS of the first substrate 100 and the outer surface OS of the second substrate 200. The routing portion 400 according to an embodiment may include a plurality of routing lines which are disposed on each of the first outer surface (or one surface) 051a of the outer surface OS of the first substrate 100 and the first outer surface (or one surface) OS1b of the outer surface OS of the second substrate 200. Each of the plurality of routing lines may be formed to surround each of the first outer surface OS1a of the first substrate 100 and the first outer surface OS1b of the second substrate 200. For example, the plurality of routing lines may be respectively (or individually) connected to the pixel driving lines disposed on the first substrate 100 and may be directly connected to the pixel driving lines. As another example, the plurality of routing lines may be respectively (or individually) connected to the pixel driving lines through the pad of the first pad part 110 disposed on the first substrate 100, and in this case, a resistance of each of the pixel driving lines and/or the voltage drop (or IR drop) of a signal applied to the pixel driving lines may be reduced due to an increase in size based on a pad.

The plurality of routing lines according to an embodiment may be divided (classified) into a plurality of data routing lines, a plurality of gate routing lines, a plurality of pixel driving power routing lines, and a plurality of pixel common power routing lines.

According to another embodiment, the routing portion 400 may include a data routing portion, a gate routing portion, a pixel driving power routing portion, and a pixel common power routing portion.

The data routing portion (or a first routing portion) may electrically connect the first data pad part of the first pad part 110 to the second data pad part of the second pad part 210. The data routing portion according to an embodiment may include a plurality of data routing lines 410. The plurality of data routing lines (or a first routing line) 410 may individually (or respectively) connect the plurality of first data pads, disposed in the first pad part 110, to the plurality of second data pads disposed in the second pad part 210.

The gate routing portion (or a second routing portion) may electrically connect the first gate pad part of the first pad part 110 to the second gate pad part of the second pad part 210. The gate routing portion according to an embodiment may include a plurality of gate routing lines 430. The plurality of gate routing lines (or a second routing line) 430 may individually (or respectively) connect the plurality of first gate pads, disposed in the first pad part 110, to the plurality of second gate pads disposed in the second pad part 210.

The plurality of gate routing lines 430 according to an embodiment may be divided (classified) into a start signal routing line, a plurality of shift clock routing lines, at least one gate driving power routing line, and at least one gate common power routing line. Therefore, the gate routing portion may include a start signal routing line, a plurality of shift clock routing lines, at least one gate driving power routing line, and at least one gate common power routing line. The plurality of shift clock routing lines according to an embodiment may be divided (classified) into a plurality of scan clock routing lines and a plurality of carry clock routing lines. Here, the plurality of carry clock routing lines may be omitted.

The start signal routing line may electrically connect a first start signal pad, disposed in the first pad part 110, to a second start signal pad disposed in the second pad part 210.

The plurality of shift clock routing lines may individually (or respectively) connect the plurality of first shift clock pads, disposed in the first pad part 110, to the plurality of second shift clock pads disposed in the second pad part 210.

The plurality of scan clock routing lines among the plurality of shift clock routing lines according to an embodiment may individually (or respectively) connect the plurality of first scan clock pads, disposed in the first pad part 110, to the plurality of second scan clock pads disposed in the second pad part 210.

The plurality of carry clock routing lines among the plurality of shift clock routing lines according to an embodiment may individually (or respectively) connect the plurality of first carry clock pads, disposed in the first pad part 110, to the plurality of second carry clock pads disposed in the second pad part 210.

The at least one gate driving power routing line may electrically connect the at least one first gate driving power pad, disposed in the first pad part 110, to the at least one second gate driving power pad disposed in the second pad part 210.

The at least one gate common power routing line may electrically connect the at least one first gate common power pad, disposed in the first pad part 110, to the at least one second gate common power pad disposed in the second pad part 210.

The pixel driving power routing portion (or a third routing portion) may electrically connect the first pixel driving power pad part of the first pad part 110 to the second pixel driving power pad part of the second pad part 210. The pixel driving power routing portion according to an embodiment may include a plurality of pixel driving power routing lines 450. The plurality of pixel driving power routing lines (or a third routing line) 450 may individually (or respectively) connect the plurality of first pixel driving power pads, disposed in the first pad part 110, to the plurality of second pixel driving power pads disposed in the second pad part 210.

The pixel common power routing portion (or a fourth routing portion) may electrically connect the first pixel common power pad part of the first pad part 110 to the second pixel common power pad part of the second pad part 210. The pixel common power routing portion according to an embodiment may include a plurality of pixel common power routing lines 470. The plurality of pixel common power routing lines (or a fourth routing line) 470 may individually (or respectively) connect the plurality of first pixel common power pads, disposed in the first pad part 110, to the plurality of second pixel common power pads disposed in the second pad part 210.

The routing portion 400 according to an embodiment may further include a reference power routing portion.

The reference power routing portion (or a fifth routing portion) may electrically connect the first reference power pad part of the first pad part 110 to the second reference power pad part of the second pad part 210. The reference power routing portion according to an embodiment may include a plurality of reference power routing lines 490. The plurality of reference power routing lines (or a fifth routing line) 490 may individually (or respectively) connect the plurality of first reference power pads, disposed in the first pad part 110, to the plurality of second reference power pads disposed in the second pad part 210.

The display apparatus 10 according to an embodiment of the present disclosure may further include a driving circuit unit 500.

The driving circuit unit 500 may drive (or emit light) the pixels P disposed on the first substrate 100 on the basis of digital video data and a timing synchronization signal supplied from a display driving system to allow the display area AA to display an image corresponding to image data. The driving circuit unit 500 may be connected to the third pad part 230 disposed on the rear surface 200b of the second substrate 200 and may output, to the third pad part 230, a data signal, a gate control signal, and a driving power for driving (or emitting light) the pixels P disposed on the first substrate 100. For example, the driving circuit unit 500 may have a size which is less than that of the second substrate 200, and thus, may be covered by the second substrate 200 and may not be exposed at the outer surface of the second substrate 200 or the outer surface of the first substrate 100.

The driving circuit unit 500 according to an embodiment may include a flexible circuit film 510, a driving integrated circuit (IC) 530, a printed circuit board (PCB) 550, and a timing controller 570.

The flexible circuit film 510 may be connected to the third pad part 230 disposed on the rear surface 200b of the second substrate 200. The flexible circuit film 510 according to an embodiment may be a tape carrier package (TCP) or a chip on film (COF). For example, one edge portion (or an output bonding portion) of the flexible circuit film 510 may be attached on the third pad part 230 disposed on the second substrate 200 through a film attachment process using an anisotropic conductive film. The other edge portion (or an input bonding portion) of the flexible circuit film 510 may be attached on the PCB 550 through a film attachment process using an anisotropic conductive film.

The driving IC 530 may be mounted on the flexible circuit film 510. The driving IC 530 may receive subpixel data and a data control signal provided from the timing controller 570, and convert the subpixel data into an analog data signal on the basis of the data control signal to supply the analog data signal to a corresponding data line DL. For example, the driving IC 530 may be a data driving IC or a source driving IC.

The driving IC 530 according to an embodiment may generate a plurality of grayscale voltages by using a plurality of reference gamma voltages provided from the PCB 550 and may select a grayscale voltage corresponding to the subpixel data from among the plurality of grayscale voltages to output a data signal. The data signal may be supplied to a corresponding data line DL via an output bonding portion of the flexible circuit film 510, the third pad part 230, the link line portion 250, the second pad part 210, the routing portion 400, and the first pad part 110.

Moreover, the driving IC 530 may generate and output a pixel driving power and a pixel common power needed for driving (or emitting light) of the pixels P by using the plurality of reference gamma voltages. For example, the driving IC 530 may select and output, as the pixel driving power and the pixel common power, a predetermined reference gamma voltage or a predetermined grayscale voltage from among the plurality of reference gamma voltages or a plurality of grayscale voltages.

Additionally, the driving IC 530 may additionally generate and output a reference power on the basis of driving (or operating) of a pixel circuit disposed in the circuit area of the pixel P. For example, the driving IC 530 may select and output, as a reference voltage, a predetermined reference gamma voltage or a predetermined grayscale voltage from among the plurality of reference gamma voltages or the plurality of grayscale voltages.

The pixel driving power, the pixel common power, and the reference power may have different voltage levels. The pixel driving power, the pixel common power, and the reference power may be respectively supplied to a corresponding pixel driving power line PL, a corresponding pixel common power line CPL, and a corresponding reference power line RL via an output bonding portion of the flexible circuit film 510, the third pad part 230, the link line portion 250, the second pad part 210, the routing portion 400, and the first pad part 110.

The driving IC 530 may sense a characteristic value of a driving TFT disposed in the pixel P through the plurality of reference power lines RL disposed on the first substrate 100, generate sensing raw data corresponding to a sensing value, and provide the sensing raw data to the timing controller 570.

The PCB 550 may be connected to the other edge portion of the flexible circuit film 510. The PCB 550 may transfer a signal and power between elements of the driving circuit unit 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data on the basis of the timing synchronization signal to generate pixel data matching a pixel arrangement structure disposed in the display area AA and may provide the generated pixel data to the driving IC 530.

According to an embodiment, when the pixel P includes a white subpixel SP, the timing controller 570 may extract white pixel data on the basis of the digital video data (i.e., red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to the driving IC 530. For example, the timing controller 570 may convert red, green, and blue input data into four-color (for example, red, green, blue, and white) data on the basis of a data conversion method disclosed in Korean Patent Publication No. 10-2013-0060476 or 10-2013-0030598, all of these publications being incorporated by reference into the present application.

The timing controller 570 may generate each of the data control signal and the gate control signal on the basis of the timing synchronization signal, control a driving timing of the driving IC 530 on the basis of the data control signal, and control a driving timing of the gate driving circuit 150 on the basis of the gate control signal. For example, the timing synchronization signal may include a vertical synchronization signal, a horizontal synchronization signal, a data enable signal, and a main clock (or a dot clock).

The data control signal according to an embodiment may include a source start pulse, a source shift clock, and a source output signal. The data control signal may be supplied to the driving IC 530 via the input bonding portion of the flexible circuit film 510 and the flexible circuit film 510.

The gate control signal according to an embodiment may include a start signal (or a gate start pulse), a plurality of shift clocks, a forward driving signal, and a reverse driving signal. In this case, the plurality of shift clocks may include a plurality of scan clocks where phases thereof are sequentially shifted and a plurality of carry clocks where phases thereof are sequentially shifted. Additionally, the gate control signal according to an embodiment may further include an external sensing line selection signal, an external sensing reset signal, and an external sensing control signal for sensing a characteristic value of the driving TFT disposed in the pixel P. The gate control signal may be supplied to the gate driving circuit 150 via the input bonding portion of the flexible circuit film 510, the flexible circuit film 510, the output bonding portion of the flexible circuit film 510, the third pad part 230, the link line portion 250, the second pad part 210, the routing portion 400, and the first pad part 110.

The timing controller 570 may drive each of the driving IC 530 and the gate driving circuit 150 on the basis of an external sensing mode during a predetermined external sensing period, generate compensation data for compensating for a characteristic variation of the driving TFT of each pixel P on the basis of the sensing raw data provided from the driving IC 530, and modulate pixel data on the basis of the generated compensation data. For example, the timing controller 570 may drive each of the driving IC 530 and the gate driving circuit 150 on the basis of the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment may store the sensing raw data of each pixel P, provided from the driving IC 530, in a storage circuit on the basis of the external sensing mode. Also, in a display mode, the timing controller 570 may correct pixel data which is to be supplied to each pixel, based on the sensing raw data stored in the storage circuit and may provide corrected pixel data to the driving IC 530. Here, sensing raw data of each pixel may include sequential variation information about each of a driving TFT and a self-light emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel P, thereby minimizing or preventing the degradation in image quality caused by a characteristic value deviation of driving TFTs of a plurality of subpixels SP. The external sensing mode of a display apparatus may be technology known to those skilled in the art, and thus, its detailed description is omitted. For example, the display apparatus according to the present disclosure may sense a characteristic value of the driving TFT disposed in each subpixel P on the basis of a sensing mode disclosed in Korean Patent Publication No. 10-2016-0093179, 10-2017-0054654, or 10-2018-0002099, all of these publications being incorporated by reference into the present application.

The driving circuit unit 500 according to an embodiment may further include a power circuit unit 590.

The power circuit unit 590 may be mounted on the PCB 550 and may generate various source voltages needed for displaying an image on the pixels P by using an input power supplied from the outside to provide the generated source voltage to a corresponding circuit. For example, the power circuit unit 590 may generate and output a logic source voltage needed for driving of each of the timing controller 570 and the driving IC 530, the plurality of reference gamma voltages provided to the driving IC 530, and at least one gate driving power and at least one gate common power needed for driving of the gate driving circuit 150. The gate driving power and the gate common power may have different voltage levels. Each of the plurality of reference gamma voltages may be supplied to the driving IC 530 via the input bonding portion of the flexible circuit film 510 and the flexible circuit film 510. Each of the at least one gate driving power and the at least one gate common power may be supplied to the gate driving circuit 150 via the input bonding portion of the flexible circuit film 510, the flexible circuit film 510, the output bonding portion of the flexible circuit film 510, the third pad part 230, the link line portion 250, the second pad part 210, the routing portion 400, and the first pad part 110.

Figure 5:
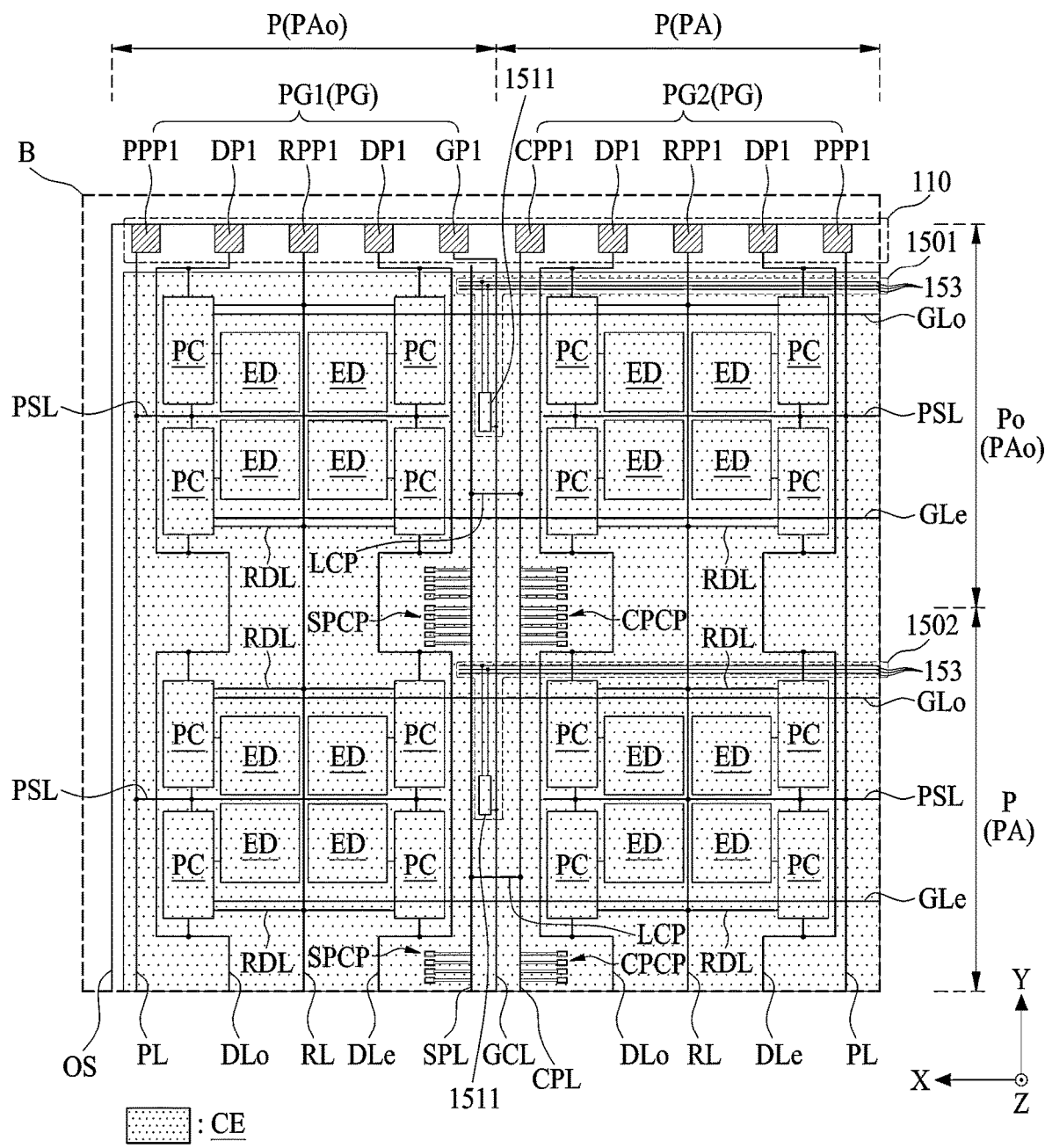
FIG. 5 is an enlarged view of a region 'B' illustrated in FIG. 3.

FIG. 5 is an enlarged view of a region 'B' illustrated in FIG. 3 and is diagram for describing pixels disposed on a first substrate.

Referring to FIGS. 3 to 5, a first substrate 100 according to the present disclosure may include a plurality of data lines DLo and DLe, a plurality of gate lines GLo and GLe, a plurality of pixel driving power lines PL, a plurality of pixel common power lines CPL, a plurality of pixels P, a common electrode CE (see FIG. 7), a plurality of common power contact portions CPCP, a gate control line group GCL, a gate driving circuit 150, and a first pad part 110.

The plurality of data lines DLo and DLe may extend long in a second direction Y and may be disposed apart from one another by a predetermined interval in a display area AA of the first substrate 100 in a first direction X. For example, in the plurality of data lines DLo and DLe, an odd-numbered data line DLo may be disposed at a first edge portion of each of a plurality of pixel areas PA arranged on the first substrate 100 in the second direction Y, and an even-numbered data line DLe may be disposed at a second edge portion of each of the plurality of pixel areas PA arranged on the first substrate 100 in the second direction Y. Here, with respect to the first direction X, the first edge portion of each of the plurality of pixel areas PA may be a left edge portion of a corresponding pixel area PA, and the second edge portion of each of the plurality of pixel areas PA may be a right edge portion of a corresponding pixel area PA.

The plurality of gate lines GLo and GLe may extend long in the first direction X and may be disposed apart from one another by a predetermined interval in the display area AA of the first substrate 100 in the second direction Y. For example, in the plurality of gate lines GLo and GLe, an odd-numbered gate line GLo may be disposed at a third edge portion of each of the plurality of pixel areas PA arranged on the first substrate 100 in the first direction X, and an even-numbered gate line GLe may be disposed at a fourth edge portion of each of the plurality of pixel areas PA arranged on the first substrate 100 in the first direction X. Here, with respect to the second direction Y, the third edge portion of each of the plurality of pixel areas PA may be an upper edge portion of a corresponding pixel area PA, and the fourth edge portion of each of the plurality of pixel areas PA may be a lower edge portion of a corresponding pixel area PA.

The plurality of pixel driving power lines PL may extend long in the second direction Y and may be disposed apart from one another by a predetermined interval in the display area AA of the first substrate 100 in the first direction X. For example, in the plurality of pixel driving power lines PL, an odd-numbered pixel driving power line PL may be disposed at a first edge portion of an odd-numbered pixel area PA with respect to the first direction X, and an even-numbered pixel driving power line PL may be disposed at a second edge portion of an even-numbered pixel area PA with respect to the first direction X.

Two adjacent pixel driving power lines PL of the plurality of pixel driving power lines PL may be connected to a plurality of power sharing lines PSL disposed in each of pixel areas PA arranged in the second direction Y. For example, the plurality of pixel driving power lines PL may be electrically connected to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the display apparatus 10 according to the present disclosure may prevent or minimize the degradation in image quality caused by a deviation of the pixel driving power supplied to each of the pixels P.

Each of the plurality of power sharing lines PSL may branch from an adjacent pixel driving power line PL in parallel with the first direction X and may be disposed in a middle region of each pixel area PA.

The plurality of pixel common power lines CPL may extend long in the second direction Y and may be disposed apart from one another by a predetermined interval in the display area AA of the first substrate 100 in the first direction X. For example, each of the plurality of pixel common power lines CPL may be disposed at a first edge portion of an even-numbered pixel area PA with respect to the first direction X.

A plurality of pixels P may be respectively disposed in the plurality of pixel areas PA which is defined to have an equal size in the display area AA of the first substrate 100.

Each of the plurality of pixels P may include at least three subpixels. For example, as illustrated in FIG. 2, each of the plurality of pixels P may include first to fourth subpixels SP1 to SP4.

Referring to FIGS. 2 and 5, each of the first to fourth subpixels SP1 to SP4 may include a pixel circuit PC and a light emitting device ED.

The pixel circuit PC according to an embodiment may be disposed in a circuit area CA of the pixel area PA and may be connected to gate lines GLo and GLe adjacent thereto, data lines DLo and DLe adjacent thereto, and the pixel driving power line PL. For example, a pixel circuit PC disposed in a first subpixel SP1 may be connected to an odd-numbered data line DLo and an odd-numbered gate line GLo, a pixel circuit PC disposed in a second subpixel SP2 may be connected to an even-numbered data line DLe and an odd-numbered gate line GLo, a pixel circuit PC disposed in a third subpixel SP3 may be connected to an odd-numbered data line DLo and an even-numbered gate line GLe, and a pixel circuit PC disposed in a fourth subpixel SP4 may be connected to an even-numbered data line DLe and an even-numbered gate line GLe.

The pixel circuit PC of each of the first to fourth subpixels SP1 to SP4 may sample a data signal supplied from corresponding data lines DLo and DLe in response to a scan signal supplied from corresponding gate lines GLo and GLe and may control a current flowing from the pixel driving power line PL to the light emitting device ED on the basis of a sampled data signal. For example, the pixel circuit PC may sample a data signal by using at least two TFTs and at least one capacitor and may control a current flowing in the light emitting device ED on the basis of a sampled data signal.

The pixel circuit PC of each of the first to fourth subpixels SP1 to SP4 may be implemented as a pixel driving chip through a semiconductor manufacturing process, disposed in a circuit area CA of a corresponding pixel area PA, and connected to gate lines GLo and GLe adjacent thereto, data lines DLo and DLe adjacent thereto, and the pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from corresponding data lines DLo and DLe in response to a scan signal supplied from corresponding gate lines GLo and GLe and may control a current flowing from the pixel driving power line PL to the light emitting device ED on the basis of a sampled data signal.

The light emitting device ED may be disposed in an emission area EA of the pixel area PA, electrically connected to the pixel circuit PC, and electrically connected to the common electrode CE. The light emitting device ED may emit light with a current flowing from the pixel circuit PC to the common electrode CE. For example, the light emitting device ED may emit light on the basis of a top emission type and may irradiate the light onto a portion above a first surface of a first substrate 100, but is not limited thereto.

The light emitting device ED according to an embodiment may include a self-light emitting device. For example, the light emitting device ED may include an organic light emitting device or an inorganic light emitting device. The inorganic light emitting device may include a semiconductor light emitting diode, a micro light emitting diode, or a quantum dot light emitting diode. For example, when the light emitting device ED is the inorganic light emitting device, the light emitting device ED may have a scale of 1 μm to 100 μm, but is not limited thereto.

The light emitting device ED according to an embodiment may emit one light of red light, green light, blue light, and white light. For example, the light emitting device ED of each of the first to fourth subpixels SP1 to SP4 may be implemented to emit white light, but is not limited thereto.

Referring again to FIGS. 3 to 5, the common electrode CE may be disposed in a display area AA of the first substrate 100 and may be electrically connected to the light emitting device ED of each of the plurality of pixels P. For example, the common electrode CE may be disposed in a region, other than a first pad part 110 disposed in the first substrate 100, of the display area AA of the first substrate 100.

The common electrode CE according to an embodiment may include a transparent conductive material which transmits light emitted from the light emitting device ED of each of the plurality of pixels P. For example, the transparent conductive material may be indium tin oxide (ITO) or indium zinc oxide (IZO), but is not limited thereto.

Each of the plurality of common power contact portions CPCP may be disposed between two adjacent pixels P of the plurality of pixels P respectively overlapping the plurality of pixel common power lines CPL and may electrically connect the common electrode CE to a corresponding pixel common power line CPL of the plurality of pixel common power lines CPL. With respect to the second direction Y, each of the plurality of common power contact portions CPCP according to an embodiment may be electrically connected to a corresponding pixel common power line CPL of the plurality of pixel common power lines CPL at a portion between the plurality of pixels P or at a boundary portion between the plurality of pixels P and may be electrically connected to a portion of the common electrode CE, and thus, may electrically connect the common electrode CE to a corresponding pixel common power line CPL of the plurality of pixel common power lines CPL.

Each of the plurality of common power contact portions CPCP may be disposed between two adjacent pixels P of the plurality of pixels P to electrically connect the common electrode CE to a corresponding pixel common power line CPL of the plurality of pixel common power lines CPL, and thus, may prevent or minimize the voltage drop (IR drop) of the pixel common power caused by a surface resistance of the common electrode CE. Accordingly, the display apparatus 10 according to the present disclosure may prevent or minimize the degradation in image quality caused by a deviation of the pixel driving power supplied to each of the pixels P arranged in the display area AA.

The gate control line group GCL may include a gate driving circuit 150 and a plurality of gate control lines in the display area AA of the first substrate 100.

The gate control line group GCL according to an embodiment may include a start signal line, a plurality of shift clock lines, at least one gate driving power line, and at least one gate common power line. The lines of the gate control line group GCL may extend long in the second direction Y and may be disposed apart from one another by a predetermined interval in the display area AA of the first substrate 100 in the first direction X. For example, each of the lines of the gate control line group GCL may be disposed between one or more pixels P in the first direction X.

The gate driving circuit 150 may be disposed in the display area AA of the first substrate 100. Therefore, because the gate driving circuit 150 is disposed in the display area AA of the first substrate 100, a second interval D2 between a center portion of an outermost pixel area PAo and each of outer surfaces OS of the first substrate 100 may be half or less of a first interval (or a pixel pitch) D1 between adjacent pixel areas PA. For example, when the gate driving circuit 150 is not disposed in the display area AA of the first substrate 100 and is between the outermost pixel area PAo and the outer surface OS of the first substrate 100, the second interval D2 may not be half or less of the first interval D1 due to a size (or a width) occupied by the gate driving circuit 150. Accordingly, in an embodiment of the present disclosure, because the gate driving circuit 150 is disposed within the display area AA of the first substrate 100, the second interval D2 may be implemented to be half or less of the first interval D1.

Figure 6:
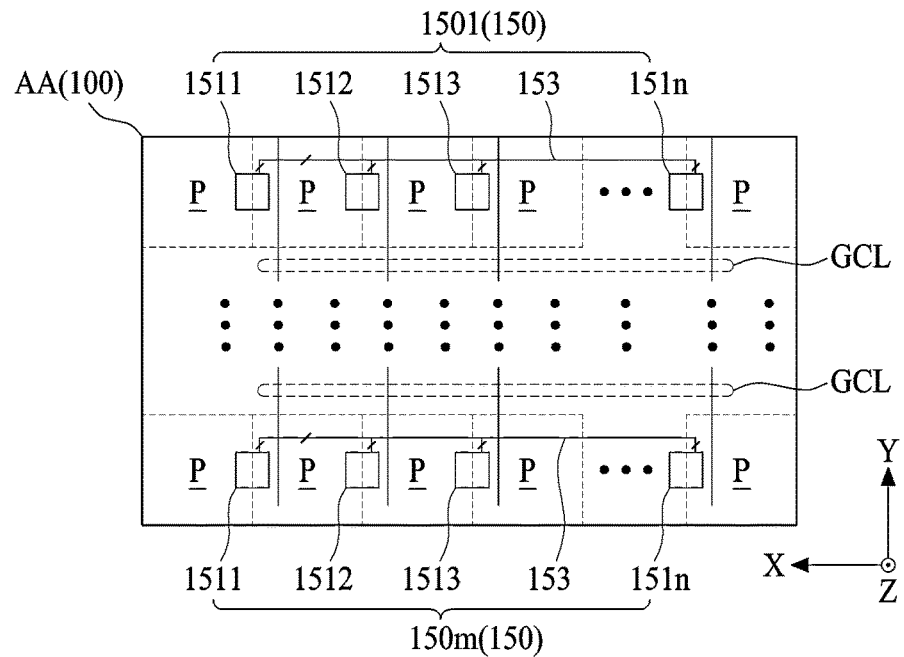
FIG. 6 is a diagram illustrating a gate driving circuit disposed in a display area illustrated in FIG. 3.

Referring to FIGS. 5 and 6, a gate driving circuit 150 according to an embodiment may be implemented with a shift register including a plurality of stage circuit units 150*l* to 150*m*.

Each of the plurality of stage circuit units 150*l* to 150*m* may be disposed apart from one another in each horizontal line of a first surface 100*a* of the first substrate 100 in the first direction X and may be dependently connected to one another in the second direction Y. Each of the plurality of stage circuit units 150*l* to 150*m* may generate a scan signal in a predetermined order in response to a gate control signal supplied through the first pad part 110 and the gate control line group GCL and may supply the scan signal to a corresponding gate line GL.

Each of the plurality of stage circuit units 150*l* to 150*m* according to an embodiment may include a plurality of branch circuits 151*l* to 151*n* and a branch network 153.

The plurality of branch circuits 151*l* to 151*n* may be selectively connected to the lines of the gate control line group GCL through the branch network 153 and may be electrically connected to one another through the branch network 153. Each of the plurality of branch circuits 151*l* to 151*n* may generate the scan signal on the basis of a gate control signal, supplied through a corresponding line of the gate control line group GCL and the branch network 153, and a signal transferred between branch networks 153 and may supply the scan signal to a corresponding gate line GL.

Each of the plurality of branch circuits 151*l* to 151*n* may include at least one of a plurality of TFTs configuring one of the stage circuit units 150*l* to 150*m*. Each of the plurality of branch circuits 151*l* to 151*n* may be disposed in a circuit area between two adjacent pixels P or in a circuit area between two pixels P, in each horizontal line of the first substrate 100, but is not limited thereto and may be disposed in a circuit area between one or more pixels P on the basis of the number of TFTs configuring each of the stage circuit units 150*l* to 150*m* and the number of pixels P disposed one horizontal line.

The branch network 153 may be disposed in each horizontal line of the first substrate 100 and may electrically connect the plurality of branch circuits 151*l* to 151*n*. The branch network 153 according to an embodiment may include a plurality of control nodes and a network line.

The plurality of control nodes may be disposed in each horizontal line of the first substrate 100 and may be selectively connected to the plurality of branch circuits 151*l* to 151*n* in one horizontal line. For example, the plurality of control nodes may be disposed in an upper edge region (or a lower edge region) among pixel areas arranged in each horizontal line of the first substrate 100.

The network line may be selectively connected to the lines of the gate control line group GCL disposed in the first substrate 100 and may be selectively connected to the plurality of branch circuits 151*l* to 151*n*. For example, the network line may transfer the gate control signal, supplied through the lines of the gate control line group GCL, to corresponding branch circuits 151*l* to 151*n* and may transfer a signal between the plurality of branch circuits 151*l* to 151*n*.

Referring again to FIGS. 3 to 5, the first pad part 110 may be disposed at a first edge portion among the first surface of the first substrate 100 parallel to the first direction X. The first pad part 110 may be disposed at a third edge portion of each of outermost pixel areas PAo disposed at the first edge portion of the first substrate 100. With respect to the second direction Y, an end of the first pad part 110 may overlap or may be aligned with an end of each of the outermost pixel areas PAo. Therefore, the first pad part 110 may be included (or disposed) in each of the outermost pixel areas PAo disposed at the first edge portion of the first substrate 100, and thus, a non-display area (or a bezel area) based on the first pad part 110 may not be formed or may not be on in the first substrate 100.

The first pad part 110 may include a plurality of first pads which are disposed in parallel with one another in the first direction X on the first edge portion of the first substrate 100. The plurality of first pads may be divided (or classified) into a plurality of first data pads DP1, a plurality of first gate pads GP1, a plurality of first pixel driving power pads PPP1, and a plurality of first pixel common power pads CPP1.

The first pad part 110 according to an embodiment may include a first data pad part, a first gate pad part, a first pixel driving power pad part, and a first pixel common power pad part.

The first data pad part may include a plurality of first data pads DP1. Each of the plurality of first data pads DP1 may be individually (or respectively) connected to one end of each of a plurality of data lines DLo and DLe disposed on the first substrate 100.

The first data pad part may be connected to a data routing portion disposed in a routing portion 400. Each of the plurality of first data pads DP1 disposed in the first data pad part may be individually (or respectively) connected to one end of each of a plurality of data routing lines 410 disposed in the routing portion 400. Therefore, each of the plurality of data lines DLo and DLe disposed on the first substrate 100 may be electrically connected to a corresponding data routing line 410 of the plurality of data routing lines 410 through a corresponding first data pad DP1 of the plurality of first data pads DP1.

The first gate pad part may include a plurality of first gate pads GP1. Each of the plurality of first gate pads GP1 may be individually (or respectively) connected to one end of a corresponding gate control line among the gate control lines included in the gate control line group GCL disposed on the first substrate 100.

The first gate pad part may be connected to a gate routing portion disposed in the routing portion 400. Each of the plurality of first gate pads GP1 disposed in the first gate pad part may be individually (or respectively) connected to one end of each of a plurality of gate routing lines 430 among a plurality of routing lines disposed in the routing portion 400. Therefore, each line included in the gate control line group GCL disposed on the first substrate 100 may be electrically connected to a corresponding gate routing line 430 of the plurality of gate routing lines 430 through a corresponding first gate pad GP1 among a plurality of first gate pads GP1.

The plurality of first gate pads GP1 according to an embodiment may be divided (or classified) into a first start signal pad, a plurality of first shift clock pads, at least one first gate driving power pad, and at least one first gate common power pad.

The first start signal pad may be electrically connected to a start signal routing line disposed in a gate routing portion of the routing portion 400. Therefore, the start signal line disposed on the first substrate 100 may be electrically connected to the start signal routing line through the first start signal pad.

Each of the plurality of first shift clock pads may be electrically connected to a corresponding shift clock routing line of the plurality of shift clock routing lines disposed in the gate routing portion of the routing portion 400. Therefore, each of the plurality of shift clock lines disposed on the first substrate 100 may be electrically connected to a corresponding first shift clock pad of the plurality of first shift clock pads through corresponding shift clock routing line of the plurality of shift clock routing lines.

The at least one first gate driving power pad may be electrically connected to the at least one gate driving power routing line disposed in the gate routing portion of the routing portion 400. Therefore, the at least one first gate driving power line disposed on the first substrate 100 may be electrically connected to the at least one gate driving power routing line through the at least one first gate driving power pad.

The at least one first gate common power pad may be electrically connected to the at least one gate common power routing line disposed in the gate routing portion of the routing portion 400. Therefore, the at least one first gate common power line disposed on the first substrate 100 may be electrically connected to the at least one gate common power routing line through the at least one first gate common power pad.

The first pixel driving power pad part may include a plurality of first pixel driving power pad PPP1. Each of the plurality of first pixel driving power pad PPP1 may be individually (or respectively) connected to one end of a corresponding pixel driving power line PL among the plurality of pixel driving power lines PL disposed on the first substrate 100.

The first pixel driving power pad part may be connected to the pixel driving power routing portion disposed in the routing portion 400. Each of the plurality of first pixel driving power pads PPP1 disposed in the first pixel driving power pad part may be individually (or respectively) connected to one end of a corresponding pixel driving power routing line 450 among the plurality of pixel driving power routing lines 450 disposed in the routing portion 400. Therefore, each of the plurality of pixel driving power lines PL disposed on the first substrate 100 may be individually (or respectively) connected to one end of a corresponding pixel driving power routing line 450 of the plurality of pixel driving power routing lines 450 through a corresponding first pixel driving power pad PPP1 of the plurality of first pixel driving power pads PPP1.

The first pixel common power pad part may include a plurality of first pixel common power pad CPP1. Each of the plurality of first pixel common power pad CPP1 may be individually (or respectively) connected to one end of a corresponding pixel common power line CPL of the plurality of pixel common power lines CPL disposed on the first substrate 100.

The first pixel common power pad part may be connected to the pixel common power routing portion disposed in the routing portion 400. Each of the plurality of first pixel common power pads CPP1 disposed in the first pixel common power pad part may be individually (or respectively) connected to one end of a corresponding pixel common power routing line 470 of the plurality of pixel common power routing lines 470 disposed in the routing portion 400. Therefore, each of the plurality of pixel common power lines CPL disposed on the first substrate 100 may be individually (or respectively) connected to one end of a corresponding pixel common power routing line 470 of the plurality of pixel common power routing lines 470 through a corresponding first pixel common power pad CPP1 of the plurality of first pixel common power pads CPP1.

The first pad part 110 according to an embodiment may include a plurality of pad groups PG which are arranged in the order of a first pixel driving power pad PPP1, two first data pads DP1, a first gate pad GP1, a first pixel common power pad CPP1, two first data pads DP1, and a first pixel driving power pad PPP1 along the first direction X. Each of the plurality of pad groups PG may be connected to two adjacent pixels P disposed along the first direction X. For example, the plurality of pad groups PG may include a first pad group PG1, including one first pixel driving power pad PPP1, two first data pads DP1, and one first gate pad GP1 continuously disposed in an odd-numbered pixel area PA along the first direction X, and a second pad group PG2 including one first pixel common power pad CPP1, two first data pads DP1, and one first pixel driving power pad PPP1 continuously disposed in an even-numbered pixel area PA along the first direction X.

The first substrate 100 according to the present disclosure may further include a plurality of secondary power lines SPL and a plurality of secondary power contact portions SPCP.

Each of the plurality of secondary power lines SPL may extend long in the second direction Y and may be disposed adjacent to a corresponding pixel common power line CPL of the plurality of pixel common power lines CPL. Each of the plurality of secondary power lines SPL may be electrically connected to an adjacent pixel common power line CPL without being electrically connected to the first pixel common power pad CPPP1 and may be supplied with a pixel common power through the adjacent pixel common power line CPL. To this end, the first substrate 100 according to the present disclosure may further include a plurality of line connection patterns LCP which electrically connect a pixel common power line CPL and a secondary power line SPL adjacent to each other.

Each of the plurality of line connection patterns LCP may be disposed on the first substrate 100 so that the line connection pattern LCP and a pixel common power line CPL and a secondary power line SPL adjacent to each other intersect with each other and may electrically connect a pixel common power line CPL and a secondary power line SPL adjacent to each other by using a line jumping structure. For example, one side of each of the plurality of line connection patterns LCP may be electrically connected to a portion of the secondary power line SPL through a first line contact hole formed in an insulation layer on the second power line SPL, and the other side of each of the plurality of line connection patterns LCP may be electrically connected to a portion of the pixel common power line CPL through a second line contact hole formed in an insulation layer on the pixel common power line CPL.

Each of the plurality of secondary power contact portions SPCP may be disposed between the plurality of pixels P respectively overlapping the plurality of secondary power lines SPL and may electrically connect the common electrode CE to each of the plurality of secondary power lines SPL. With respect to the second direction Y, each of the plurality of secondary power contact portions SPCP according to an embodiment may be electrically connected to a corresponding secondary power line SPL of the plurality of secondary power lines SPL at a portion between the plurality of pixels P or a boundary portion between the plurality of pixels P and may be electrically connected to a portion of the common electrode CE, and thus, may electrically connect the common electrode CE to each of the plurality of secondary power lines SPL. Therefore, the common electrode CE may be additionally connected to each of the plurality of secondary power lines SPL through each of the plurality of secondary power contact portions SPCP. Accordingly, the display apparatus 10 according to the present disclosure may prevent or minimize the degradation in image quality caused by a deviation of the pixel common power supplied to each of the pixels P arranged in the display area AA. Also, in the display apparatus 10 according to the present disclosure, although a first pixel common power pad CPP1 connected to each of the plurality of secondary power lines SPL is not additionally disposed (or formed), the pixel common power may be supplied to the common electrode CE in each of the plurality of pixel areas PA.

The display apparatus 10 according to the present disclosure may further include a plurality of reference power lines RL.

The plurality of reference power lines RL may extend long in the second direction Y and may be disposed apart from one another by a predetermined interval in the display area AA of the first substrate 100 in the first direction X. Each of the plurality of reference power lines RL may be disposed in a center region of each of the pixel areas PA arranged in the second direction Y. For example, each of the plurality of reference power lines RL may be disposed between an odd-numbered data line DLo and an even-numbered data line DLe in each pixel area PA.

Each of the plurality of reference power lines RL may be shared by two adjacent subpixels ((SP1, SP2) (SP3, SP4)) in the first direction X in each pixel area PA. To this end, each of the plurality of reference power lines RL may include a reference branch line RDL.

The reference branch line RDL may branch (or protrude) to the two adjacent subpixels ((SP1, SP2) (SP3, SP4)) in the first direction X in each pixel area PA and may be electrically connected to the two adjacent subpixels ((SP1, SP2) (SP3, SP4)).

The first pad part 110 according to the present disclosure may further include a first reference power pad part.

The first reference power pad part may include a plurality of first reference power pads RPP1. Each of the plurality of first reference power pads RPP1 may be individually (or respectively) connected to one end of a corresponding reference power line RL of the plurality of reference power lines RL. For example, each of the plurality of first reference power pads RPP1 may be disposed between two first data pads DP1 disposed in each of a plurality of outermost pixel areas PAo, but is not limited thereto.

The first reference power pad part may be connected to the reference power routing portion disposed in the routing portion 400. Each of the plurality of first reference power pads RPP1 disposed in the first reference power pad part may be individually (or respectively) connected to one end of a corresponding reference power routing line 490 of the plurality of reference power routing lines 490 disposed in the routing portion 400. Therefore, each of the plurality of reference power lines RL disposed on the first substrate 100 may be electrically connected to a corresponding reference power routing line 490 of the plurality of reference power routing lines 490 through a corresponding first reference power pad RPP1 of the plurality of first reference power pads RPP1.

Optionally, the plurality of reference power lines RL, the reference branch line RDL, the plurality of first reference power pads RPP1, and the plurality of reference power routing lines 490 may each be omitted based on a circuit configuration of the pixel circuit PC.

Figure 7:
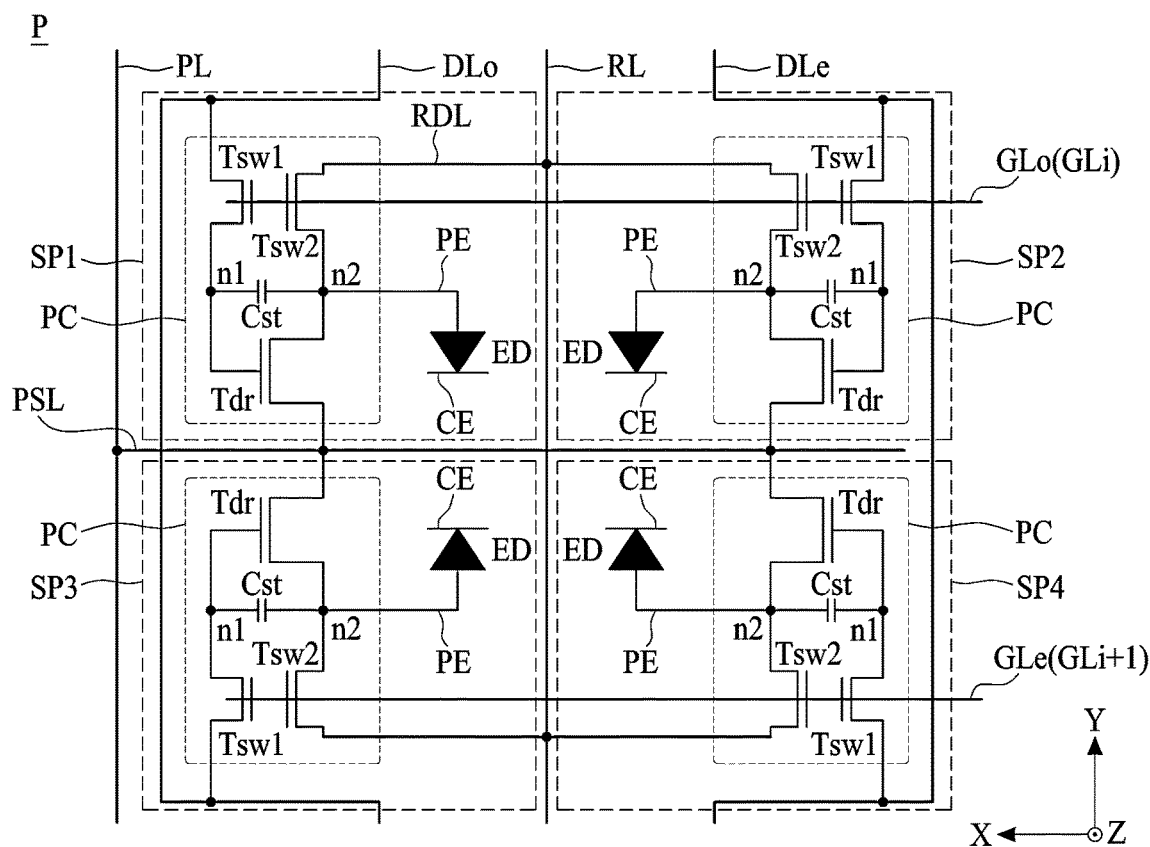
FIG. 7 is a circuit diagram illustrating one pixel illustrated in FIGS. 3 and 5.

FIG. 7 is a circuit diagram illustrating one pixel illustrated in FIGS. 3 and 5 and is a diagram for describing a pixel circuit of a subpixel. In describing FIG. 7, elements which are the same or correspond to the elements of FIGS. 3 to 6 are referred to by like reference numerals, and their repetitive descriptions are omitted or will be briefly described below.

Referring to FIG. 7, a pixel P according to the present disclosure may include first to fourth subpixels SP1 to SP4 each including a pixel circuit PC, a pixel electrode PE, and a light emitting device ED.

The pixel circuit PC disposed in each of the first to fourth subpixels SP1 to SP4 of the pixel P may be disposed in a circuit area and may be connected to adjacent gate lines GLo and GLe, adjacent data lines DLo and DLe, a reference power line RL, and a pixel driving power line PL. The pixel circuit PC may provide the light emitting device ED with a data current corresponding to a difference voltage between a data signal supplied through the adjacent data lines DLo and DLe and a reference voltage supplied through the reference power line RL in response to a scan signal supplied through the adjacent gate lines GLo and GLe, thereby allowing the light emitting device ED to emit light.

The pixel circuit PC according to an embodiment may include a first switching TFT Tsw1, a second switching thin TFT Tsw2, a storage capacitor Cst, and a driving TFT Tdr. In the following description, a thin film transistor may be referred to as a TFT.

At least one of the first switching TFT Tsw1, the second switching TFT Tsw2, and the driving TFT Tdr may be an N-type or P-type TFT. At least one of the first switching TFT Tsw1, the second switching TFT Tsw2, and the driving TFT Tdr may be an amorphous silicon (a-Si) TFT, a poly-Si TFT, an oxide TFT, or an organic TFT. For example, in the pixel circuit PC, some of the first switching TFT Tsw1, the second switching TFT Tsw2, and the driving TFT Tdr may be a TFT including a semiconductor layer (or an active layer) including low-temperature polysilicon (LTPS) having an excellent response characteristic, and the other of the first switching TFT Tsw1, the second switching TFT Tsw2, and the driving TFT Tdr may be a TFT including a semiconductor layer (or an active layer) including oxide which is good in off current characteristic. The first switching TFT Tsw1, the second switching TFT Tsw2, and the driving TFT Tdr may have different sizes (or channel sizes). For example, the driving TFT Tdr may have a size which is greater than that of each of the first switching TFT Tsw1 and the second switching TFT Tsw2, and the second switching TFT Tsw2 may have a size which is greater than that of the first switching TFT Tsw1.

The first switching TFT Tsw1 may include a gate electrode connected to the adjacent gate lines GLo and GLe, a first source/drain electrode connected to the adjacent data lines DLo and DLe, and a second source/drain electrode connected to a first node (or a gate electrode of the driving TFT Tdr) n1. The first switching TFT Tsw1 may be turned on by a scan signal supplied through corresponding gate lines GLo and GLe and may transfer a data signal, supplied through corresponding data lines DLo and DLe, to the first node n1 (i.e., the gate electrode n1 of the driving TFT Tdr).

According to an embodiment, the gate electrode of the first switching TFT Tsw1 disposed in the pixel circuit PC of each of the first subpixel SP1 and the second subpixel SP2 may be connected to an odd-numbered gate line GLo, and the gate electrode of the first switching TFT Tsw1 disposed in the pixel circuit PC of each of the third subpixel SP3 and the fourth subpixel SP4 may be connected to an even-numbered gate line GLe. The first source/drain electrode of the first switching TFT Tsw1 disposed in the pixel circuit PC of each of the first subpixel SP1 and the third subpixel SP3 may be connected to an odd-numbered data line DLo, and the first source/drain electrode of the first switching TFT Tsw1 disposed in the pixel circuit PC of each of the second subpixel SP2 and the fourth subpixel SP4 may be connected to an even-numbered data line DLe.

The second switching TFT Tsw2 may include a gate electrode connected to the adjacent gate lines GLo and GLe, a first source/drain electrode connected to an adjacent reference power line RL, and a second source/drain electrode connected to a second node (or a source electrode of the driving TFT Tdr) n2. The second switching TFT Tsw2 may be turned on by a scan signal supplied through corresponding gate lines GLo and GLe and may transfer a reference voltage, supplied through a corresponding reference branch line RDL and reference power line RL, to the source electrode n2 of the driving TFT Tdr.

According to an embodiment, the gate electrode of the second switching TFT Tsw2 disposed in the pixel circuit PC of each of the first subpixel SP1 and the second subpixel SP2 may be connected to an odd-numbered gate line GLo, and the gate electrode of the second switching TFT Tsw2 disposed in the pixel circuit PC of each of the third subpixel SP3 and the fourth subpixel SP4 may be connected to an even-numbered gate line GLe. The first source/drain electrode of the second switching TFT Tsw2 disposed in the pixel circuit PC of each of the first to fourth subpixels SP1 and SP4 may be connected to an adjacent reference power line RL in common through a corresponding reference branch line RDL.

The scan signal supplied to the gate electrode of the first switching TFT Tsw1 and the scan signal supplied to the gate electrode of the second switching TFT Tsw2 may be the same signal. For example, the gate electrode of the first switching TFT Tsw1 and the gate electrode of the second switching TFT Tsw2 may be connected to the same gate lines GLo and GLe. Therefore, the first switching TFT Tsw1 and the second switching TFT Tsw2 disposed in the pixel circuit PC of each of the first subpixel SP1 and the second subpixel SP2 may be simultaneously turned on or off by a scan signal supplied through the odd-numbered gate line GLo. Likewise, the first switching TFT Tsw1 and the second switching TFT Tsw2 disposed in the pixel circuit PC of each of the third subpixel SP3 and the fourth subpixel SP4 may be simultaneously turned on or off by a scan signal supplied through the even-numbered gate line GLe.

Optionally, the scan signal supplied to the gate electrode of the first switching TFT Tsw1 and the scan signal supplied to the gate electrode of the second switching TFT Tsw2 may be different signals. For example, the gate electrode of the first switching TFT Tsw1 and the gate electrode of the second switching TFT Tsw2 may be connected to different gate lines GLo and GLe.

Each of the odd-numbered gate line GLo and the even-numbered gate line GLe according to an embodiment may include first and second gate lines.

The first gate line of the odd-numbered gate line GLo may be connected to the gate electrode of the first switching TFT Tsw1 disposed in the pixel circuit PC of each of the first subpixel SP1 and the second subpixel SP2, and the second gate line of the odd-numbered gate line GLo may be connected to the gate electrode of the second switching TFT Tsw2 disposed in the pixel circuit PC of each of the first subpixel SP1 and the second subpixel SP2.

The first gate line of the even-numbered gate line GLe may be connected to the gate electrode of the first switching TFT Tsw1 disposed in the pixel circuit PC of each of the third subpixel SP3 and the fourth subpixel SP4, and the second gate line of the even-numbered gate line GLe may be connected to the gate electrode of the second switching TFT Tsw2 disposed in the pixel circuit PC of each of the third subpixel SP3 and the fourth subpixel SP4.

Therefore, the first switching TFT Tsw1 and the second switching TFT Tsw2 disposed in the pixel circuit PC of each of the first subpixel SP1 and the second subpixel SP2 may be simultaneously turned on or off by the same scan signal supplied through the first and second gate lines of the odd-numbered gate line GLo, or may be individually turned on or off by different scan signals supplied through the first and second gate lines of the odd-numbered gate line GLo. Likewise, the first switching TFT Tsw1 and the second switching TFT Tsw2 disposed in the pixel circuit PC of each of the third subpixel SP3 and the fourth subpixel SP4 may be simultaneously turned on or off by the same scan signal supplied through the first and second gate lines of the even-numbered gate line GLe, or may be individually turned on or off by different scan signals supplied through the first and second gate lines of the even-numbered gate line GLe. For example, in each of the first to fourth subpixels SP1 to SP4, the first switching TFT Tsw1 may be turned on based on a first scan signal supplied through a first gate line, and the second switching TFT Tsw2 may be turned on based on a second scan signal supplied through a second gate line.

The second switching TFT Tsw2 disposed in the pixel circuit PC of each of the first to fourth subpixels SP1 to SP4 may transfer a reference voltage to the source electrode n2 of the driving TFT Tdr through the reference power line RL during a data charging period (or section) of the pixel P based on an external sensing mode and may transfer a current, flowing in the source electrode n2 of the driving TFT Tdr, to the reference power line RL during a sensing period (or section) of the pixel P, and in this case, the driving circuit unit may sense the current supplied to the reference power line RL to generate compensation data for compensating for a characteristic variation of the driving TFT Tdr and may modulate pixel data on the basis of the generated compensation data. For example, the characteristic variation of the driving TFT Tdr may include a shift of a threshold voltage and/or mobility.

The storage capacitor Cst may be provided in an overlap region between the gate electrode n1 and the source electrode n2 of the driving TFT Tdr. The storage capacitor Cst may include a first capacitor electrode connected to the gate electrode of the driving TFT Tdr, a second capacitor electrode connected to the source electrode of the driving TFT Tdr, and a dielectric layer formed in an overlap region between the first capacitor electrode and the second capacitor electrode. The storage capacitor Cst may be charged with a difference voltage between the gate electrode n1 and the source electrode n2 of the driving TFT Tdr, and then, may turn on or off the driving TFT Tdr on the basis of a charged voltage.

The driving TFT Tdr may include a gate electrode (or a gate node) n1 which is connected to the second source/drain electrode of the first switching TFT Tsw1 and the first capacitor electrode of the storage capacitor Cst, a source electrode (or a source node) which is connected to the second source/drain electrode of the second switching TFT Tsw2, the second capacitor electrode of the storage capacitor Cst, and a pixel electrode PE in common, and a drain electrode (or a drain node) connected to an adjacent pixel driving power line PL.

The drain electrode of the driving TFT Tdr disposed in the pixel circuit PC of each of the first to fourth subpixels SP1 to SP4 may be connected to an adjacent pixel driving power line PL through a power sharing line PSL. The power sharing line PSL may branch from the adjacent pixel driving power line PL adjacent thereto in parallel with the first direction X and may be disposed in a center region of the pixel P. The driving TFT Tdr may be turned on based on a voltage of the storage capacitor Cst and may control the amount of current flowing from the pixel driving power line PL to the light emitting device ED.

The driving TFTs Tdr respectively disposed in the pixel circuits PC of the first to fourth subpixels SP1 to SP4 may have different sizes (or channel sizes) on the basis of the emission efficiency of a corresponding light emitting device ED. For example, the driving TFT Tdr of the first subpixel (or a red subpixel) SP1 may have a size which is greater than that of the driving TFT Tdr of each of the second to fourth subpixels SP2 to SP4, the driving TFT Tdr of the fourth subpixel (or a green subpixel) SP4 may have a size which is greater than that of the driving TFT Tdr of each of the second and third subpixels SP2 and SP3, and the driving TFT Tdr of the second subpixel (or a blue subpixel) SP2 may have a size which is greater than that of the driving TFT Tdr of the third subpixel (or a white subpixel) SP3.

Optionally, in each of the first to fourth subpixels SP1 to SP4, the pixel circuit PC including the first switching TFT Tsw1, the second switching TFT Tsw2, the storage capacitor Cst, and the driving TFT Tdr may be implemented as a pixel driving chip, disposed in a circuit area CA of a corresponding pixel area PA, and connected to gate lines GLo and GLe adjacent thereto, data lines DLo and DLe adjacent thereto, and the pixel driving power line PL. Such a pixel driving chip may sample a data signal supplied from corresponding data lines DLo and DLe in response to a scan signal supplied from corresponding gate lines GLo and GLe and may supply a data current, corresponding to a sampled data signal, to the pixel electrode PE.

The pixel electrode PE may be disposed in an emission area of each of the first to fourth subpixels SP1 to SP4 and may be connected to the drain electrode of a driving TFT Tdr disposed in a corresponding pixel circuit PC.

Based on a resolution of the display apparatus 10, the pixel electrode PE may be disposed in a corresponding subpixel area not to overlap the pixel circuit PC or to overlap a portion or all of the pixel circuit PC.

The pixel electrode PE according to an embodiment may be disposed in the subpixel area not to overlap the pixel circuit PC. For example, the pixel electrode PE may be disposed close to a central portion of the pixel P in the subpixel area.

According to another embodiment, the pixel electrode PE may be disposed in the subpixel area to overlap a portion of the pixel circuit PC. For example, the pixel electrode PE may be disposed close to the central portion of the pixel P in the subpixel area to overlap a portion of the pixel circuit PC.

According to another embodiment, the pixel electrode PE may be disposed in the subpixel area to overlap all of the pixel circuit PC. For example, the pixel electrode PE may be disposed in all of the subpixel area to overlap all of the pixel circuit PC.

The light emitting device ED may be disposed on the pixel electrode PE and may be electrically connected to the pixel electrode PE. Also, the light emitting device ED may be electrically connected to the common electrode. That is, the light emitting device ED may be disposed between the pixel electrode PE and the common electrode. The light emitting device ED may emit light with a data current supplied from a corresponding pixel circuit PC. The light emitting device ED may emit light with a data current supplied from a corresponding pixel circuit PC and may irradiate the light onto a portion above a first surface of the first substrate 100. The light emitting device ED according to an embodiment may include a self-light emitting device described above.

Optionally, in the pixel circuit PC according to an embodiment, the second switching TFT Tsw2 may be omitted based on a driving (or operating) manner of the pixel P, and in this case, the reference power line RL disposed on the first substrate 100 may also be omitted.

Figure 8:
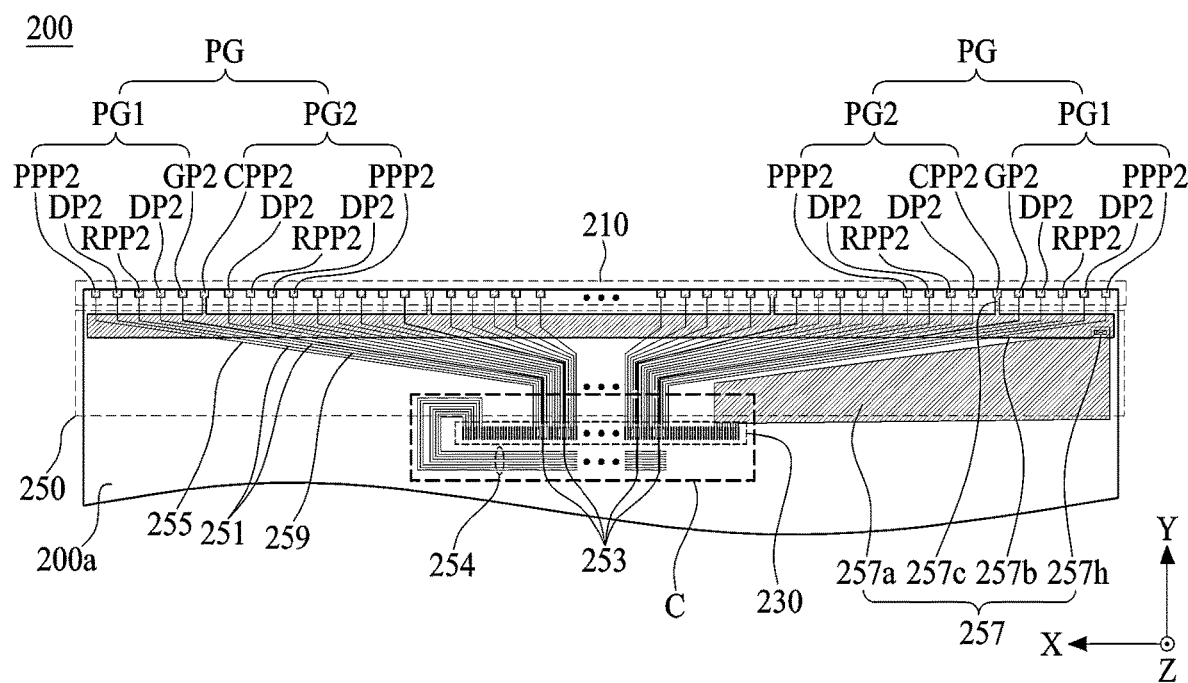
FIG. 8 is a diagram illustrating a second substrate illustrated in FIG. 4.
Figure 9:
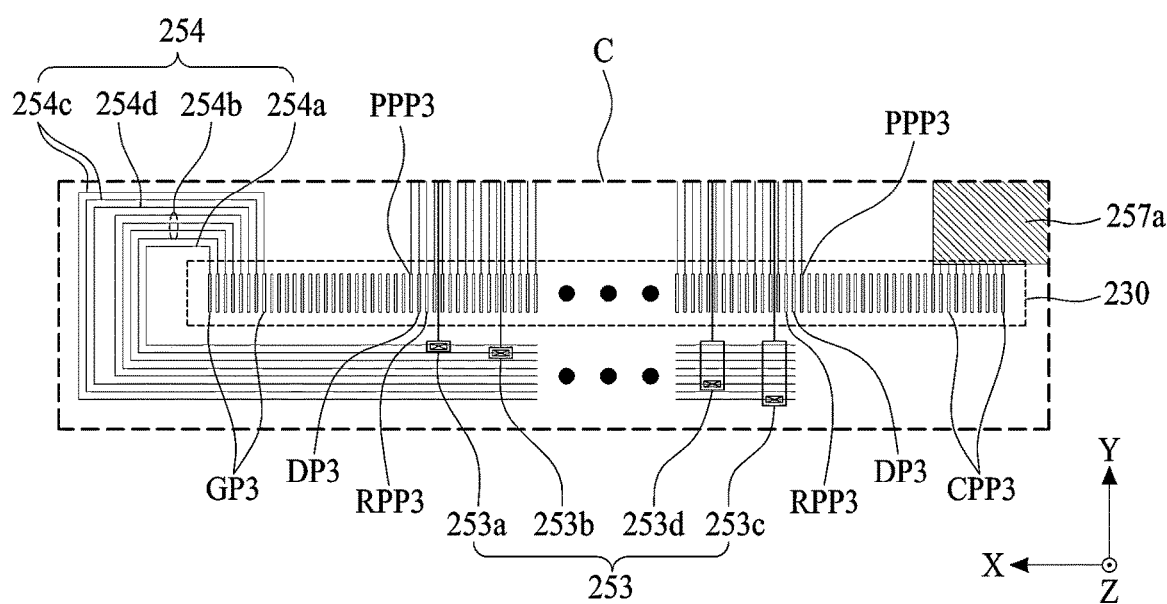
FIG. 9 is an enlarged view of a region 'C' illustrated in FIG. 8.

FIG. 8 is a diagram illustrating a second substrate illustrated in FIG. 4, and FIG. 9 is an enlarged view of a region 'C' illustrated in FIG. 8. In describing FIGS. 8 and 9, repetitive descriptions of elements which are the same or correspond to the elements of FIGS. 3 to 7 are omitted or will be briefly given below.

Referring to FIGS. 3, 5, 8, and 9, a second substrate 200 according to the present disclosure may include a second pad part 210.

The second pad part 210 may be disposed at a first edge portion of among second surface 200b of the second substrate 200 parallel to the first direction X to overlap the first pad part 110 disposed on the first substrate 100. The second pad part 210 may include a plurality of second pads which are disposed in parallel with one another at the first edge portion of the second substrate 200 in the first direction X. The plurality of second pads may be divided (or classified) into a plurality of second data pads DP2, a plurality of second gate pads GP2, a plurality of second pixel driving power pads PPP2, and a plurality of second pixel common power pads CPP2.

The second pad part 210 according to an embodiment may include a second data pad part, a second gate pad part, a second pixel driving power pad part, and a second pixel common power pad part.

The second data pad part may be electrically connected to the first data pad part of the first pad part 110 through the routing portion 400.

The second data pad part according to an embodiment may include a plurality of second data pads DP2. Each of the plurality of second data pads DP2 may be disposed to individually (or respectively) overlap a corresponding first data pad DP1 of the plurality of first data pads DP1 disposed in the first pad part 110 of the first substrate 100. Each of the plurality of second data pads DP2 according to an embodiment may be individually (or respectively) connected to a corresponding first data pad DP1 of the plurality of first data pads DP1 through a corresponding data routing line 410 of the plurality of data routing lines 410 among the plurality of routing lines disposed in the routing portion 400. Accordingly, each of the plurality of second data pads DP2 may be electrically connected to corresponding data lines DLo and DLe through a corresponding data routing line 410 and a corresponding first data pad DP1.

The second gate pad part may be electrically connected to the first gate pad part of the first pad part 110 through the routing portion 400.

The second gate pad part according to an embodiment may include a plurality of second gate pads GP2. Each of the plurality of second gate pads GP2 may be disposed to individually (or respectively) overlap a corresponding first gate pad GP1 of the plurality of first gate pads GP1 disposed in the first pad part 110 of the first substrate 100. Each of the plurality of second gate pads GP2 according to an embodiment may be individually (or respectively) connected to the other end of a corresponding gate routing line 430 of the plurality of gate routing lines 430 among the plurality of routing lines disposed in the routing portion 400. Accordingly, each of the plurality of second gate pads GP2 may be electrically connected to a corresponding gate control line included in a gate control line group GCL through a corresponding gate routing line 430 and a corresponding first gate pad GP1.

The plurality of second gate pads GP2 according to an embodiment may be divided (or classified) into a second start signal pad, a plurality of second shift clock pads, at least one second gate driving power pad, and at least one second gate common power pad.

The second start signal pad may be electrically connected to a start signal routing line disposed in a gate routing portion of the routing portion 400. Therefore, the second start signal pad may be electrically connected to a corresponding start signal line included in the gate control line group GCL through a corresponding first start signal pad and a corresponding start signal routing line among the plurality of gate routing lines 430.

Each of the plurality of second shift clock pads may be electrically connected to a corresponding shift clock routing line of the plurality of shift clock routing lines disposed in the gate routing portion of the routing portion 400. Therefore, each of the plurality of second shift clock pads may be electrically connected to a corresponding shift clock line of the plurality of shift clock lines included in the gate control line group GCL through a corresponding first shift clock pad and a corresponding shift clock routing line among the plurality of gate routing lines 430.

The at least one second gate driving power pad may be electrically connected to the at least one gate driving power routing line disposed in the gate routing portion of the routing portion 400. Therefore, the at least one second gate driving power pad may be electrically connected to the gate driving power line included in the gate control line group GCL through a corresponding first gate driving power pad and a corresponding gate driving power routing line among the plurality of gate routing lines 430.

The at least one second gate common power pad may be electrically connected to the at least one gate common power routing line disposed in the gate routing portion of the routing portion 400. Therefore, the at least one second gate common power pad may be electrically connected to the gate common power line included in the gate control line group GCL through a corresponding first gate common power pad and a corresponding gate common power routing line among the plurality of gate routing lines 430.

The second pixel driving power pad part may be electrically connected to the first pixel driving power pad part of the first pad part 110 through the routing portion 400.

The second pixel driving power pad part according to an embodiment may include a plurality of second pixel driving power pads PPP2. Each of the plurality of second pixel driving power pads PPP2 may be disposed to individually (or respectively) overlap a corresponding first pixel driving power pad PPP1 of the plurality of first pixel driving power pads PPP1 disposed in the first pad part 110 of the first substrate 100. Each of the plurality of second pixel driving power pads PPP2 according to an embodiment may be individually (or respectively) connected to a corresponding first pixel driving power pad PPP1 of the plurality of first pixel driving power pads PPP1 through a corresponding pixel driving power routing line 450 of the plurality of pixel driving power routing lines 450 among the plurality of routing lines disposed in the routing portion 400. Accordingly, each of the plurality of second pixel driving power pads PPP2 may be electrically connected to a corresponding pixel driving power line PL through a corresponding pixel driving power routing line 450 and a corresponding first pixel driving power pad PPP1.

The second pixel common power pad part may be electrically connected to the first pixel common power pad part of the first pad part 110 through the routing portion 400.

The second pixel common power pad part according to an embodiment may include a plurality of second pixel common power pads CPP2. Each of the plurality of second pixel common power pads CPP2 may be disposed to individually (or respectively) overlap a corresponding first pixel common power pad CPP1 of the plurality of first pixel common power pads CPP1 disposed in the first pad part 110 of the first substrate 100. Each of the plurality of second pixel common power pads CPP2 according to an embodiment may be individually (or respectively) connected to a corresponding first pixel common power pad CPP1 of the plurality of first pixel common power pads CPP1 through a corresponding pixel common power routing line 470 of the plurality of pixel common power routing lines 470 among the plurality of routing lines disposed in the routing portion 400. Accordingly, each of the plurality of second pixel common power pads CPP2 may be electrically connected to a corresponding pixel common power line CPL through a corresponding pixel common power routing line 470 and a corresponding first pixel common power pad CPP1.

The second pad part 210 according to an embodiment may include a plurality of pad groups PG which are arranged in the order of a second pixel driving power pad PPP2, two second data pads DP2, a second gate pad GP2, a second pixel common power pad CPP2, two second data pads DP2, and a second pixel driving power pad PPP2 along the first direction X so as to be equal to (or match) the arrangement order of the pads disposed among the first pad part 110. For example, the plurality of pad groups PG may include a first pad group PG1, including one second pixel driving power pad PPP2, two second data pads DP2, and one second gate pad GP2 continuously disposed along the first direction X, and a second pad group PG2 including one second pixel common power pad CPP2, two second data pads DP2, and one second pixel driving power pad PPP2 continuously disposed along the first direction X.

The second pad part 210 according to the present disclosure may further include a second reference power pad part.

The second reference power pad part may be electrically connected to the first reference power pad part of the first pad part 110 through the routing portion 400.

The second reference power pad part according to an embodiment may include a plurality of second reference power pads RPP2. Each of the plurality of second reference power pads RPP2 may be disposed to individually (or respectively) overlap a corresponding first reference power pad RPP1 of the plurality of first reference power pads RPP1 disposed in the first pad part 110 of the first substrate 100. Accordingly, each of the plurality of second reference power pads RPP2 may be electrically connected to a corresponding reference power line RL through a corresponding reference power routing line 490 and a corresponding first reference power pad RPP1.

The second substrate 200 according to the present disclosure may further include a third pad part 230 and a link line portion 250.

The third pad part 230 may be disposed on the rear surface 200b of the second substrate 200. For example, the third pad part 230 may be disposed at a center portion adjacent to the first edge portion of the rear surface 200b of the second substrate 200.

The third pad part 230 according to an embodiment may include a plurality of third pads (or input pads) which are apart from one another by a certain interval along the first direction X. The plurality of third pads may be divided (or classified) into a plurality of third data pads DP3, a third pixel driving power pad PPP3, a plurality of third gate pads GP3, and a plurality of third pixel common power pads CPP3.

The third pad part 230 according to an embodiment may include a third data pad part, a third pixel driving power pad part, a third gate pad part, and a third pixel common power pad part.

The third pad part 230 may include a first region (or a center region) including the third data pad part and the third pixel driving power pad part, a second region (or one region) including the third gate pad part, and a third region (or the other region) including the third pixel common power pad part.

The third data pad part may be electrically connected to the second data pad part of the second pad part 210 through the link line portion 250.

The third data pad part according to an embodiment may include a plurality of third data pads DP3. The plurality of third data pads DP3 may be disposed apart from one another by a certain interval in the first direction X in parallel in a first region of the third pad part 230.

Each of the plurality of third data pads DP3 according to an embodiment may be individually (or respectively) connected to a corresponding second data pad DP2 among the plurality of second data pads DP2 disposed in the second pad part 210 through the link line portion 250. Each of the plurality of third data pads DP3 may be supplied with a data signal from the driving IC 530 of the driving circuit unit 500. The data signal according to an embodiment may be supplied to each of the plurality of second data pads DP2 disposed in the second pad part 210 through a corresponding third data pad DP3 of plurality of third data pads DP3 and the link line portion 250.

The third pixel driving power pad part may be electrically connected to the second pixel driving power pad part of the second pad part 210 through the link line portion 250.

The third pixel driving power pad part according to an embodiment may include a plurality of third pixel driving power pads PPP3. The plurality of third pixel driving power pads PPP3 may be disposed apart from one another by a certain interval along the first direction X in parallel in a first region of the third pad part 230.

Each of the plurality of third pixel driving power pads PPP3 according to an embodiment may be individually (or respectively) connected to a corresponding second pixel driving power pad PPP2 among the plurality of second pixel driving power pads PPP2 disposed in the second pad part 210 through the link line portion 250. For example, each of the plurality of third pixel driving power pads PPP3 may be supplied with a pixel driving power from the driving IC 530 of the driving circuit unit 500. The pixel driving power according to an embodiment may be supplied to each of the plurality of second pixel driving power pads PPP2 disposed in the second pad part 210 through a corresponding third pixel driving power pad PPP3 of the plurality of third pixel driving power pads PPP3 and the link line portion 250.

The plurality of third data pads DP3 and the plurality of third pixel driving power pads PPP3 may be disposed in parallel in the first region of the third pad part 230 in the same order as the arrangement order of the plurality of second data pads DP2 and the plurality of second pixel driving power pads PPP2 disposed in the second pad part 210.

The third gate pad part may be electrically connected to the second gate pad part of the second pad part 210 through the link line portion 250.

The third gate pad part according to an embodiment may include a plurality of third gate pads GP3. The plurality of third gate pads GP3 may be disposed apart from one another by a certain interval along the first direction X in parallel in a second region of the third pad part 230.

Each of the plurality of third gate pads GP3 according to an embodiment may be individually (or respectively) connected to a corresponding second gate pad GP2 among the plurality of second gate pads GP2 disposed in the second pad part 210 through the link line portion 250. For example, each of the plurality of third gate pads GP3 may be supplied with a gate control signal from the timing controller 570 of the driving circuit unit 500. The gate control signal according to an embodiment may be supplied to each of the plurality of second gate pads GP2 disposed in the second pad part 210 through a corresponding third gate pad GP3 of plurality of third gate pads GP3 and the link line portion 250.

The plurality of third gate pads GP3 according to an embodiment may be divided (or classified) into a third start signal pad, a plurality of third shift clock pads, at least one third gate driving power pad, and at least one third gate common power pad.

The third start signal pad may be electrically connected to the second start signal pad disposed in the second pad part 210 through the link line portion 250. For example, the third start signal pad may be supplied with a start signal (or a pulse) from the timing controller 570 of the driving circuit unit 500. The start signal according to an embodiment may be supplied to the second start signal pad disposed in the second pad part 210 through a corresponding third start signal pad among the plurality of third start signal pads and the link line portion 250.

Each of the plurality of third shift clock pads may be electrically connected to a corresponding second shift clock pad among the plurality of second shift clock pads disposed in the second pad part 210 through the link line portion 250. For example, each of the plurality of third shift clock pads may be individually supplied with one of a plurality of gate shift clocks from the timing controller 570 of the driving circuit unit 500. Each of the plurality of gate shift clocks according to an embodiment may be supplied to the second shift clock pad disposed in the second pad part 210 through a corresponding third shift clock pad among the plurality of third shift clock pads and the link line portion 250.

The at least one third gate driving power pad may be electrically connected to the at least one second gate driving power pad disposed in the second pad part 210 through the link line portion 250. For example, the at least one third gate driving power pad may be supplied with a gate driving power from the power circuit unit 590 of the driving circuit unit 500. The gate driving power according to an embodiment may be supplied to the second gate driving power pad disposed in the second pad part 210 through a corresponding third gate driving power pad among he plurality of third gate driving power pads and the link line portion 250.

The at least one third gate common power pad may be electrically connected to the at least one second gate common power pad disposed in the second pad part 210 through the link line portion 250. For example, the at least one third gate common power pad may be supplied with a gate common power from the power circuit unit 590 of the driving circuit unit 500. The gate common power according to an embodiment may be supplied to the second gate common power pad disposed in the second pad part 210 through a corresponding third gate common power pad among the plurality of third gate common power pads and the link line portion 250.

The third pixel common power pad part may include at least one third pixel common power pad CPP3. The at least one third pixel common power pad CPP3 may be disposed in a third region of the third pad part 230.

The at least one third pixel common power pad CPP3 may be individually (or respectively) connected to a corresponding second pixel common power pad CPP2 disposed in the second pad part 210 through the link line portion 250. For example, the at least one third pixel common power pad CPP3 may be supplied with a pixel common power from the power circuit unit 590 of the driving circuit unit 500. The pixel common power according to an embodiment may be supplied to each of the plurality of second pixel common power pads CPP2 disposed in the second pad part 210 through a corresponding third pixel common power pad CPP3 among the plurality of third pixel common power pads CPP3 and the link line portion 250.

The third pad part 230 may further include a first dummy area which is disposed between the first region and the second region and includes a plurality of dummy pads and a second dummy area which is disposed between the first region and the third region and includes a plurality of dummy pads.

The third pad part 230 according to an embodiment may further include a third reference power pad part.

The third reference power pad part may be electrically connected to the second reference power pad part of the second pad part 210 through the link line portion 250.

The third reference power pad part according to an embodiment may include a plurality of third reference power pads RPP3. The plurality of third reference power pads RPP3 may be disposed apart from one another by a certain interval along the first direction X in parallel in the first region of the third pad part 230.

Each of the plurality of third reference power pads RRP3 according to an embodiment may be individually (or respectively) connected to a corresponding second reference power pad RPP2 among the plurality of second reference power pads RPP2 disposed in the second pad part 210 through the link line portion 250. For example, each of the plurality of third reference power pads RPP3 may be supplied with a reference power from the driving IC 530 of the driving circuit unit 500. The reference power according to an embodiment may be supplied to each of the plurality of second reference power pads RPP2 disposed in the second pad part 210 through a corresponding third reference power pad RPP3 among the plurality of third reference power pads RPP3 and the link line portion 250.

Each of the plurality of third pixel driving power pads PPP3, the plurality of third data pads DP3, and the plurality of third reference power pads RPP3 in the first region of the third pad part 230 may be disposed in parallel in the same order as the arrangement order of the plurality of second pixel driving power pads PPP2, the plurality of second data pads DP2, and the plurality of second reference power pads RPP2 disposed in the second pad part 210.

The link line portion 250 may be disposed between the second pad part 210 and the third pad part 230. The link line portion 250 may include a plurality of link lines which individually (or respectively) connect the second pads of the second pad part 210 to the third pads of the third pad part 230.

The plurality of link lines according to an embodiment may be divided (or classified) into a plurality of data link lines 251, a plurality of gate link lines 253, a plurality of pixel driving power link lines 255, and a pixel common power link line 257. Therefore, the link line portion 250 may include a plurality of data link lines 251, a plurality of gate link lines 253, a plurality of pixel driving power link lines 255, and a pixel common power link line 257.

According to another embodiment, the link line portion 250 may include a data link portion, a gate link portion, a pixel driving power link portion, and a pixel common power link portion.

The data link portion (or a first link portion) may electrically connect the second data pad part of the second pad part 210 to the third data pad part of the third pad part 230.

The data link portion according to an embodiment may include a plurality of data link lines 251. Each of the plurality of data link lines (or first link lines) 251 may individually (or respectively) connect a corresponding second data pad of the plurality of second data pads DP2, disposed in the second pad part 210, to a corresponding third data pad of the plurality of third data pads DP3 disposed in the third pad part 230. Accordingly, a data signal supplied to each of the plurality of third data pads DP3 may be supplied to a corresponding second data pad DP2 through a corresponding data link line 251 and may be supplied to corresponding data lines DLo and DLe through a corresponding data routing line 410 and a corresponding first data pad DP1.

The gate link portion (or a second link portion) may electrically connect the second gate pad part of the second pad part 210 to the third gate pad part of the third pad part 230.

The gate link portion according to an embodiment may include a plurality of gate link lines 253. Each of the plurality of gate link lines (or second link lines) 253 may individually (or respectively) connect a corresponding second gate pad of the plurality of second gate pads GP2, disposed in the second pad part 210, to a corresponding third gate pad of the plurality of third gate pads GP3 disposed in the third pad part 230. Accordingly, a gate control signal supplied to each of the plurality of third gate pads GP3 may be supplied to a corresponding second gate pad GP2 through a corresponding gate link line 253 and may be supplied to a corresponding gate link line included in the gate control line group GCL through a corresponding gate routing line 430 and a corresponding first gate pad GP1.

The plurality of gate link lines 253 according to an embodiment may be divided (classified) into a start signal link line 253$a$, a plurality of shift clock link lines 253$b$, at least one gate driving power link line 253$c$, and at least one gate common power link line 253$d$. Accordingly, the gate link portion may include the start signal link line 253$a$, the plurality of shift clock link lines 253$b$, the at least one gate driving power link line 253$c$, and the at least one gate common power link line 253$d$.

The start signal link line 253$a$ may electrically connect the second start signal pad, disposed in the second pad part 210, to the third start signal pad disposed in the third pad part 230. Accordingly, a start signal supplied to the third start signal pad may be supplied to the second start signal pad through the start signal link line and may be supplied to a corresponding start signal line included in the gate control line group GCL through the start signal routing line and the first start signal pad.

Each of the plurality of shift clock link lines 253$b$ may electrically connect a corresponding second shift clock pad of the plurality of second shift clock pads, disposed in the second pad part 210, to a corresponding third shift clock pad of the plurality of third shift clock pads disposed in the third pad part 230. Accordingly, a gate shift clock supplied to each of the plurality of third shift clock pads may be supplied to a corresponding second shift clock pad through a corresponding shift clock link line 253$b$ and may be supplied to a corresponding shift clock line included in the gate control line group GCL through the shift clock routing line and the first shift clock pad.

The at least one gate driving power link line 253$c$ may electrically connect the at least one second gate driving power pad, disposed in the second pad part 210, to the at least one third gate driving power pad disposed in the third pad part 230. Accordingly, a gate driving power supplied to the third gate driving power pad may be supplied to the second gate driving power pad through the gate driving power link line 253$c$ and may be supplied to the gate driving power line included in the gate control line group GCL through the gate driving power routing line and the first gate driving power pad.

The at least one gate common power link line 253$d$ may electrically connect the at least one second gate common power pad, disposed in the second pad part 210, to the at least one third gate common power pad disposed in the third pad part 230. Accordingly, a gate common power supplied to the third gate common power pad may be supplied to the second gate common power pad through the gate common power link line 253$d$ and may be supplied to the gate common power line included in the gate control line group GCL through the gate common power routing line and the first gate common power pad.

The pixel driving power link portion (or a third link portion) may electrically connect the second pixel driving power pad part of the second pad part 210 to the third pixel driving power pad part of the third pad part 230.

The pixel driving power link portion according to an embodiment may include a plurality of pixel driving power link lines 255. Each of the plurality of pixel driving power link lines (or third link lines) 255 may individually (or respectively) connect the plurality of second pixel driving power pads PPP2, disposed in the second pad part 210, to the plurality of third pixel driving power pads PPP3 disposed in the third pad part 230. Accordingly, a pixel driving power supplied to each of the plurality of third pixel driving power pads PPP3 may be supplied to a corresponding second pixel driving power pad PPP2 through a corresponding pixel driving power link line 255 and may be supplied to a corresponding pixel driving power line PL through the pixel driving power routing line 450 and the first pixel driving power pad PPP1.

The plurality of data link lines 251, the plurality of gate link lines 253, and the plurality of pixel driving power link lines 255 may each include a first line portion connected to the second pad part 210, a second line portion connected to the third pad part 230, and a third line portion connected between the first line portion and the second line portion. Each of the first line portion and the second line portion may have a rectilinear shape, and the third line portion may have a non-rectilinear shape. For example, the third line portion may have a diagonal shape corresponding to a shortest path between the first line portion and the second line portion.

The pixel common power link portion (or a fourth link portion) may electrically connect the second pixel common power pad part of the second pad part 210 to the third pixel common power pad part of the third pad part 230.

The pixel common power link portion according to an embodiment may include a pixel common power link line 257. Each of the plurality of pixel common power link lines (or fourth link lines) 257 may connect the plurality of second pixel common power pads CPP2, disposed in the second pad part 210, to the plurality of third pixel common power pads CPP3 disposed in the third pad part 230 in common. Accordingly, a pixel common power supplied to each of the at least one third pixel common power pads CPP3 may be supplied to the plurality of second pixel common power pads CPP2 through the pixel common power link line 257, supplied to each of the plurality of pixel common power lines CPL through a corresponding pixel common power routing line of the plurality of pixel common power routing lines 470 and a corresponding first pixel common power pad of the plurality of first pixel common power pads CPP1, and supplied to the common electrode CE through each of the plurality of common power contact portions CPCP.

The pixel common power link line 257 according to an embodiment may include a first common link line 257a, a second common link line 257b, and a plurality of third common link lines 257c.

The first common link line 257a may be commonly connected to the at least one third pixel common power pad CPP3 disposed in the third pad part 230. For example, the first common link line 257a may be disposed at one corner portion of the rear surface 200b of the second substrate 200.

The first common link line 257a may be disposed or formed on the rear surface 200b of the second substrate 200 between the second pad part 210 and the third pad part 230 to have a relatively wide size (or area) so that the voltage drop of the pixel common power applied thereto is minimized. A size of the first common link line 257a according to an embodiment may progressively increase in a direction from one side thereof to the other side thereof. For example, a size of the first common link line 257a according to an embodiment may progressively increase in a direction from the third pad part 230 to the outer surface OS of the second substrate 200.

In the first common link line 257a according to an embodiment, one side thereof adjacent to the third pad part 230 may be commonly connected to the at least one third pixel common power pad CPP3 disposed in the third pad part 230, and the other side thereof adjacent to the second pad part 210 may overlap the second common link line 257b. For example, the first common link line 257a may be disposed on the rear surface 200b of the second substrate 200 along with the data link line 251 or the gate link line 253.

The second common link line 257b may be disposed at the first edge portion of the rear surface 200b of the second substrate 200 to overlap the first edge portion of the first substrate 100 and to be adjacent to the second pad part 210. The second common link line 257b according to an embodiment may be disposed in parallel with the first direction X to face all pads disposed in the second pad part 210. For example, the second common link line 257b may have a bar shape having a relatively wide size (or area), for minimizing the voltage drop of the pixel common voltage applied to the pixel common power link line 257.

The second common link line 257b may overlap each of the plurality of pixel driving power link lines 255, the plurality of data link lines 251, and the plurality of gate link lines 253. For example, the data link line 251 may be disposed on the gate link line 253, and the second common link line 257b may be disposed on the pixel driving power link line 255. Also, the pixel driving power link line 255 may be disposed on the gate link line 253 along with the data link line 251.

One side of the second common link line 257b may be electrically connected to the other side of the first common link line 257a through a link contact hole 257h.

Each of the plurality of third common link lines 257c may be connected to the second common link line 257b in common and may be connected to a corresponding second pad among the plurality of second pads. Each of the plurality of third common link lines 257c according to an embodiment may extend (or protrude) in a direction from the other side of the second common link line 257b to the plurality of second pixel common power pads CPP2 disposed in the second pad part 210 and may be electrically connected to a corresponding second pixel common power pad of the plurality of second pixel common power pads CPP2. For example, each of the plurality of third common link lines 257c may be formed along with the second common link line 257b. Also, the plurality of third common link lines 257c and the second common link line 257b may be formed along with the pads of the second pad part 210.

The link line portion 250 according to an embodiment may further include a reference power link portion.

The reference power link portion (or a fifth link portion) may electrically connect the second reference power pad part of the second pad part 210 to the third reference power pad part of the third pad part 230.

The reference power link portion according to an embodiment may include a plurality of reference power link lines 259. Each of the plurality of reference power link lines (or fifth link lines) 259 may individually (or respectively) connect a corresponding second reference power pad of the plurality of second reference power pads RPP2, disposed in the second pad part 210, to a corresponding third reference power pad of the plurality of third reference power pads RPP3 disposed in the third pad part 230. Therefore, a reference voltage supplied to each of the plurality of third reference power pads RPP3 may be supplied to a corresponding second reference power pad RPP2 through a corresponding reference power link line 259 and may be supplied to a corresponding reference power line RL through the reference power routing line 490 and the first reference power pad RPP1.

The plurality of reference power link lines 259 may each include a first line portion connected to a corresponding second reference power pad RPP2, a second line portion connected to the third reference power pad RPP3, and a third line portion connected between the first line portion and the second line portion. Each of the first line portion and the second line portion may have a rectilinear shape, and the third line portion may have a non-rectilinear shape. For example, the third line portion may have a diagonal shape corresponding to a shortest path between the first line portion and the second line portion.

The link line portion 250 according to an embodiment may further include a gate control signal transfer portion 254.

The gate control signal transfer portion (or a sixth link portion) 254 may bypass the third pad part 230 and may electrically connect the third gate pad part to the gate link portion.

The gate control signal transfer portion 254 according to an embodiment may include a plurality of gate control signal transfer lines.

Each of the plurality of gate control signal transfer lines (or sixth link lines) may selectively connect a corresponding third gate pad of the plurality of third gate pads GP3, disposed in the third pad part 230, to a corresponding gate link line of the plurality of gate link lines. For example, the plurality of gate control signal transfer lines and the plurality of gate link lines 253 may be disposed on different layers on the rear surface 200b of the second substrate 200, and the other side of each of the plurality of gate link lines 253 may be electrically connected to a corresponding gate control signal transfer line through a link contact hole. Optionally, the other side of each of the plurality of gate link lines 253 may pass through a region between two adjacent third pads and may be selectively connected to a plurality of gate control signal transfer lines not to overlap the third pad disposed in the third pad part 230.

The plurality of gate control signal transfer lines according to an embodiment may be divided (classified) into a start signal transfer line 254a, a plurality of shift clock transfer lines 254b, at least one gate driving power transfer line 254c, and at least one gate common power transfer line 254d. Therefore, the gate control signal transfer portion 254 may include the start signal transfer line 254a, the plurality of shift clock transfer lines 254b, the at least one gate driving power transfer line 254c, and the at least one gate common power transfer line 254d.

The start signal transfer line 254a may electrically connect the third start signal pad to the start signal link line 253a. The start signal transfer line 254a according to an embodiment may include one line portion thereof electrically connected to the third start signal pad, the other line portion thereof electrically connected to the start signal link line 253a, and a middle line portion electrically connected between the one line portion thereof and the other line portion thereof to bypass the third pad part 230.

The one line portion of the start signal transfer line 254a may be disposed in parallel with the second direction Y and may be electrically connected to the third start signal pad.

The other line portion of the start signal transfer line 254a may be disposed to be adjacent to the third pad part 230 in parallel with the first direction X and may be electrically connected to the start signal link line 253a. For example, the other line portion of the start signal transfer line 254a may be electrically connected to the start signal link line 253a through a link contact hole. Therefore, a start signal supplied to the third start signal pad may be supplied to the start signal line included in the gate control line group GCL through the start signal transfer line 254a, the start signal link line 253a, the second start signal pad, the start signal routing line, and the first start signal pad.

The middle line portion of the start signal transfer line 254a may include a first middle line which extends from the one line portion in parallel with the first direction X and a second middle line which extends from the first middle line so as to be apart from one end (or a left end) of the third pad part 230 and is electrically connected to the other line portion. For example, the middle line portion may have a "ᴦ"-shape which bypasses the third pad part 230.

The start signal link line 253a according to an embodiment may pass through the third pad part 230 and may be electrically connected to the other line portion of the start signal transfer line 254a. For example, the start signal link line 253a may be disposed to pass through a region between two adjacent third pads so as not to overlap the third pad disposed in the third pad part 230. In this case, a start signal supplied to the start signal link line 253a may not vary (or change) based on a signal supplied to the third pad and may be maintained at an original voltage level.

Each of the plurality of shift clock transfer lines 254b may selectively connect a corresponding third shift clock pad of the plurality of shift clock pads to a corresponding shift clock link line of the plurality of shift clock link lines 253b. For example, when the gate control signal transfer portion 254 includes first to fourth shift clock transfer lines 254b and the line link portion 250 includes a plurality of first to fourth shift clock link lines 253b, each of the plurality of first shift clock link lines 253b may be connected to the first shift clock transfer line 254b in common, each of the plurality of second shift clock link lines 253b may be connected to the second shift clock transfer line 254b in common, each of the plurality of third shift clock link lines 253b may be connected to the third shift clock transfer line 254b in common, and each of the plurality of fourth shift clock link lines 253b may be connected to the fourth shift clock transfer line 254b in common.

Each of the plurality of shift clock transfer lines 254b may have a shape which surrounds the start signal transfer line 254a and may be disposed in parallel with the start signal transfer line 254a to bypass the third pad part 230. Each of the plurality of shift clock transfer lines 254b according to an embodiment may include one line portion thereof electrically connected to a corresponding third shift clock pad, the other line portion thereof electrically connected to a corresponding shift clock link line 253b, and a middle line portion electrically connected between one line portion thereof and the other line portion thereof to bypass the third pad part 230. For example, the other line portion of each of the plurality of shift clock link lines 254b may be electrically connected to a corresponding shift clock transfer line 253b through a link contact hole. Therefore, a gate shift clock supplied to each of the plurality of third shift clock pads may be supplied to the shift clock line included in the gate control line group GCL through a corresponding shift clock transfer line 254b, a corresponding shift clock link line 253b, a corresponding second shift clock pad, a corresponding gate shift clock routing line, and a corresponding first shift clock pad.

Each of the plurality of shift clock link lines 253b according to an embodiment may pass through the third pad part 230 and may be electrically connected to the other line portion of a corresponding shift clock transfer line 254b. For example, each of the plurality of shift clock link lines 253b may be disposed to pass through a region between two adjacent third pads so as not to overlap the third pad disposed in the third pad part 230. In this case, a gate shift clock supplied to each of the plurality of shift clock link lines 253b may not vary (or change) based on a signal supplied to the third pad and may be maintained at an original voltage level.

The at least one gate driving power transfer line 254c may electrically connect at least one gate driving power pad to at least one gate driving power link line 253c.

The at least one gate driving power transfer line 254c may have a shape which surrounds an outermost shift clock transfer line 254b and may be disposed in parallel with the shift clock transfer line 254b to bypass the third pad part 230. The at least one gate driving power transfer line 254c according to an embodiment may include one line portion thereof electrically connected to the third gate driving power pad, the other line portion thereof electrically connected to the gate driving power link line 253c, and a middle line portion electrically connected between one side portion thereof and the other side portion thereof to bypass the third pad part 230. For example, the other line portion of the at least one gate driving power transfer line 254c may be electrically connected to the gate driving power link line 253c through a link contact hole. Therefore, a gate driving power supplied to the at least one gate driving power pad may be supplied to the gate driving power line included in the gate control line group GCL through the gate driving power transfer line 254c, the gate driving power link line 253c, the second gate driving power pad, the gate driving power routing line, and the first gate driving power pad.

The at least one gate driving power link line 253c according to an embodiment may pass through the third pad part 230 and may be electrically connected to the other line portion of the gate driving power transfer line 254c. For example, the at least one gate driving power link line 253c may be disposed to pass through a region between two adjacent third pads so as not to overlap the third pad disposed in the third pad part 230. In this case, a gate driving power supplied to the gate driving power link line 253c may not vary (or change) based on a signal supplied to the third pad and may be maintained at an original voltage level.

The at least one gate common power transfer line 254d may electrically connect the at least one gate common power pad to the at least one gate common power link line 253d.

The at least one gate common power transfer line 254d may have a shape which surrounds the gate driving power transfer line 254c and may be disposed in parallel with the gate driving power transfer line 254c to bypass the third pad part 230. The at least one gate common power transfer line 254d according to an embodiment may include one line portion thereof electrically connected to the third gate common power pad, the other line portion thereof electrically connected to the gate common power link line 253d, and a middle line portion electrically connected between one line portion thereof and the other line portion thereof to bypass the third pad part 230. For example, the other line portion of the at least one gate common power transfer line 254d may be electrically connected to the gate common power link line 253d through a link contact hole. Therefore, a gate common power supplied to the at least one gate common power pad may be supplied to the gate common power line included in the gate control line group GCL through the gate common power transfer line 254d, the gate common power link line 253d, the second gate common power pad, the gate common power routing line, and the first gate common power pad.

The at least one gate common power link line 253d according to an embodiment may pass through the third pad part 230 and may be electrically connected to the other line portion of the gate common power transfer line 254d. For example, the at least one gate common power link line 253d may be disposed to pass through a region between two adjacent third pads so as not to overlap the third pad disposed in the third pad part 230. In this case, a gate common power supplied to the gate common power link line 253d may not vary (or change) based on a signal supplied to the third pad and may be maintained at an original voltage level.

Figure 10:
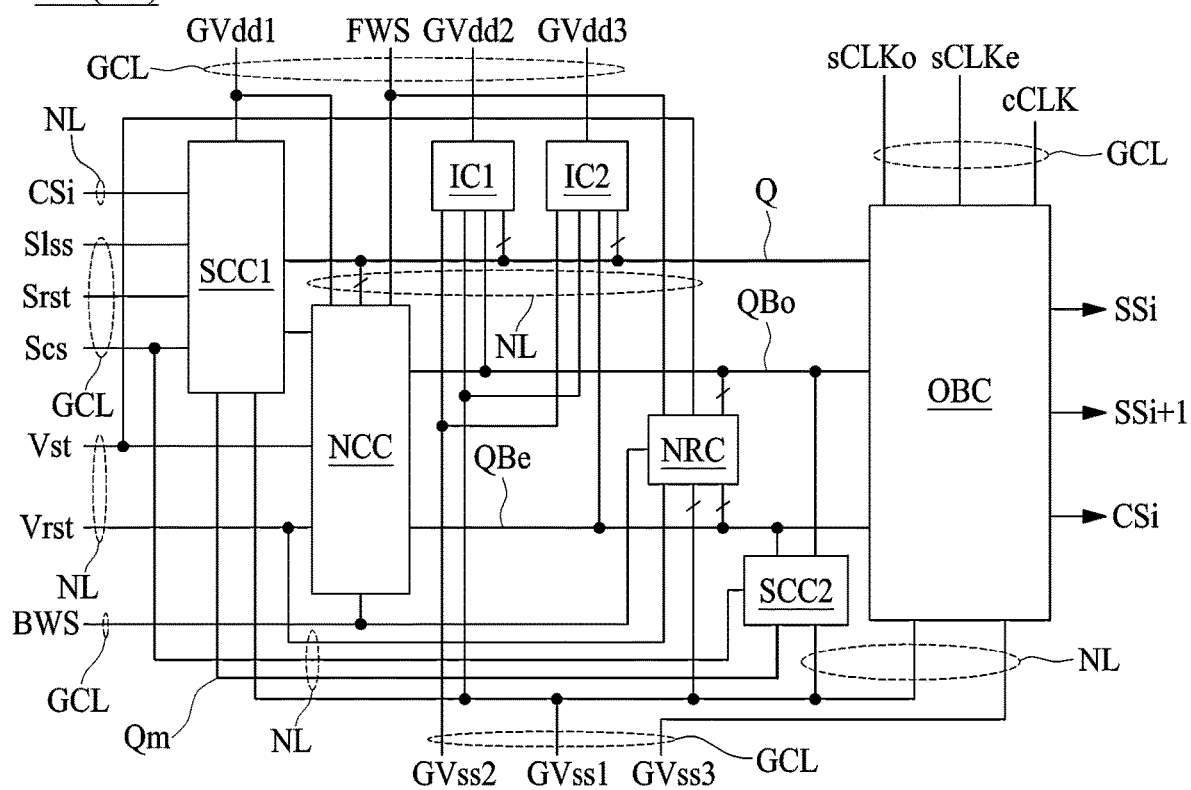
FIG. 10 is a circuit diagram illustrating an stage circuit unit illustrated in FIG. 6.

FIG. 10 is a circuit diagram illustrating an $i^{th}$ stage circuit unit illustrated in FIG. 6.

Referring to FIGS. 5 to 7 and 10, an $i^{th}$ stage circuit unit 150i according to the present disclosure may output two scan signals SSi and SSi+1 and a carry signal CSi in response to a gate control signal supplied from a gate control line group GCL disposed on the first substrate 100.

The gate control signal according to an embodiment may include a start signal Vst, a plurality of shift clocks including a plurality of scan clocks sCLK and a plurality of carry clocks cCLK, first to third gate driving powers GVdd1, GVdd2, and GVdd3, and first and second gate common powers GVss1 and GVss2. In this case, the gate control line group GCL may include a start signal line, a plurality of scan clock lines, a plurality of carry clock lines, first to third gate driving power lines, and first and second gate common power lines.

The gate control signal according to an embodiment may include first to $j^{th}$ carry clocks and first to $j^{th}$ scan clocks. For example, j may be 4, but is not limited thereto and may be an even number of 6, 8, or 10 or more.

When the gate control signal includes the first to fourth carry clocks, the first carry clock may be applied to a $4k-3^{th}$ (where k is a natural number) stage circuit unit, the second carry clock may be applied to a 4k-2th stage circuit unit, the third carry clock may be applied to a $4k-1^{th}$ stage circuit unit, and the fourth carry clock may be applied to a $4k^{th}$ stage circuit unit. When the gate control signal includes the first to fourth scan clocks, the first and second scan clocks may be applied to an odd-numbered stage circuit unit, and the third and fourth scan clocks may be applied to an even-numbered stage circuit unit.

Moreover, the gate control signal according to an embodiment may further include a forward driving signal FWS and a backward driving signal BWS. In this case, the gate control line group GCL may further include a forward driving signal line and a backward driving signal line.

The gate control signal according to an embodiment may further include an external sensing line selection signal Slss, an external sensing reset signal Srst, and an external sensing control signal Scs for an external sensing mode. In this case, the gat control line group GCL may further include an external sensing selection signal line, an external sensing reset signal line, and an external sensing control signal line.

The $i^{th}$ stage circuit unit 150i according to the present disclosure may include a branch network 153, a node control circuit NCC, a first inverter circuit IC1, a second inverter circuit IC2, a node reset circuit NRC, and an output buffer circuit OBC.

The branch network 153 may be implemented to form a circuit connection between the node control circuit NCC, the first inverter circuit IC1, the second inverter circuit IC2, the node reset circuit NRC, and the output buffer circuit OBC and to be selectively connected to the lines of the gate control line group GCL.

The branch network 153 may be selectively connected to the lines of the gate control line group GCL. The branch network 153 according to an embodiment may include first to third control nodes Q, QBo, and QBe and a network line NL.

Each of the first to third control nodes Q, QBo, and QBe may be disposed in an upper edge region (or a lower edge region) of each of pixel areas arranged in an $i^{th}$ horizontal line of the first substrate 100. Each of the first to third control nodes Q, QBo, and QBe may be disposed in parallel with a first direction X or a gate line. For example, each of the first to third control nodes Q, QBo, and QBe may be disposed adjacent to the gate line.

The network line NL may be selectively connected to the lines of the gate control line group GCL and may be selectively connected to the first to third control nodes Q, QBo, and QBe. Also, the network line NL may be selectively connected between circuits configuring the stage circuit unit 150i.

The node control circuit NCC may be implemented to control a voltage of each of the first to third control nodes Q, QBo, and QBe.

The node control circuit NCC according to an embodiment may be connected to each of the first to third control nodes Q, QBo, and QBe through the network line NL and may be implemented to control the voltage of each of the first to third control nodes Q, QBo, and QBe in response to the start signal Vst, the reset signal Vrst, and the first gate driving power GVdd1 supplied through the network line NL. For example, the start signal Vst may be an $i-2^{th}$ carry signal CSi-2 output from the $i-2^{th}$ stage circuit unit 150i-2. The reset signal Vrst may be an $i+2^{th}$ carry signal CSi+2 output from an i+2th stage circuit unit 150i+2.

According to another embodiment, the node control circuit NCC may be connected to each of the first to third control nodes Q, QBo, and QBe through the network line NL and may control the voltage of each of the first to third control nodes Q, QBo, and QBe in response to the start signal Vst, the reset signal Vrst, the forward driving signal FWS, the backward driving signal BWS, and the first gate driving power GVdd1 supplied through the network line NL. For example, when the forward driving signal FWS has a high voltage level (or a high potential voltage level), the backward driving signal BWS may have a low voltage level (or a low potential voltage level), and when the forward driving signal FWS has a low voltage level (or a low potential voltage level), the backward driving signal BWS may have a high voltage level (or a high potential voltage level). For example, when the forward driving signal FWS has a high voltage level, the gate driving circuit 150 may supply a scan signal up to a last gate line from a first gate line on the basis of forward scan driving, and when the backward driving signal BWS has a high voltage level, the gate driving circuit 150 may supply the scan signal up to the first gate line from the last gate line on the basis of backward scan driving. Herein, a high voltage level may be referred to as a first voltage level, a high potential voltage level, a gate turn-on voltage level, or a transistor on voltage level, and a low voltage level may be referred to as a second voltage level, a low potential voltage level, a gate turn-off voltage level, or a transistor off voltage level.

The first inverter circuit IC1 may control or discharge the voltage of the second control node QBo on the basis of the voltage of the first control node Q. The first inverter circuit IC1 according to an embodiment may be connected to the second gate driving power GVdd2, the first control node Q, the second control node QBo, the first gate common power GVss1, and the second gate common power GVss2 through the network line NL. In response to the second gate driving power GVdd2 and the voltage of the first control node Q, the first inverter circuit IC1 may supply the first gate common power GVss1 to the second control node QBo to discharge the voltage of the second control node QBo.

The second inverter circuit IC2 may control or discharge the voltage of the third control node QBe on the basis of the voltage of the first control node Q. The second inverter circuit IC2 according to an embodiment may be connected to the third gate driving power GVdd3, the first control node Q, the third control node QBe, the first gate common power GVss1, and the second gate common power GVss2 through the network line NL. In response to the third gate driving power GVdd3 and the voltage of the first control node Q, the second inverter circuit IC2 may supply the first gate common power GVss1 to the third control node QBe to discharge the voltage of the third control node QBe.

The second gate driving power GVdd2 and the third gate driving power GVdd3 may have voltage levels which are inverted (or opposite to each other) therebetween. For example, when the second gate driving power GVdd2 has a high voltage level, the third gate driving power GVdd3 may have a low voltage level, and when the second gate driving power GVdd2 has a low voltage level, the third gate driving power GVdd3 may have a high voltage level.

The second gate common power GVss2 and the first gate common power GVss1 may have the same voltage level or different voltage levels.

The node reset circuit NRC may maintain a voltage level of each of the second control node QBo and the third control node QBe while the voltage of the first control node Q has a high voltage level.

The node reset circuit NRC according to an embodiment may simultaneously reset the voltage of the second control node QBo and the voltage of the third control node QBe in response to the start signal Vst and the reset signal Vrst supplied through the network line NL. For example, the node reset circuit NRC may supply the first gate common power GVss1 to the second control node QBo and the third control node QBe in response to the start signal Vst and the reset signal Vrst, and thus, may maintain the second control node QBo and the third control node QBe at a voltage level of the first gate common power GVss1.

According to another embodiment, the node reset circuit NRC may simultaneously reset the voltage of the second control node QBo and the voltage of the third control node QBe in response to the start signal Vst, the reset signal Vrst, the forward driving signal FWS, and the backward driving signal BWS supplied through the network line NL. For example, the node reset circuit NRC may supply the first gate common power GVss1 to the second control node QBo and the third control node QBe in response to the start signal Vst, the reset signal Vrst, the forward driving signal FWS, and the backward driving signal BWS, and thus, may maintain each of the second control node QBo and the third control node QBe at a voltage level of the first gate common power GVss1.

The output buffer circuit OBC may be implemented to sequentially output two scan signals having a gate-on voltage level or to sequentially output two scan signals having a gate-off voltage level in response to the voltage of each of the first to third control nodes Q, QBo, and QBe on the basis of the carry clock cCLK, the scan clock sCLK, the first gate common power GVss1, and the third gate common power GVss3 supplied through the network line NL.

When the voltage of the first control node Q has a high voltage level and the voltage of each of the second and third control nodes QBo and QBe has a low voltage level, the output buffer circuit OBC according to an embodiment may output each of an $i^{th}$ carry signal CSi corresponding to the carry clock cCLK, an $i^{th}$ scan signal SSi corresponding to an odd-numbered scan clock sCLKo, and an $i+1^{th}$ scan signal SSi+1 corresponding to an even-numbered scan clock sCLKe. For example, the $i^{th}$ carry signal CSi may be supplied as the start signal Vst to the $i+2^{th}$ stage circuit unit, the $i^{th}$ scan signal SSi may be supplied to an odd-numbered gate line GLo (or an $i^{th}$ gate line GLi), and the i+1th scan signal SSi+1 may be supplied to an even-numbered gate line GLe (or an $i^{th}$ gate line GLi+1).

When the voltage of each of the first and third control nodes Q and QBe has a low voltage level and the voltage of the second control node QBo has a high voltage level, the output buffer circuit OBC according to an embodiment may output each of the $i^{th}$ scan signal SSi and the $i+1^{th}$ scan signal SSi+1 each having a gate-off voltage level corresponding to a voltage level of the third gate common power GVss3 and may output the $i^{th}$ carry signal CSi having a gate-off voltage level corresponding to a voltage level of the first gate common power GVss1.

When the voltage of each of the first and second control nodes Q and QBo has a low voltage level and the voltage of the third control node QBe has a high voltage level, the output buffer circuit OBC according to an embodiment may output each of the $i^{th}$ scan signal SSi and the $i+1^{th}$ scan signal SSi+1 each having a gate-off voltage level corresponding to a voltage level of the third gate common power GVss3 and may output the $i^{th}$ carry signal CSi having a gate-off voltage level corresponding to a voltage level of the first gate common power GVss1.

The output buffer circuit OBC according to an embodiment may be disposed in a center region of the $i^{th}$ horizontal line parallel to the first direction X. For example, when the output buffer circuit OBC is disposed adjacent to one end (or the other end) of a horizontal line, a voltage level of the scan signal may decrease in a direction from one end of a gate line to the other end thereof due to a line resistance of a horizontal line, and thus, in order to prevent such a problem, the output buffer circuit OBC should be disposed in the center region of the $i^{th}$ horizontal line parallel to the first direction X, but is not limited thereto and may be disposed at one side or the other side of the $i^{th}$ horizontal line when a total length of the gate line is relatively short.

The first to third gate common powers GVss1, GVss2, and GVss3 may have the same voltage level or different voltage levels.

The $i^{th}$ stage circuit unit 150$i$ according to the present disclosure may further include a fourth control node Qm, a first sensing control circuit SCC1, and a second sensing control circuit SCC2.

The fourth control node Qm may be implemented to be electrically connected between the first sensing control circuit SCC1 and the second sensing control circuit SCC2. The fourth control node Qm may be included in the branch network 153 and may be electrically connected between the first sensing control circuit SCC1 and the second sensing control circuit SCC2 through the network line NL.

The first sensing control circuit SCC1 may be implemented to control a voltage of each of the first control node Q and the fourth control node Qm in response to the $i^{th}$ carry signal CSi, the external sensing line selection signal Slss, the external sensing control signal Scs, the external sensing reset signal Srst, and the first gate driving power GVdd1 supplied through the branch network 153. For example, the first sensing control circuit SCC1 may charge the first gate driving power GVdd1 into the fourth control node Qm in response to the $i^{th}$ carry signal CSi having a high voltage level and the external sensing line selection signal Slss having a high voltage level, and then, may control the voltage of the first control node Q in response to a voltage charged into the fourth control node Qm, the external sensing control signal Scs having a high voltage level supplied during a fore period of a vertical blank period, and the first gate driving power GVdd1. Therefore, the output buffer circuit OBC may output each of the $i^{th}$ carry signal CSi corresponding to the carry clock cCLK, the $i^{th}$ scan signal SSi corresponding to the odd-numbered scan clock sCLKo, and the i+1$^{th}$ scan signal SSi+1 corresponding to the even-numbered scan clock sCLKe during the vertical blank period on the basis of the voltage of the first control node Q.

Moreover, the first sensing control circuit SCC1 may discharge the voltage of the first control node Q in response to the external sensing reset signal Srst supplied through the branch network 153. For example, the first sensing control circuit SCC1 may supply the first gate common power GVss1 to the first control node Q to reset or initialize the voltage of the first control node Q in response to the external sensing reset signal Srst having a high voltage level supplied during a latter period of the vertical blank period.

The second sensing control circuit SCC2 may be implemented to discharge the voltage of each of the second control node QBo and the third control node QBe in response to the voltage of the fourth control node Qm and the external sensing control signal Scs supplied through the branch network 153. For example, the second sensing control circuit SCC2 may supply the first gate common voltage GVss1 to each of the second control node QBo and the third control node QBe to simultaneously discharge the second control node QBo and the third control node QBe, in response to the voltage of the fourth control node Qm having a high voltage level and the external sensing control signal Scs having a high voltage level.

The $i^{th}$ stage circuit unit 150$i$ may be configured like an $n^{th}$ stage described in Korean Patent Publication No. 10-2019-0021881, or may be configured like a $k^{th}$ GIP described in Korean Patent Publication No. 10-2019-0037860, all of these publications being incorporated by reference into the present application. Therefore, a description of the $i^{th}$ stage circuit unit 150$i$ illustrated in FIG. 10 is omitted. A plurality of thin film transistors (TFTs) configuring the $n^{th}$ stage or the $k^{th}$ GIP may be formed along with a driving TFT Tdr and may implement the plurality of branch circuits 151$l$ to 151$n$ disposed in each horizontal line of the first substrate 100, and each of the first to third control nodes configuring the branch network 153 of each of the stage circuit units 150$l$ to 150$m$ may be formed along with the gate line GL. Accordingly, each of the plurality of branch circuits 151$l$ to 151$n$ may include at least one TFT (or branch TFT) and may be disposed between one or more pixels P (or pixel areas PA) within one horizontal line according to in the first direction X.

Figure 11:
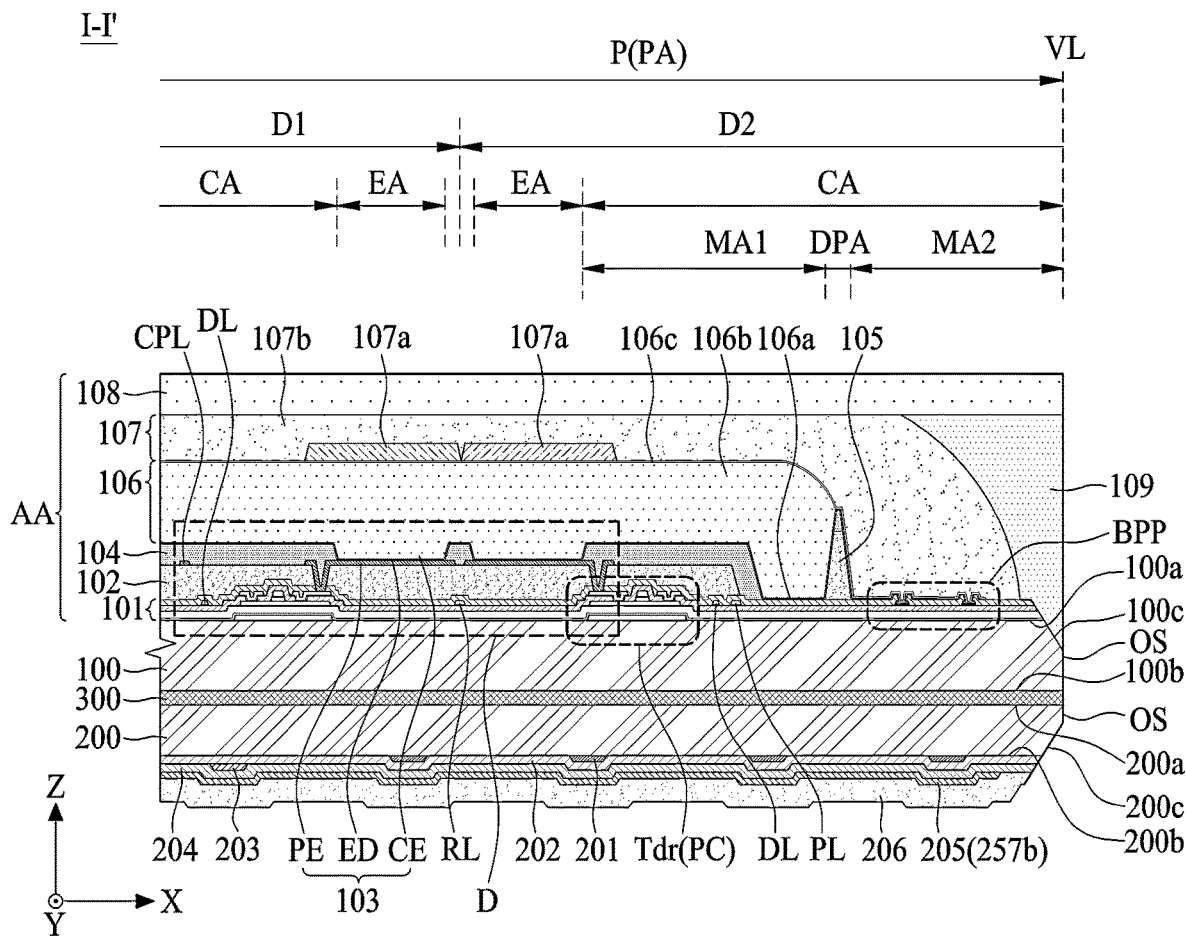
FIG. 11 is a cross-sectional view taken along line I-I' illustrated in FIG. 3.
Figure 12:
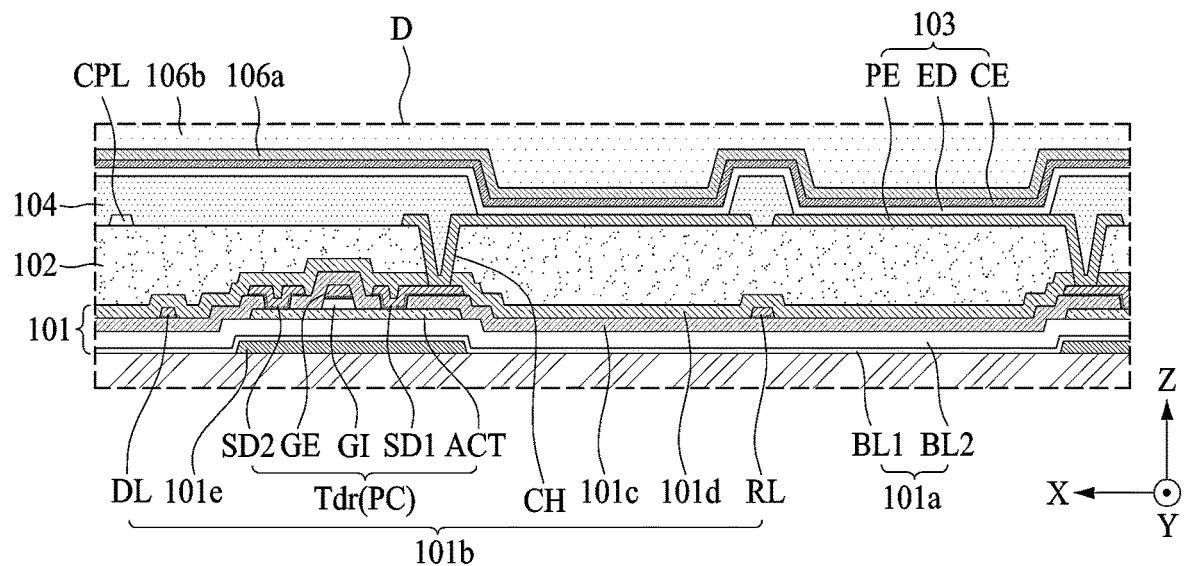
FIG. 12 is an enlarged view of a region 'D' illustrated in FIG. 11.

FIG. 11 is a cross-sectional view taken along line I-I' illustrated in FIG. 3, and FIG. 12 is an enlarged view of a region 'D' illustrated in FIG. 11. FIGS. 11 and 12 are diagrams for describing a cross-sectional structure of each of first and second substrates of a display apparatus according to the present disclosure. In describing FIGS. 11 and 12, elements which are the same as or correspond to the elements of FIG. 3 are referred to by like reference numerals, and their repetitive descriptions are omitted or will be briefly given below.

Referring to FIGS. 3, 5, 7, 11, and 12, a display apparatus 10 according to the present disclosure may include a first substrate 100 and a second substrate 200, which are coupled (or bonded) to each other by using a coupling member 300.

The first substrate 100 according to an embodiment may include a circuit layer 101, a planarization layer 102, a light emitting device layer 103, a bank 104, a dam pattern 105, a barrier pattern portion BPP, and an encapsulation layer 106.

The circuit layer 101 may be disposed on a first surface 100$a$ of the first substrate 100. The circuit layer 101 may be referred to as a pixel array layer or a TFT array layer.

The circuit layer 101 according to an embodiment may include a buffer layer 101$a$ and a circuit array layer 101$b$.

The buffer layer 101$a$ may prevent materials included in the first substrate 100, from being diffused to the circuit array layer 101$b$ in a high temperature process of a process of manufacturing a TFT. Also, the buffer layer 101$a$ may prevent external water or moisture from penetrating into the light emitting device layer 103. The buffer layer 103$a$ according to an embodiment may include silicon oxide (SiOx), silicon nitride (SiNx), silicon oxynitride (SiON), or a multilayer thereof, but is not limited thereto. For example, the buffer layer 101$a$ may include a first buffer layer BL1 which includes SiNx and is disposed on the first substrate 100 and a second buffer layer BL2 which includes SiOx and is disposed on the first buffer layer BL1.

The pixel array layer 101$b$ may include a plurality of pixel driving lines GL, DL, PL, RL, CPL, PSL, RDL, and LCP disposed on the buffer layer 101$a$ and a pixel circuit PC which includes a driving TFT Tdr disposed in each of a plurality of pixel areas PA on the buffer layer 101$a$.

The driving TFT Tdr disposed in each pixel area PA may include an active layer ACT, a gate insulation layer GI, a gate electrode GE, an interlayer insulation layer 101c, a first source/drain electrode SD1, a second source/drain electrode SD2, and a passivation layer 101d.

The active layer ACT may be disposed on the buffer layer 101a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may be used as a bridge line of a jumping structure which directly connects lines in the display area AA or electrically connects lines disposed on different layers.

The gate insulation layer GI may be disposed in the channel area of the active layer ACT. The gate insulation layer GI may insulate the active layer ACT from the gate electrode GE. For example, the gate insulation layer GI may include SiOx, SiNx, SiON, or a multilayer thereof, but is not limited thereto.

The gate electrode GE may be disposed on the gate insulation layer GI. The gate electrode GE may overlap the channel area of the active layer ACT with the gate insulation layer GI therebetween.

The gate electrode GE may have a single-layer structure or a multi-layer structure including at least one of molybdenum (Mo), titanium (Ti), a Mo—Ti alloy (MoTi), and copper (Cu). The gate electrode GE according to an embodiment may include a first gate metal layer disposed on the gate insulation layer GI and a second gate metal layer disposed on the first gate metal layer. For example, the first gate metal layer may include Ti or MoTi. The second gate metal layer may include Cu. In this case, the gate electrode GE may have a two-layer structure of Cu/MoTi or Cu/Ti.

Each of gate lines GL, power sharing lines PSL, line connection patterns LCP, and a reference branch line RDL among the pixel driving lines GL, DL, PL, RL, CPL, PSL, RDL, and LCP may include the same material as that of the gate electrode GE, but is not limited thereto.

The interlayer insulation layer 101c may be disposed on the first substrate 100 to cover the gate electrode GE and the active layer ACT. The interlayer insulation layer 101c may electrically insulate (or isolate) the gate electrode GE from the source/drain electrodes SD1 and SD2. For example, the interlayer insulation layer 101c may include SiOx, SiNx, SiON, or a multilayer thereof, but is not limited thereto.

The first source/drain electrode SD1 may be disposed on the interlayer insulation layer 101c overlapping the first source/drain area of the active layer ACT and may be electrically connected to the first source/drain area of the active layer ACT through a first source/drain contact hole disposed in the interlayer insulation layer 101c. For example, the first source/drain electrode SD1 may be a source electrode of the driving TFT Tdr, and the first source/drain area of the active layer ACT may be a source area.

The second source/drain electrode SD2 may be disposed on the interlayer insulation layer 101c overlapping the second source/drain area of the active layer ACT and may be electrically connected to the second source/drain area of the active layer ACT through a second source/drain contact hole disposed in the interlayer insulation layer 101c. For example, the second source/drain electrode SD2 may be a drain electrode of the driving TFT Tdr, and the second source/drain area of the active layer ACT may be a drain area.

The source/drain electrode SD1/SD2 according to an embodiment may have a single-layer structure or a multi-layer structure including the same material as a material of the gate electrode GE. For example, the source/drain electrode SD1/SD2 may include a first source/drain metal layer disposed on the interlayer insulation layer 101c and a second source/drain metal layer disposed on the first source/drain metal layer. For example, the first source/drain metal layer may include titanium (Ti) or a molybdenum-titanium alloy (MoTi). The second source/drain metal layer may include copper (Cu). In this case, the source/drain electrode SD1/SD2 may be formed in a two-layer structure of Cu/MoTi or Cu/Ti.

Each of data lines DL, pixel driving power lines PL, and reference power lines RL among the pixel driving lines GL, DL, PL, RL, CPL, PSL, RDL, and LCP may include the same material as that of the source/drain electrode SD1 and SD2, but is not limited thereto. Also, each line of a gate control line group GCL may include the same material as that of the source/drain electrode SD1 and SD2, but is not limited thereto.

A passivation layer 101d may be disposed on a first surface 100a of the first substrate 100 to cover the pixel circuit PC including the driving TFT Tdr. The passivation layer 101d according to an embodiment may include SiOx, SiNx, SiON, or a multilayer thereof, but is not limited thereto.

Each of first and second switching TFTs Tsw1 and Tsw2 configuring the pixel circuit PC may be formed along with the driving TFT Tdr, and thus, their detailed descriptions are omitted.

The circuit layer 101 according to an embodiment may further include a light blocking layer 101e which is disposed under the active layer ACT of each of the TFTs Tdr, Tsw1, and Tsw2 configuring the pixel circuit PC.

The light blocking layer (or a light blocking pattern) 101e may be disposed in an island shape between the first substrate 100 and the active layer ACT. The light blocking layer 101e may be covered by the buffer layer 101a. The light blocking layer 101e may block light which is incident on the active layer ACT through the first substrate 100, thereby preventing or minimizing a threshold voltage variation of each TFT caused by external light. Optionally, the light blocking layer 101e may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

Moreover, the light blocking layer 101e may be used as at least one of the power sharing lines PSL, the line connection patterns LCP, and the reference branch line RDL among the pixel driving lines GL, DL, PL, RL, CPL, PSL, RDL, and LCP.

The gate driving circuit 150 illustrated in FIGS. 3, 5, and 6 may be formed along with the driving TFT Tdr of the pixel circuit PC. For example, a plurality of TFTs configuring each of the stage circuit units 150l to 150m of the gate driving circuit 150 may be formed along with the driving TFT Tdr, and thus, the plurality of branch circuits 151l to 151n disposed in each horizontal line on the first substrate 100 may be implemented. The first to fourth control nodes Q, QBo, QBe, and Qm configuring the branch network 153 of each of the stage circuit units 150l to 150m may be formed along with the gate line GL. Also, a network line configuring the branch network 153 of each of the stage circuit units 150l to 150m may be formed along with at least one of the light blocking layer 101e, the gate line GL, and the data line DL on the basis of a position of a connection portion of each of the branch circuits 151*l* to 151*n* to be connected, but is not limited thereto.

The planarization layer 102 may be disposed on the first surface 100*a* of the first substrate 100 and may provide a flat surface on the circuit layer 101. The planarization layer 102 may cover the circuit layer 101 including the driving TFT Tdr disposed in each of the plurality of pixel areas PA. The planarization layer 102 according to an embodiment may include acryl resin, epoxy resin, phenolic resin, polyamides resin, or polyimides resin, but is not limited thereto.

The planarization layer 102 according to an embodiment may be formed to cover the circuit layer 101 except an edge portion of the first surface 100*a* of the first substrate 100. Therefore, the passivation layer 101*d* of the circuit layer 101 disposed at the edge portion of the first surface 100*a* of the first substrate 100 may be exposed without being covered by the planarization layer 102.

The light emitting device layer 103 may be disposed on the planarization layer 102 and may emit light toward the first surface 100*a* of the first substrate 100 on the basis of a top emission type.

The light emitting device layer 103 according to an embodiment may include a pixel electrode PE, a light emitting device ED, and a common electrode CE.

The pixel electrode PE may be referred to as an anode electrode, a reflective electrode, a lower electrode, or a first electrode of the light emitting device ED.

The pixel electrode PE may be disposed on the planarization layer 102 overlapping an emission area EA of each of the plurality of pixel areas PA. The pixel electrode PE may be patterned and disposed in an island shape in each pixel area PA and may be electrically connected to the first source/drain electrode SD1 of the driving TFT Tdr of a corresponding pixel circuit PC. One side of the pixel electrode PE may extend from the emission area EA of the pixel area PA to the first source/drain electrode SD1 of the driving TFT Tdr disposed in a circuit area CA and may be electrically connected to the first source/drain electrode SD1 of the driving TFT Tdr through a contact hole CH provided in the planarization layer 102.

The pixel electrode PE according to an embodiment may include a metal material which is low in work function and is good in reflective efficiency.

For example, the pixel electrode PE may have a three-layer structure including first to third pixel electrode layer. The first pixel electrode layer may act as an adhesive layer corresponding to the planarization layer 102 and may act as a secondary electrode of the light emitting device ED, and moreover, may include indium tin oxide (ITO) or indium zinc oxide (IZO). The second pixel electrode layer may act as a reflector and may perform a function of decreasing a resistance of the pixel electrode PE, and moreover, may include one material of aluminum (Al), silver (Ag), Mo, Ti, and MoTi. The third pixel electrode layer may act as an electrode of the light emitting device ED and may include ITO or IZO. For example, the pixel electrode PE according to an embodiment may be formed in a three-layer structure of IZO/MoTi/ITO or ITO/MoTi/ITO.

As another example, the pixel electrode PE may have a four-layer structure including first to fourth pixel electrode layer. The first pixel electrode layer may act as the adhesive layer corresponding to the planarization layer 102 and may act as the secondary electrode of the light emitting device ED, and moreover, may include one material of ITO, Mo, and MoTi. The second pixel electrode layer may perform a function of decreasing a resistance of the pixel electrode PE and may include Cu. The third pixel electrode layer may act as a reflector and may include one material of Al, Ag, Mo, Ti, and MoTi. The fourth pixel electrode layer may act as an electrode of the light emitting device ED and may include ITO or IZO. For example, the pixel electrode PE according to another embodiment may be formed in a four-layer structure of ITO/Cu/MoTi/ITO.

Optionally, the line connection patterns LCP among the pixel driving lines GL, DL, PL, RL, CPL, PSL, RDL, and LCP may be formed of the same material along with the pixel electrode PE, but are not limited thereto. Also, first pads of a first pad part 110 disposed on the first substrate 100 may be formed of the same material along with the pixel electrode PE, but are not limited thereto.

The light emitting device ED may be formed on the pixel electrode PE and may directly contact the pixel electrode PE. The light emitting device ED may be a common layer which is formed in common in each of a plurality of pixels SP so as not to be distinguished by pixel SP units. The light emitting device ED may react on a current flowing between the pixel electrode PE and the common electrode CE to emit white light. The light emitting device ED according to an embodiment may include an organic light emitting device or an inorganic light emitting device, or may include a stacked or combination structure of an organic light emitting device (or an inorganic light emitting device) and a quantum dot light emitting device.

An organic light emitting device according to an embodiment may include two or more light emitting material layers (or a light emitting portion) for emitting white light. For example, the organic light emitting device may include a first light emitting material layer and a second light emitting material layer, for emitting white light on the basis of a combination of first light and second light. Here, the first light emitting material layer may include at least one of a blue light emitting material, a green light emitting material, a red light emitting material, a yellow light emitting material, and a yellow-green light emitting material. The second light emitting material layer may include at least one of a blue light emitting material, a green light emitting material, a red light emitting material, a yellow light emitting material, and a yellow-green light emitting material, for emitting second light which is combined with first light to generate white light.

The organic light emitting device according to an embodiment may further include one or more function layers for enhancing emission efficiency and/or lifetime. For example, the function layer may be disposed upper and/or under a light emitting material layer.

An inorganic light emitting device according to an embodiment may include a semiconductor light emitting diode, a micro light emitting diode, or a quantum dot light emitting diode. For example, when the light emitting device ED is the inorganic light emitting device, the light emitting device ED may have a scale of 1 µm to 100 µm, but is not limited thereto.

The common electrode CE may be referred to as a cathode electrode, a transparent electrode, an upper electrode, or a second electrode of the light emitting device ED. The common electrode CE may be formed on the light emitting device ED and may directly contact the light emitting device ED or may electrically and directly contact the light emitting device ED. The common electrode CE may include a transparent conductive material which transmits light emitted from the light emitting device ED.

The common electrode CE according to an embodiment may be formed in a single-layer structure or a multi-layer structure, which includes at least one material of graphene or a transparent conductive material which is relatively high in work function. For example, the common electrode CE may include metal oxide such as ITO or IZO, or may include a combination of oxide and metal such as ZnO:Al or $SnO_2$:Sb.

Additionally, by adjusting a refractive index of light emitted from the light emitting device ED, a capping layer for enhancing the emission efficiency of light may be further disposed on the common electrode CE.

The bank 104 may be disposed on the planarization layer 102 to cover an edge portion of the pixel electrode PE. The bank 104 may define an emission area EA (or an opening portion) of each of the plurality of subpixels SP and may electrically isolate pixel electrodes PE disposed in adjacent subpixels SP. The bank 104 may be formed to cover a contact hole CH disposed in each of the plurality of pixel areas PA. The bank 104 may be covered by the light emitting device ED.

For example, the bank 104 may include a transparent material (for example, acryl resin, epoxy resin, phenolic resin, polyamide resin, or polyimide resin), and in this case, the bank 104 may be a transparent bank.

As another example, the bank 104 may include a light-absorbing material or an opaque material including a black pigment such as carbon black, and for example, may include polyimides resin, acryl resin, or benzocyclobutene (BCB), and in this case, the bank 104 may be a black bank which prevents or minimizes color mixture between adjacent subpixels SP.

The dam pattern 105 may be disposed on the circuit layer 101 at an edge portion of the first substrate 100 to have a closed loop shape or a closed loop line shape. For example, the dam pattern 105 may be disposed on a passivation layer 101d of the circuit layer 101. The dam pattern 105 may prevent the spread or overflow of the encapsulation layer 106. The dam pattern 105 may be included within outermost pixels Po (or outermost pixel areas PAo) disposed at an edge portion of the first substrate 100 among a plurality of pixels P (or a plurality of pixel area PA). In this case, a portion of the dam pattern 105 may be disposed (or implemented) between the first pad part 110 disposed in the first substrate 100 and an emission area EA of each of the outermost pixels Po (or the outermost pixel area PAo).

The dam pattern 105 according to an embodiment may include the same material along with the planarization layer 102. The dam pattern 105 may have the same height (or thickness) as that of the planarization layer 102, or may have a height which is higher than the planarization layer 102. For example, a height (or thickness) of the dam pattern 105 may be twice a height (or thickness) of the planarization layer 102.

According to another embodiment, the dam pattern 105 may include a lower dam pattern, which is formed of the same material along with the planarization layer 102, and an upper dam pattern which is stacked on the lower dam pattern and includes the same material as that of the bank 104. The lower dam pattern may have the same height (or thickness) as that of the planarization layer 102, or may have a height which is higher than the planarization layer 102. For example, a height (or thickness) of the lower dam pattern may be twice a height (or thickness) of the planarization layer 102.

The light emitting device ED including an organic light emitting device may be implemented in only an internal region (or an inner region) surrounded by the dam pattern 105. That is, the light emitting device ED including an organic light emitting device may be disposed at a portion other than a portion between an outer surface OS of the first substrate 100 and the dam pattern 105 in the first surface 100a of the first substrate 100, and may not be disposed between the outer surface OS of the first substrate 100 and the dam pattern 105 and on a top surface of the dam pattern 105. Also, the common electrode CE of the light emitting device layer 103 may be implemented to cover the light emitting device ED and the dam pattern 105.

The first substrate 100 according to an embodiment may further include a first margin area MA1, a second margin area MA2, and a dam pattern area DPA.

The first margin area MA1 may be disposed between an emission area EA of the outermost pixel Po and the dam pattern 105. The first margin area MA1 may have a first width between an end of the emission area EA (or the bank 104) of the outermost pixel Po and the dam pattern 105 on the basis of a shadow area (or a tail portion of the light emitting device) of the light emitting device ED inevitably occurring in a process of forming the light emitting device ED. Accordingly, the dam pattern 105 may be implemented to be apart from the end of the emission area EA by the first width of the first margin area MA1 with respect to the first direction X.

The second margin area MA2 may be disposed between the outer surface OS of the first substrate 100 and the dam pattern 105. The second margin area MA2 may have a second width between the outer surface OS of the first substrate 100 and the dam pattern 105 on the basis of the reliability margin of the light emitting device ED against water. Accordingly, the dam pattern 105 may be implemented to be apart from the outer surface OS of the first substrate 100 by the second width of the second margin area MA2 with respect to the first direction X.

The second margin area MA2 according to an embodiment may include a pad margin area overlapping the first pad part 100 disposed at a first edge portion of the first surface 100a of the first substrate 100.

The dam pattern area DPA may be disposed between the first margin area MA1 and the second margin area MA2. The dam pattern area DPA may have a third width corresponding to a width of a lowermost bottom surface (or a bottom surface).

A width of each of the first margin area MA1, the second margin area MA2, and the dam pattern area DPA may be implemented so that a second interval D2 between a center portion of the outermost pixel and the outer surface OS of the first substrate 100 is half or less of a first interval (or a pixel pitch) D1 between two adjacent pixel areas PA, with respect to the first direction X.

For example, when half of the first interval (or the pixel pitch) D1 between the two adjacent pixel areas PA is 700 μm within a process error range, a total width of the first margin area MA1, the second margin area MA2, and the dam pattern area DPA may be implemented to be about 670 μm, based on a shadow margin based on the shadow area of the light emitting device ED and an encapsulation margin based on securing the reliability of the light emitting device ED against water. In this case, the second interval D2 between an outermost outer surface VL of the first substrate 100 and a center portion of the outermost pixel including the first pad part 110 may be implemented to be 700 μm within a process error range. Here, the outermost outer surface VL of the first substrate 100 may be an outermost outer sidewall or an outer sidewall of the display apparatus (or a display panel).

The first margin area MA1 and the second margin area MA2 may have the same width or different widths. The dam pattern area DPA may have a width which is relatively narrower than each of the first margin area MA1 and the second margin area MA2. For example, with respect to the first direction X, the first margin area MA1 may be implemented to have a width of 300 μm or less, the second margin area MA2 may be implemented to have a width of 300 μm or less, and the dam pattern area DPA may be implemented to have a width of 70 μm. Also, a pad margin area (or a lateral routing area) included in the second margin area MA2 may be implemented to have a width of 100 μm or less with respect to the first direction X.

The barrier pattern portion BPP may be implemented at an edge portion of the first substrate 100. The barrier pattern portion BPP may prevent the penetration of water in a lateral direction, thereby preventing the degradation of the light emitting device ED caused by lateral water penetration. The barrier pattern portion BPP may isolate (or disconnect) the light emitting device layer 103 to prevent lateral water penetration and to enhance the encapsulation reliability of the encapsulation layer 106.

The light emitting device ED according to the present disclosure may be degraded or reduced in reliability due to the penetration of water through a lateral surface of the first substrate 100. In order to prevent such problems, the barrier pattern portion BPP may be implemented to isolate (or disconnect) the light emitting device ED of the light emitting device layer 103 at a periphery of the dam pattern 105, thereby preventing or minimizing a reduction in reliability of the light emitting device ED caused by lateral water penetration. Therefore, the barrier pattern portion BPP may be defined as a groove pattern portion, a trench pattern portion, an isolation portion, or a water penetration prevention portion.

Moreover, the TFT according to the present disclosure may be changed in characteristic, due to hydrogen flowing in from a peripheral material layer. In order to prevent such a problem, the barrier pattern portion BPP may be implemented to include a material for collecting hydrogen, thereby preventing the characteristic of the TFT from being changed by hydrogen penetration.

The barrier pattern portion BPP may be implemented in the circuit layer 101 between the outer surface OS of the first substrate 100 and the dam pattern 105. For example, the barrier pattern portion BPP may be implemented in the passivation layer 101d of the circuit layer 101. As another example, the barrier pattern portion BPP may be implemented in the passivation layer 101d and the interlayer insulation layer 101c of the circuit layer 101. The barrier pattern portion BPP will be described below.

The encapsulation layer 106 may be disposed on a portion other than an outermost edge portion of the first surface 100a of the first substrate 100 to cover the light emitting device 103. For example, the encapsulation layer 106 may be implemented to surround all of a front surface and lateral surfaces of the light emitting device layer 103.

The encapsulation layer 106 according to an embodiment may include first to third encapsulation layer 106a to 106c.

The first encapsulation layer 106a may be implemented to prevent oxygen or water from penetrating into the light emitting device 103. The first encapsulation layer 106a may be disposed on the common electrode CE to surround the light emitting device layer 103. Therefore, all of the front surface and lateral surfaces of the light emitting device 103 may be surrounded by the first encapsulation layer 106a. For example, an end of the first encapsulation layer 106a may be disposed in the second margin area MA2 adjacent to the dam pattern 105. The first encapsulation layer 106a may directly contact a top surface of the passivation layer 101d at an outer periphery of the dam pattern 105 and may cover a boundary portion (or an interface) between the common electrode CE and the passivation layer 101d, thereby preventing or minimizing lateral water penetration.

The first encapsulation layer 106a according to an embodiment may include an inorganic material. For example, the first encapsulation layer 106a may be referred to as a first inorganic encapsulation layer. For example, the first encapsulation layer 106a may include a single-layer structure including one of silicon oxide (SiOx), silicon nitride (SiNx), silicon oxynitride (SiONx), titanium oxide (TiOx), and aluminum oxide (AlOx) or a stacked structure thereof.

The second encapsulation layer 106b may be implemented on the first encapsulation layer 106a to have a thickness which is relatively thicker than that of the first encapsulation layer 106a. The second encapsulation layer 106b may have a thickness for sufficiently covering particles (or an undesired material or an undesired structure) which may be or not on the first encapsulation layer 106a. The second encapsulation layer 106b may spread to an edge portion of the first surface 100a of the first substrate 100 due to a relatively thick thickness, but the spread of the second encapsulation layer 106b may be blocked by the dam pattern 105. For example, an end of the second encapsulation layer 106b may directly contact the first encapsulation layer 106a on the dam pattern 105. Accordingly, the second encapsulation layer 106b may be disposed on only the first encapsulation layer 106a in an internal region (or an inner region) surrounded by the dam pattern 105. The second encapsulation layer 106b may be referred to as a particle cover layer.

The second encapsulation layer 106b according to an embodiment may include an organic material such as SiOCz acryl or epoxy-based resin.

The third encapsulation layer 106c may be implemented to primarily prevent oxygen or water from penetrating into the light emitting device layer 103. The third encapsulation layer 106c may be implemented to surround all of the second encapsulation layer 106b and the first encapsulation layer 106a uncovered by the second encapsulation layer 106b. For example, an end of the third encapsulation layer 106c may be disposed between the end of the first encapsulation layer 106a and the outer surface OS of the first substrate 100 and may directly contact the passivation layer 101d. The third encapsulation layer 106c may directly contact a top surface of the passivation layer 101d and may cover a boundary portion (or an interface) between the first encapsulation layer 106a and the passivation layer 101d, thereby additionally preventing or minimizing lateral water penetration.

The third encapsulation layer 106c according to an embodiment may include an inorganic material. For example, the third encapsulation layer 106c may be referred to as a second inorganic encapsulation layer. For example, the third encapsulation layer 106c may include a single-layer structure including one of SiOx, SiNx, SiONx, TiOx, and AlOx or a stacked structure thereof.

The first substrate 100 according to an embodiment may further include a wavelength conversion layer 107.

The wavelength conversion layer 107 may convert a wavelength of light incident from the emission area EA of each of the plurality of pixel areas PA. For example, the wavelength conversion layer 107 may convert white light, which is incident from the emission area EA, into colored light corresponding to a corresponding pixel P.

The wavelength conversion layer 107 according to an embodiment may include a plurality of wavelength conversion patterns 107a and a protection layer 107b.

The plurality of wavelength conversion patterns 107a may be disposed on the encapsulation layer 106 disposed in the emission area EA of each of the plurality of pixel areas PA. The plurality of wavelength conversion patterns 107a may be divided (or classified) into a red light filter which converts white light into red light, a green light filter which converts white light into green light, and a blue light filter which converts white light into blue light. For example, the plurality of wavelength conversion patterns 107a may be divided (or classified) into the red light filter (or a first light filter) disposed in the first subpixel SP1, the green light filter (or a second light filter) disposed in the second subpixel SP2, and the blue light filter (or a third light filter) disposed in the fourth subpixel SP4.

Each of the plurality of wavelength conversion patterns 107a according to an embodiment may be implemented to have a size which is wider than the emission area EA of each of the plurality of pixel areas PA. That is, in order to prevent color mixture between adjacent subpixels SP, each of the plurality of wavelength conversion patterns 107a may have the same size as that of the pixel electrode PE or may have a size which is wider than the pixel electrode PE, and thus, may overlap a portion of the bank 104 covering an edge portion of the pixel electrode PE. For example, each of the plurality of wavelength conversion patterns 107a may be disposed to overlap all of the emission area EA of each of the plurality of pixel areas PA and to overlap a portion of the circuit area CA adjacent to the emission area EA. In this case, in order to prevent external light, which is incident through a region, which does not overlap the wavelength conversion pattern 107a, of each of the plurality of pixel areas PA, from being reflected by the pixel driving lines or to minimize the reflection of the external light, the bank 104 may include a light-absorbing material or a black pigment.

According to another embodiment, each of the plurality of wavelength conversion patterns 107a may be implemented to have the same size as that of each of the plurality of pixel areas PA. That is, each of the plurality of wavelength conversion patterns 107a may be disposed to overlap all of each of the plurality of pixel areas PA, for preventing or minimizing the reflection of external light by the pixel driving lines. For example, each of the plurality of wavelength conversion patterns 107a may be disposed to cover all of the emission area EA and the circuit area CA of each of the plurality of pixel areas PA. In this case, the bank 104 may be a black bank or a transparent bank.

Additionally, each of the plurality of wavelength conversion patterns 107a may include a quantum dot which re-emits light on the basis of white light or blue light incident from the light emitting device layer 103 to additionally irradiate colored light corresponding to a corresponding pixel. Here, the quantum dot may be selected from among CdS, CdSe, CdZnSeS, CdTe, ZnS, ZnSe, GaAs, GaP, GaAs—P, Ga—Sb, InAs, InP, InSb, AlAs, AlP, and AlSb. For example, the red light filter disposed in the first subpixel SP1 may include a red quantum dot such as CdSe or InP emitting red light, the green light filter disposed in the second subpixel SP2 may include a green quantum dot such as CdZnSeS emitting green light, and the blue light filter disposed in the fourth subpixel SP4 may include a blue quantum dot such as ZnSe emitting blue light. As described above, when each of the plurality of wavelength conversion patterns 107a includes the quantum dot, the color reproduction of a light emitting display apparatus may increase.

According to another embodiment, the plurality of wavelength conversion patterns 107a may be implemented to overlap one another in the circuit area CA of each of the plurality of pixel areas PA. In this case, the circuit area CA of each of the plurality of pixel areas PA may be covered by at least two wavelength conversion patterns 107a overlapping each other. For example, the circuit area CA of each of the plurality of pixel areas PA may be covered by a two-layer stacked portion including the red light filter and the green light filter. As another example, the circuit area CA of each of the plurality of pixel areas PA may be covered by a three-layer stacked portion including the red light filter, the green light filter, and the blue light filter. The two-layer stacked portion including two light filters or the three-layer stacked portion including three light filters may perform a function of a black matrix which prevents color mixture between adjacent subpixels SP or prevents or minimizes the reflection of external light.

The protection layer 107b may be implemented to cover the wavelength conversion patterns 107a and to provide a flat surface on the wavelength conversion patterns 107a. The protection layer 107b may be disposed to cover the wavelength conversion patterns 107a and the encapsulation layer 106 where the wavelength conversion patterns 107a are not disposed. The protection layer 107b according to an embodiment may include an organic material. For example, the protection layer 107b may include acryl resin, epoxy resin, phenolic resin, polyamides resin, or polyimides resin, but is not limited thereto. Optionally, the protection layer 107b may further include a getter material for adsorbing water and/or oxygen.

Alternatively, the wavelength conversion layer 107 may be changed to a wavelength conversion sheet having a sheet form and may be disposed on the encapsulation layer 106. In this case, the wavelength conversion sheet (or a quantum dot sheet) may include the wavelength conversion patterns 107a disposed between a pair of films. For example, when the wavelength conversion layer 107 includes a quantum dot which re-emits colored light set in a subpixel, the light emitting device layer 103 of a subpixel may be implemented to emit white light or blue light.

The first substrate 100 according to an embodiment may further include a functional film 108.

The functional film 108 may be disposed on the wavelength conversion layer 107. For example, the functional film 108 may be coupled to the wavelength conversion layer 107 by a transparent adhesive member. The transparent adhesive member may include a pressure sensitive adhesive (PSA), an optical clear adhesive (OCA), or an optical clear resin (OCR)

The functional film 108 according to an embodiment may include an anti-reflection layer (or an anti-reflection film) for preventing reflection of external light to enhance outdoor visibility and a contrast ratio with respect to an image displayed by the display apparatus 10. For example, the anti-reflection layer may include a circular polarization layer (or a circular polarization film) which prevents external light, reflected by TFTs and/or the pixel driving lines disposed on the first substrate 100, from traveling to the outside.

The functional film 108 according to an embodiment may further include a barrier layer (or a barrier film) for primarily preventing the penetration of water or oxygen, and the barrier layer may include a material (for example, a polymer material) which is low in water transmission rate.

The functional film 108 according to an embodiment may further include a light path control layer (or a light path control film) for controlling a path of light output from each pixel P to the outside. The light path control layer may include a stacked structure where a high refraction layer and a low refraction layer are alternately stacked and may change a path of light incident from each pixel P to minimize a color shift based on a viewing angle.

The first substrate 100 according to an embodiment may further include a side sealing member 109.

The side sealing member (or an edge sealing member) 109 may be formed between the first substrate 100 and the functional film 108 and may cover all of side (or lateral) surfaces of each of the circuit layer 101, the planarization layer 103, and the wavelength conversion layer 107. That is, the side sealing member 109 may cover all of side surfaces of each of the circuit layer 101, the planarization layer 103, and the wavelength conversion layer 107 which are exposed at the outside of the display apparatus 10, between the functional film 108 and the first substrate 100. Also, the side sealing member 109 may cover a first chamfer 100c which is formed (or disposed) at a corner portion between the first surface 100a and the outer surface OS of the first substrate 100 through a chamber process. For example, each of the outermost outer surface of the first substrate 100, an outer surface of the side sealing member 109, and an outer surface of the functional film 108 may be disposed (or aligned) on the same vertical line VL.

The side sealing member 109 according to an embodiment may include a silicon-based or ultraviolet (UV)-curable sealant (or resin), but considering a tack process time, the side sealing member 109 may include the UV-curable sealant. Also, the side sealing member 109 may have a color (for example, blue, red, bluish green, or black), but is not limited thereto and may include a colored resin or a light blocking resin for preventing lateral light leakage. The side sealing member 109 may prevent lateral light leakage by using light, traveling from an inner portion of the wavelength conversion layer 107 to an outer surface thereof, of light emitted from the light emitting device ED of each subpixel SP. Particularly, the side sealing member 109 overlapping the first pad part of the first substrate 100 may prevent or minimize the reflection of external light caused by the pad disposed in the first pad part.

Optionally, the side sealing member 109 may further include a getter material for adsorbing water and/or oxygen.

The first substrate 100 according to an embodiment may further include a front coating layer.

The front coating layer may be provided between the wavelength conversion layer 107 and the functional film 108 to cover a top surface of the wavelength conversion layer 107 and to cover all of the lateral surfaces of each of the circuit layer 101, the planarization layer 102, and the wavelength conversion layer 107. That is, the front coating layer may be implemented to cover all of the lateral surfaces of each of the circuit layer 101, the planarization layer 102, and the wavelength conversion layer 107 which are exposed at the outside of the display apparatus 10, between the functional film 108 and the first substrate 100, and moreover, may be implemented to cover a portion of each of a top surface and a lateral surface of a routing portion 400 connected to the first pad part of the first substrate 100. The front coating layer according to an embodiment may be implemented through an atomic layer deposition process. For example, the front coating layer may be implemented to have a thickness of several μm.

In the present embodiment, the side sealing member 109 may be implemented to cover the front coating layer at the edge portion of the first surface 100a of the first substrate 100, or may be omitted.

The second substrate 200 according to an embodiment may include a metal pattern layer connected to the routing portion 400 and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented on a rear surface 200b of a second substrate 200. The first metal layer 201 according to an embodiment may include a first metal pattern. For example, the first metal layer 201 may be referred to as a first link layer or a link line layer.

The first metal pattern according to an embodiment may have a two-layer structure (Cu/MoTi) of Cu and MoTi. The first metal pattern may be used as a link line of a link line portion 250 illustrated in FIG. 8. For example, the first metal pattern may be used as each of a plurality of data link lines 251, a plurality of pixel driving power link lines 255, a plurality of gate control signal transfer lines, and a first common link line 257a of a pixel common power link line 257, but is not limited thereto.

The first insulation layer 202 may be implemented on the rear surface 200b of the second substrate 200 to cover the first metal layer 201. The first insulation layer 202 according to an embodiment may include an inorganic material. For example, the first insulation layer 202 may include one material of SiOx, SiNx, and SiONx, but is not limited thereto.

The second metal layer 203 may be implemented on the first insulation layer 202. The second metal layer 203 according to an embodiment may include a second metal pattern. For example, the second metal layer 203 may be referred to as a second link layer, a jumping line layer, or a bridge line layer.

The second metal pattern according to an embodiment may have a two-layer structure (Cu/MoTi) of Cu and MoTi. The second metal pattern may be used as a plurality of gate link lines 253 of a plurality of link lines of the link line portion 250 illustrated in FIG. 9, but is not limited thereto. For example, the second metal layer 203 may be used as a jumping line (or a bridge line) for electrically connecting the link lines which are formed of different metal materials on different layers in the link line portion 250.

Optionally, a link line (for example, a plurality of first link lines) disposed on the second metal layer 203 may be modified to be disposed on the first metal layer 201, and a link line (for example, a plurality of second link lines) disposed on the first metal layer 201 may be modified to be disposed on the second metal layer 203.

The second insulation layer 204 may be implemented on the rear surface 200b of the second substrate 200 to cover the second metal layer 203. The second insulation layer 204 according to an embodiment may include an inorganic material. For example, the second insulation layer 204 may include one material of SiOx, SiNx, and SiONx.

The third metal layer 205 may be implemented on the second insulation layer 204. The third metal layer 205 according to an embodiment may include a third metal pattern. For example, the third metal layer 205 may be referred to as a third link layer or a pad electrode layer.

The third metal pattern according to an embodiment may have a stacked structure of at least two materials of ITO (or IZO), Mo, Ti, and MoTi. For example, the third metal pattern may have a three-layer structure of ITO/Mo/ITO, ITO/MoTi/ITO, IZO/Mo/ITO, or IZO/MoTi/ITO. The third metal pattern may be used as each of second pads of the second pad part 210, third pads of the third pad part 230, and a second common link line 257b and a plurality of third common link lines 257c of the pixel common power link line 257 illustrated in FIG. 8.

The third insulation layer 206 may be implemented on the rear surface 200b of the second substrate 200 to cover the third metal layer 205. The third insulation layer 206 according to an embodiment may include an organic material. For example, the third insulation layer 206 may include an insulating material such as photo acryl. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

The third insulation layer 206 may further include a pad exposure hole which exposes a portion of each of the second pads of the second pad part 210 and the third pads of the third pad part 230, which include the third metal layer 205.

A coupling member 300 may be disposed between the first substrate 100 and the second substrate 200. Therefore, the first substrate 100 and the second substrate 200 may be opposite-bonded to each other by a coupling member 300. The coupling member 300 according to an embodiment may be a transparent adhesive member or a double-sided tape including an OCA or an OCR. According to another embodiment, the coupling member 300 may include a glass fiber.

The coupling member 300 according to an embodiment may be disposed in a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

According to another embodiment, the coupling member 300 may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Optionally, the coupling member 300 may further include a heat transfer element. In this case, the coupling member 300 may transfer heat, occurring in the first substrate 100, to the second substrate 200 through the heat transfer element to prevent or minimize an increase in temperature of the first substrate 100. The second substrate 200 may act as a temperature lowering member which prevents or minimizes an increase in temperature of the first substrate 100. For example, the heat transfer element may include a plurality of heat transfer particles or a heat transfer layer including a metal material. When the heat transfer element includes a heat transfer layer including a metal material, the heat transfer layer may be electrically grounded or floated, and thus, may act as a noise blocking layer which prevents frequency noise or static electricity, occurring in a driving circuit disposed on the rear surface 200b of the second substrate 200, from flowing into the pixels, the pixel driving lines, and the gate driving circuit 150, which are disposed on the first substrate 100.

Figure 13:
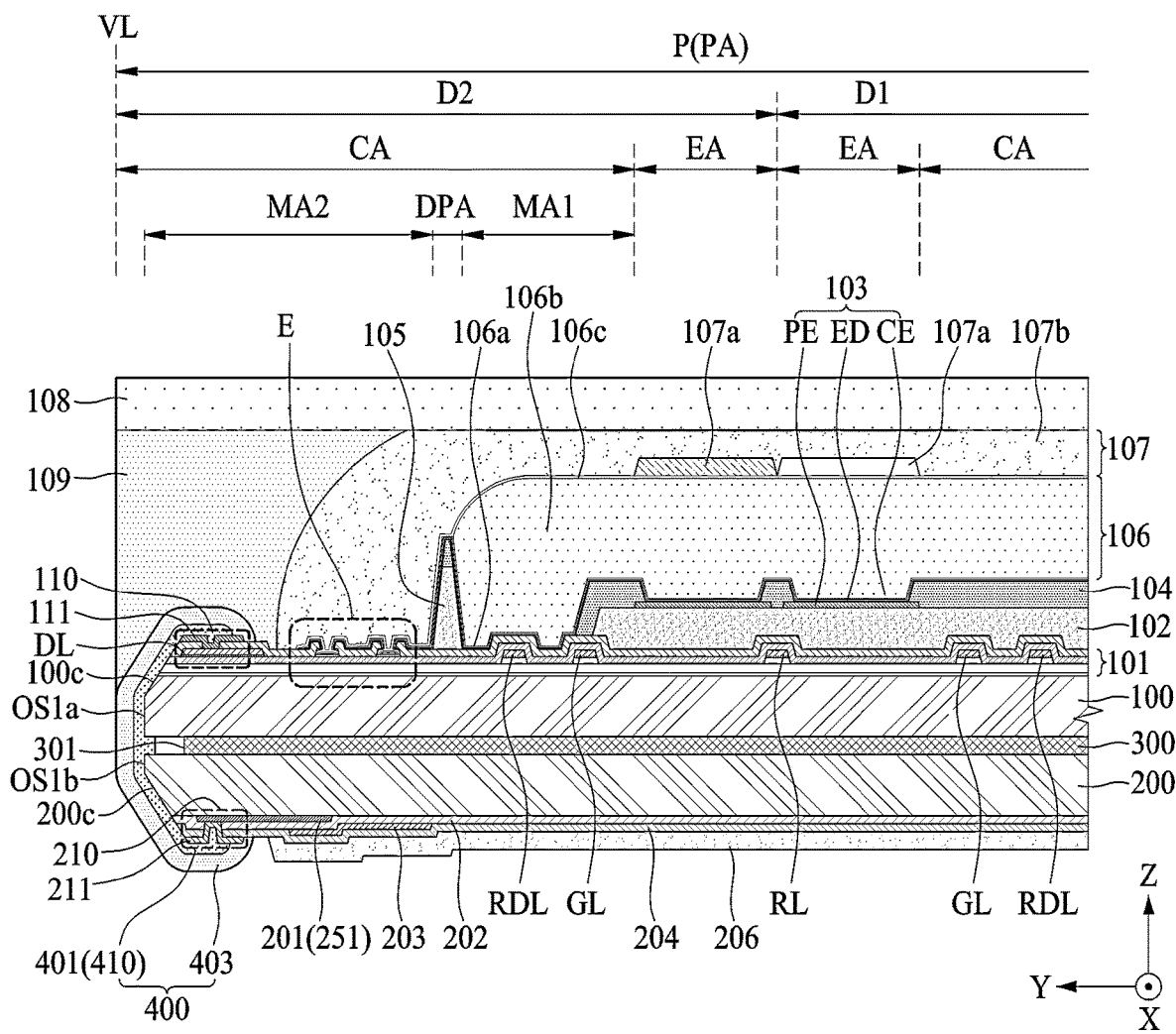
FIG. 13 is a cross-sectional view taken along line II-IP illustrated in FIG. 3.

FIG. 13 is a cross-sectional view taken along line II-IP illustrated in FIG. 3 and is a diagram for describing a cross-sectional structure of a first pad part, a second pad part, and a routing portion of a display apparatus according to the present disclosure. In describing FIG. 13, elements which are the same or correspond to the elements of FIG. 3 are referred to by like reference numerals, and their repetitive descriptions are omitted or will be briefly described below.

Referring to FIGS. 3, 4, and 11 to 13, in a display apparatus 10 according to the present disclosure, a first pad part 110 may include a plurality of first pads 111 disposed at a first edge portion of a first surface 100a of a first substrate 100. The plurality of first pads 111 may be divided (or classified) into a plurality of first data pads, a plurality of first pixel driving power pads, and a plurality of first pixel common power pads. Also, the plurality of first pads 111 may be further divided (or classified) into a plurality of first reference power pads.

Each of the plurality of first pads 111 may be electrically connected to a corresponding line of a plurality of pixel driving lines through a first pad contact hole disposed in a planarization layer 102. For example, the first data pad may be electrically connected to one end of a data line DL through the first pad contact hole disposed in the planarization layer 102.

In the display apparatus 10 according to the present disclosure, a second pad part 210 may include a plurality of second pads 211 disposed at a first edge portion, overlapping the first pad part 110, of a rear surface 200b of a second substrate 200. The plurality of second pads 211 may be divided (or classified) into a plurality of second data pads, a plurality of second pixel driving power pads, and a plurality of second pixel common power pads. Also, the plurality of second pads 211 may be further divided (or classified) into a plurality of second reference power pads.

Each of the plurality of second pads 211 may be electrically connected to a link line of a link line portion 250, including a first metal layer 201 or a second metal layer 203 disposed on the rear surface 200b of the second substrate 200, through a second pad contact hole disposed in each of first and second insulation layers 202 and 204. For example, the second data pad may be electrically connected to one end of a data link line 251 through the second pad contact hole disposed in each of the first and second insulation layers 202 and 204.

A routing portion 400 may be disposed to surround an outer surface OS of the first substrate 100 and an outer surface OS of the second substrate 200. For example, the routing portion 400 may be disposed on each of a first outer surface (or one surface) OS1a of the outer surface OS of the first substrate 100 and a first outer surface (or one surface) OS1b of the outer surface OS of the second substrate 200.

The routing portion 400 according to an embodiment may include a plurality of routing lines 401 which are disposed on each of the first outer surface (or one surface) OS1a of the outer surface OS of the first substrate 100 and the first outer surface (or one surface) OS1b of the outer surface OS of the second substrate 200. The plurality of routing lines 401 may be divided (classified) into a plurality of data routing lines, a plurality of gate routing lines, a plurality of pixel driving power routing lines, and a plurality of pixel common power routing lines. Also, the plurality of routing lines 401 may be further divided (or classified) into a plurality of reference power routing lines.

Each of the plurality of routing lines 401 may be formed to surround each of the first outer surface OS1a of the first substrate 100 and the first outer surface OS1b of the second substrate 200. For example, each of the plurality of routing lines 401 may be formed through a printing process using a conductive paste. For example, each of the plurality of routing lines 401 may be formed through a printing process using an Ag paste, but is not limited thereto.

In each of the plurality of routing lines 401, one end portion thereof may surround a first chamfer 100c and the first pad 111 of the first pad part 110 disposed at a first edge portion of the first substrate 100, the other end portion thereof may surround a second chamfer 200c and the second pad 211 of the second pad part 210 disposed at a first edge portion of the second substrate 200, and a center portion thereof between the one end portion and the other end portion may surround each of the first outer surface OS1a of the first substrate 100 and the first outer surface OS1b of the second substrate 200. For example, in a data routing line 410, one end portion thereof may be implemented to surround the first chamfer 100c and a first data pad of the first pad part 110 disposed at the first edge portion of the first substrate 100, the other end portion thereof may be implemented to surround the second chamfer 200c and a second data pad of the second pad part 210 disposed at a first edge portion of the second substrate 200, and a center portion thereof between the one end portion and the other end portion may be implemented to surround each of the first outer surface OS1a of the first substrate 100 and the first outer surface OS1b of the second substrate 200.

Optionally, when the coupling member 300 includes the heat transfer element, an end 301 of the coupling member 300 closest to the first outer surface OS1a of the first substrate 100 may be apart from the first outer surface OS1a of the first substrate 100 and/or the first outer surface OS1b of the second substrate 200 so as not to be electrically connected to each of the plurality of routing lines 401, and thus, may not be electrically connected to or may be electrically isolated from each of the plurality of routing lines 401. In this case, a portion of each of the plurality of routing lines 401 may penetrate to a region between the first substrate 100 and the second substrate 200, and thus, a separation distance between the coupling member 300 including the heat transfer element and the first outer surface OS1a of the first substrate 100 may be set based on a penetration length (or distance) of a center portion of the routing line 401 penetrating to the region between the first substrate 100 and the second substrate 200.

The routing portion 400 according to an embodiment of the present disclosure may further include an edge coating layer 403.

The edge coating layer 403 may be implemented to cover the plurality of routing lines 401. The edge coating layer 403 according to an embodiment may be implemented to cover all of the first edge portion and the first outer surface OS1a of the first substrate 100 and the first edge portion and the first outer surface OS1b of the second substrate 200, in addition to the plurality of routing lines 401. The edge coating layer 403 may prevent the corrosion of each of the plurality of routing lines 401 including a metal material or electrical short circuit between the plurality of routing lines 401. Also, the edge coating layer 403 may prevent or minimize the reflection of external light caused by the plurality of routing lines 401 and the first pads 111 of the first pad part 110. The edge coating layer 403 according to an embodiment may include a light blocking material including black ink.

A top surface of the edge coating layer 403 covering the first chamfer 100c of the first substrate 100 may be covered by the side sealing member 109.

An outer surface of the edge coating layer may be an outermost outer surface of the first substrate 100, and thus, each of the outermost outer surface of the first substrate 100, an outer surface of the side sealing member 109, and an outer surface of the functional film 108 may be disposed on the same vertical line VL.

Figure 14:
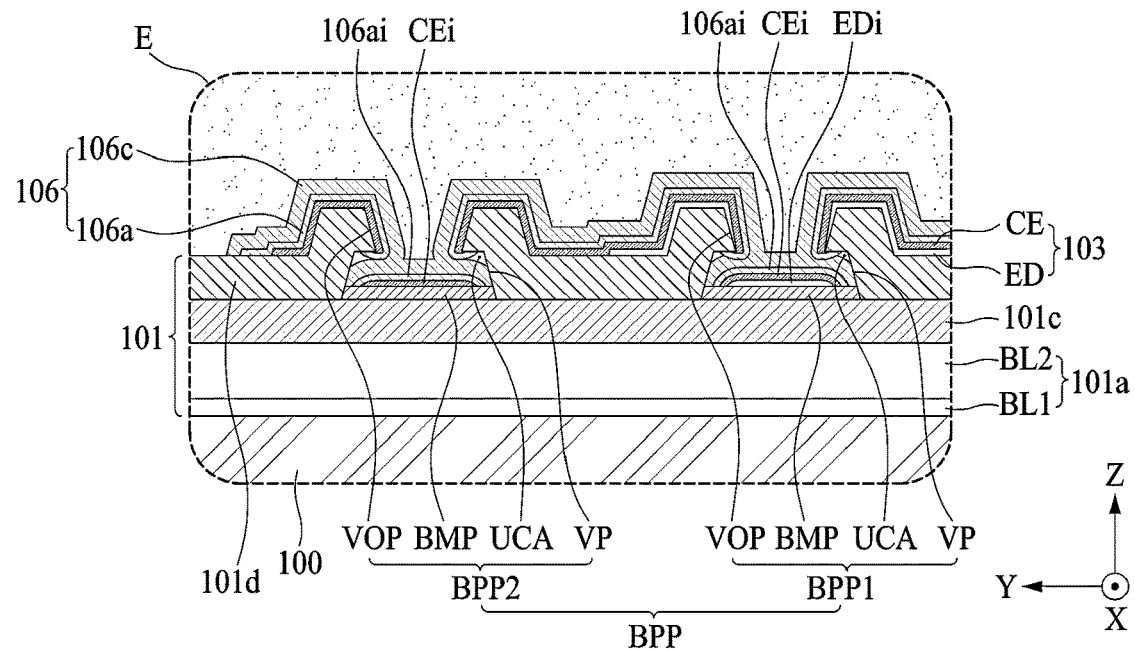
FIG. 14 is an enlarged view of a region 'E' illustrated in FIG. 13.

FIG. 14 is an enlarged view of a region 'E' illustrated in FIG. 13 and is a diagram for describing a barrier pattern portion according to the present disclosure.

Referring to FIGS. 11, 13, and 14, a barrier pattern portion BPP according to an embodiment of the present disclosure may be implemented to surround a dam pattern 105. The barrier pattern portion BPP may be implemented in a closed loop shape (or a closed loop line shape) surrounding the dam pattern 105. The barrier pattern portion BPP may be disposed within an outermost pixel area PAo among a plurality of pixel areas PA provided in the first substrate 100. For example, the barrier pattern portion BPP may be disposed in a second margin area MA2 between an outer surface OS of the first substrate 100 and the dam pattern 105.

The barrier pattern portion BPP according to an embodiment may include a barrier metal pattern BMP. The barrier metal pattern BMP may be disposed in a circuit layer 101. The barrier metal pattern BMP may include a material for collecting hydrogen. For example, the barrier metal pattern BMP may be formed in a single-layer structure or a multilayer structure including at least one material of Ti and MoTi. The barrier metal pattern BMP may be disposed on the same layer as a gate line or a data line.

The barrier pattern portion BPP according to an embodiment may include an undercut area UCA which is implemented in a passivation layer 101d of the circuit layer 101. The undercut area UCA may be referred to as an eaves portion, a clip structure, or an isolation structure for isolating (or disconnecting) a light emitting device ED. The undercut area UCA may be implemented for isolating (or disconnecting) a light emitting device layer 103 without using a separate cutting (or isolation) process. For example, the undercut area UCA may be implemented to isolate each of a common electrode CE and the light emitting device ED of the light emitting device layer 103.

The undercut area UCA according to an embodiment may be implemented on the barrier metal pattern BMP. For example, the undercut area UCA may be implemented between the barrier metal pattern BMP and the passivation layer 101d. For example, the undercut area UCA may be implemented at a boundary portion between the barrier metal pattern BMP and the passivation layer 101d.

The barrier pattern portion BPP according to an embodiment may include a first barrier pattern portion BPP1 and a second barrier pattern portion BPP2.

The first barrier pattern portion BPP1 may be implemented to surround the dam pattern 105. For example, the first barrier pattern portion BPP1 may be implemented in a closed loop shape (or a closed loop line shape) surrounding the dam pattern 105 between the outer surface OS of the first substrate 100 and the dam pattern 105.

The second barrier pattern portion BPP2 may be implemented to surround the first barrier pattern portion BPP1. For example, the second barrier pattern portion BPP2 may be implemented in a closed loop shape (or a closed loop line shape) surrounding the first barrier pattern portion BPP1 between the outer surface OS of the first substrate 100 and the first barrier pattern portion BPP1.

Each of the first barrier pattern portion BPP1 and the second barrier pattern portion BPP2 according to an embodiment may include the barrier metal pattern BMP, a void portion VP, a void opening portion VOP, and the undercut area UCA.

The barrier metal pattern BMP may be implemented in the circuit layer 101. The barrier metal pattern BMP according to an embodiment may be disposed on the interlayer insulation layer 101c of the circuit layer 101. The barrier metal pattern BMP may directly contact a top surface of the interlayer insulation layer 101c. The barrier metal pattern BMP may be disposed on the same layer as a source/drain electrode SD1/SD2 (or a data line DL) of a TFT. For example, the barrier metal pattern BMP may include Ti or MoTi which is the same as that of a first source/drain metal layer of the source/drain electrode SD1/SD2 having a two-layer structure. The barrier metal pattern BMP may include Ti for absorbing and storing hydrogen, and thus, may collect hydrogen to prevent a characteristic of the TFT from being changed by hydrogen penetration.

The void portion VP may be implemented on the barrier metal pattern BMP. For example, the void portion VP may be disposed between the barrier metal pattern BMP and the passivation layer 101d.

A height of the void portion VP according to an embodiment may be the same as that of a second source/drain metal layer of the source/drain electrode SD1/SD2 having a two-layer structure. For example, the void portion VP may be formed through an etching process of removing the second source/drain metal layer stacked on the barrier metal pattern BMP. Therefore, the void portion VP according to an embodiment may be implemented in the passivation layer 101d to have the same cave (or tunnel) shape as that of the second source/drain metal layer which is removed by an etching process after being stacked on the barrier metal pattern BMP. For example, in the barrier pattern portion BPP, the second source/drain metal layer disposed on the barrier metal pattern BMP may be used as a sacrificial layer for forming the void portion VP in a process of manufacturing a display apparatus.

The void opening portion VOP may be implemented to expose an upper portion of the void portion VP. For example, the void opening portion VOP may be implemented for providing a path through which an etchant penetrates into the second source/drain metal layer, in the etching process of removing the second source/drain metal layer stacked on the barrier metal pattern BMP.

The void opening portion VOP according to an embodiment may be implemented to pass through a portion, overlapping the barrier metal pattern BMP, of the passivation layer 101d in a vertical direction Z, and thus, may communicate with the void portion VP to expose a portion of the void portion VP. For example, the void portion VP according to an embodiment may be implemented by removing the second source/drain metal layer stacked on the barrier metal pattern BMP through the etching process. Accordingly, the void opening portion VOP may expose a portion of the second source/drain metal layer covered by the passivation layer 101d, thereby enabling the second source/drain metal layer to be removed through the etching process.

The undercut area UCA may be implemented between both edge portions of the barrier metal pattern BMP and the passivation layer 101d. For example, the undercut area UCA may be implemented between the both edge portions of the barrier metal pattern BMP and the passivation layer 101d disposed near the void opening portion VOP to face each other with the void portion VP therebetween. The undercut area UCA may be defined as both edge portions of the void portion VP.

The undercut area UCA may be implemented for isolating (or disconnecting) a light emitting device layer 103 without using a separate cutting (or isolation) process. For example, the undercut area UCA may be implemented to isolate each of a common electrode CE and the light emitting device ED of the light emitting device layer 103.

Optionally, according to another embodiment, the barrier metal pattern BMP may be disposed on a gate insulation layer GI of the circuit layer 101. The barrier metal pattern BMP may directly contact a top surface of the gate insulation layer GI. The barrier metal pattern BMP may be disposed on the same layer as a gate electrode GE (or a gate line GL) of a TFT. For example, the barrier metal pattern BMP may include Ti or MoTi which is the same as that of a first gate metal layer of the gate electrode GE having a two-layer structure, and thus, may collect hydrogen, thereby preventing the characteristic of the TFT from being changed by hydrogen penetration.

Moreover, according to another embodiment, the void portion VP may have the same height as that of a second gate metal layer of the gate electrode GE having a two-layer structure. For example, the void portion VP may be formed through an etching process of removing the second gate metal layer stacked on the barrier metal pattern BMP. Therefore, the void portion VP according to another embodiment may be implemented in the interlayer insulation layer 101c to have the same cave (or tunnel) shape as that of the second gate metal layer which is removed by an etching process after being stacked on the barrier metal pattern BMP. For example, in the barrier pattern portion BPP, the second gate metal layer disposed on the barrier metal pattern BMP may be used as a sacrificial layer for forming the void portion VP in the process of manufacturing the display apparatus.

Moreover, according to another embodiment, the void opening portion VOP may be implemented to pass through a portion, overlapping the barrier metal pattern BMP, of the passivation layer 101d and the interlayer insulation layer 101c in the vertical direction Z, and thus, may communicate with the void portion VP to expose the void portion VP. For example, the void portion VP according to another embodiment may be implemented by removing the second gate metal layer stacked on the barrier metal pattern BMP through the etching process. Accordingly, the void opening portion VOP according to another embodiment may expose a portion of the second gate metal layer covered by the interlayer insulation layer 101c and the passivation layer 101d, thereby enabling the second gate metal layer to be removed through the etching process.

According to another embodiment, the undercut area UCA may be implemented between the both edge portions of the barrier metal pattern BMP and the interlayer insulation layer 101c. For example, the undercut area UCA may be implemented between the both edge portions of the barrier metal pattern BMP and the interlayer insulation layer 101c disposed near the void opening portion VOP to face each other with the void portion VP therebetween.

The barrier pattern portion BPP may isolate (or disconnect) the light emitting device ED of the light emitting device layer 103 disposed on the first substrate 100. For example, the light emitting device ED deposited on the barrier pattern portion BPP may be isolated (or disconnected) in the void portion VP or the undercut area UCA of the first barrier pattern portion BPP1. Therefore, the light emitting device ED may be automatically isolated (or disconnected) by the first barrier pattern portion BPP1 in a deposition process, and thus, in the display n portion further compr the present embodiment, the light emitting device ED may be isolated (or disconnected) by only the deposition process performed on the light emitting device ED even without a separate patterning process of isolating (or disconnecting) the light emitting device ED, so as to prevent lateral water penetration.

Moreover, the barrier pattern portion BPP may isolate (or disconnect) the common electrode CE of the light emitting device layer 103 disposed on the first substrate 100. For example, the common electrode CE deposited on the barrier pattern portion BPP may be isolated (or disconnected) in the void portion VP or the undercut area UCA of each of the first and second barrier pattern portions BPP1 and BPP2. Therefore, the common electrode CE may be automatically isolated (or disconnected) by the first and second barrier pattern portions BPP1 and BPP2 in a deposition process. Also, the common electrode CE disposed in the first and second margin areas MA1 and MA2 may surround an isolation surface of the light emitting device ED at the barrier pattern portion BPP, and thus, may prevent lateral water penetration through a boundary portion between the passivation layer 101d and the light emitting device ED, thereby preventing the reliability of the light emitting device ED from being reduced by lateral water penetration.

The barrier pattern portion BPP according to an embodiment may include a first island pattern EDi and a second island pattern CEi.

The first island pattern EDi may be formed of the same material along with the light emitting device ED disposed on the first substrate 100. The first island pattern EDi according to an embodiment may be disposed on the barrier metal pattern BMP of the first barrier pattern portion BPP1.

The first island pattern EDi may include a light emitting device material layer (or a light emitting device pattern) which is isolated (or disconnected) in an island shape from the light emitting device ED disposed on the first substrate 100. For example, the light emitting device ED may be deposited on a portion, other than an edge portion, of a first surface 100a of the first substrate 100 after a process of forming the barrier pattern portion BPP. Because a material of the light emitting device ED is strong in linearity, the material of the light emitting device ED deposited on the first barrier pattern portion BPP1 may be disposed on the passivation layer 101d and the barrier metal pattern BMP except the undercut area UCA.

In the first barrier pattern portion BPP1, the material of the light emitting device ED deposited on the barrier metal pattern BMP may be isolated (or disconnected) in island shape from the material of the light emitting device ED deposited on the passivation layer 101d by the undercut area UCA, thereby implementing the first island pattern EDi.

The second island pattern CEi may be formed of the same material along with the common electrode CE disposed on the first substrate 100. The second island pattern CEi according to an embodiment may be disposed on the first island pattern EDi of the first barrier pattern portion BPP1 and may be disposed on the barrier metal pattern BMP of the second barrier pattern portion BPP2.

The second island pattern CEi may include a common electrode material layer (or a common electrode pattern) which is isolated (or disconnected) in an island shape from the common electrode CE disposed on the first substrate 100. For example, after a process of forming the light emitting device ED, the common electrode CE may be deposited on a portion, other than the edge portion, of the first surface 100a of the first substrate 100. A material of the common electrode CE deposited on the first barrier pattern portion BPP1 may be disposed on the first island pattern EDi and the light emitting device ED except the undercut area UCA.

In the first barrier pattern portion BPP1, the material of the common electrode CE deposited on the first island pattern EDi may be isolated (or disconnected) in island shape from the material of the common electrode CE deposited on the light emitting device ED by the undercut area UCA, thereby implementing the second island pattern CEi.

Moreover, the material of the common electrode CE deposited on the second barrier pattern portion BPP2 may be disposed on the passivation layer 101d and the barrier metal pattern BMP except the undercut area UCA. Therefore, in the second barrier pattern portion BPP2, the material of the common electrode CE deposited on the barrier metal pattern BMP may be isolated (or disconnected) in island shape from the material of the common electrode CE deposited on the passivation layer 101d by the undercut area UCA, thereby implementing the second island pattern CEi.

The barrier pattern portion BPP may be surrounded by the above-described encapsulation layer 106.

The encapsulation layer 106 may surround a lateral surface (or an isolation surface) of each of the light emitting device ED and the common electrode CE isolated (or disconnected) by the barrier pattern portion BPP. The encapsulation layer 106 according to an embodiment may be filled into the void opening portion VOP and the void portion VP of the barrier pattern portion BPP to seal or completely surround the barrier pattern portion BPP, and thus, may completely surround or cover a lateral surface (or an isolation surface) of each of the isolated light emitting device ED and common electrode CE, thereby fundamentally (or completely) preventing lateral water penetration. For example, the barrier pattern portion BPP may be surrounded by a first encapsulation layer 106a and a third encapsulation layer 106c of the encapsulation layer 106.

The first encapsulation layer 106a of the encapsulation layer 106 disposed on the barrier pattern portion BPP may be disposed to surround (or to completely surround) each of the second island pattern CEi and an isolation pattern of the common electrode CE disposed in the barrier pattern portion BPP. For example, the first encapsulation layer 106a disposed on the second island pattern CEi may be isolated (or disconnected) in an island shape from the first encapsulation layer 106a disposed on the isolation pattern of the common electrode CE by the undercut area UCA of each of the first barrier pattern portion BPP1 and the second barrier pattern portion BPP2, thereby implementing a third island pattern 106ai.

The third encapsulation layer 106c of the encapsulation layer 106 disposed on the barrier pattern portion BPP may be implemented to completely surround the first encapsulation layer 106a disposed on the barrier pattern portion BPP. In this case, the third encapsulation layer 106c may be disposed on the barrier pattern portion BPP so as to continuously connect without being isolated (or disconnected) by the undercut area UCA of each of the first and second barrier pattern portion BPP1 and BPP2. In this case, the third encapsulation layer 106c may be fully filled into the void portion VP or may be filled into only a portion of the void portion VP, based on a size of the void portion VP implemented in each of the first and second barrier pattern portion BPP1 and BPP2.

Figure 15:
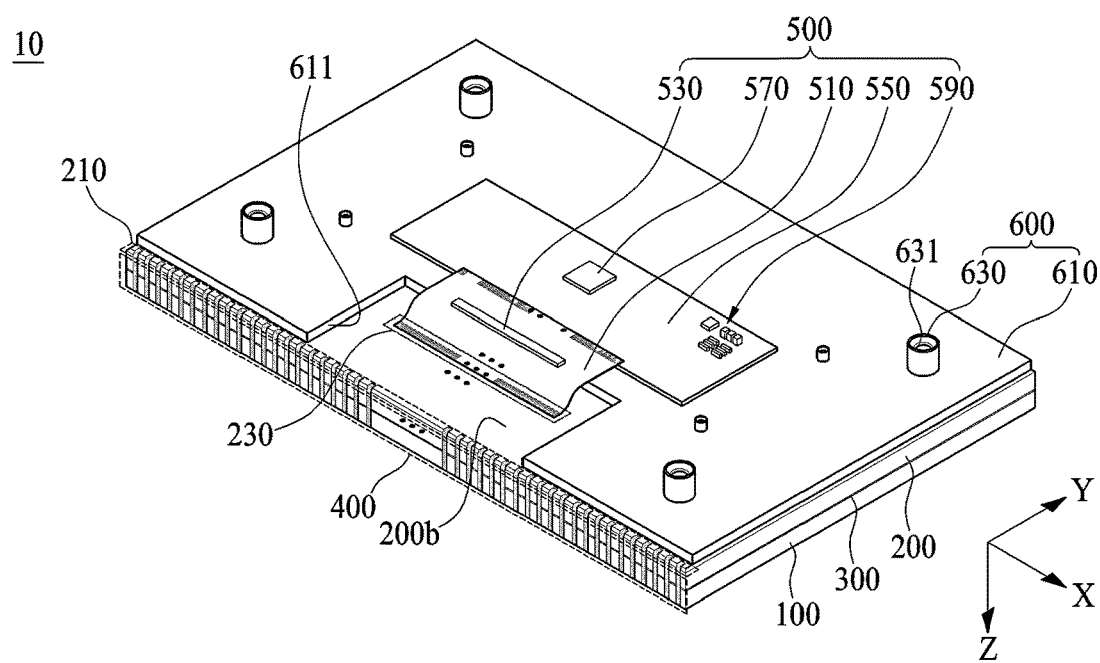
FIG. 15 is a diagram illustrating a rear surface of a second substrate illustrated in FIG. 13.

FIG. 15 is a diagram illustrating a rear surface of a second substrate illustrated in FIG. 3 and illustrates an embodiment where a panel supporting member is further provided on the second substrate of the display apparatus illustrated in FIGS. 1 to 14. In describing FIG. 15, elements which are the same or correspond to the elements of FIGS. 1 to 14 are referred to by like reference numerals, and their repetitive descriptions are omitted or will be briefly described below.

Referring to FIGS. 3 and 15, a display apparatus 10 according to an embodiment of the present disclosure may further include a panel supporting member 600 disposed on a rear surface 200b of a second substrate 200.

The panel supporting member 600 may be implemented to support a rear surface of a display panel including a first substrate 100 and a second substrate 200, which are bonded (or coupled) to each other by a coupling member 300. The panel supporting member 600 may be referred to as a rear cover, a back cover, or a rear member.

The panel supporting member 600 according to an embodiment may include a supporting plate 610 and a plurality of fastening members 630.

The supporting plate 610 may be connected to the rear surface 200b of the second substrate 200 to support a rear surface of the display panel. The supporting plate 610 may be disposed to cover a portion, other than a second pad part 210 and a third pad part 230, of the rear surface 200b of the second substrate 100 and may support a printed circuit board (PCB) 550 of a driving circuit unit 500. For example, the supporting plate 610 may be coupled to the rear surface 200b of the second substrate 200 by a plate coupling member such as a double-sided tape.

The supporting plate 610 may include a metal material. For example, the supporting plate 610 may include one material of Al, an Al alloy, a Mg alloy, a Fe—Ni alloy, and stainless steel, an alloy thereof, or a junction structure, but is not limited thereto.

The supporting plate 610 according to an embodiment may include a concave portion 611 where a portion of one side thereof is removed, for exposing the third pad part 230. For example, when seen downward from above, the supporting plate 610 may have a "Ш " or "└┘"-shape. In this case, the third pad part 230 of the second substrate 200 may be exposed in a rearward direction of the second substrate 200 by the concave portion 611 of the supporting plate 610. Also, the other edge portion of a flexible circuit film 510 attached on the third pad part 230 of the second substrate 200 may cover a stepped portion between the concave portion 611 of the supporting plate 610 and the second substrate 200 and may be electrically connected to the PCB 550 supported by the supporting plate 610.

According to another embodiment, the supporting plate 610 may include an opening hole for exposing the third pad part 230. For example, the supporting plate 610 may include a tetragonal opening hole which has a tetragonal shape covering a portion, other than the second pad part 210, of the rear surface 200b of the second substrate 200 and has a size which is relatively greater than that of the third pad part 230. For example, when seen downward from above, the supporting plate 610 may have a "回"-shape. In this case, the third pad part 230 of the second substrate 200 may be exposed in the rearward direction of the second substrate by the opening hole of the supporting plate 610. Also, the other edge portion of a flexible circuit film 510 attached on the third pad part 230 of the second substrate 200 may pass through the opening hole of the supporting plate 610 and may be electrically connected to the PCB 550 supported by the supporting plate 610.

The plurality of fastening member 630 may be disposed on a rear surface of the supporting plate 610. For example, the plurality of fastening members 630 may be disposed to contact each of corner portions of the supporting plate 610 and may protrude from the rear surface of the supporting plate 610 by a certain length.

Each of the plurality of fastening members 630 according to an embodiment may include a fastening groove 631 which is implemented to be concave from a front surface thereof.

Each of the plurality of fastening members 630 may be fixed to the rear surface of the supporting plate 610 by a fixing member such as a screw or a bolt. For example, the fixing member may pass through the fastening groove 631 of the fastening member 630 and may be fastened to the rear surface of the supporting plate 610, and thus, may fix a rear portion of the fastening member 630 to the rear surface of the supporting plate 610.

Each of the plurality of fastening members 630 according to an embodiment may include a material which may be magnetized by a magnet. According to another embodiment, each of the plurality of fastening members 630 may be coupled to the rear surface of the supporting plate 610 with a magnet block therebetween. For example, the magnet block may be a neodymium magnet.

The plurality of fastening members 630 may be respectively fastened to a plurality of fastening pins disposed in a rear frame unit supporting the display apparatus. For example, the fastening member 630 may be coupled to the fastening pin disposed in the rear frame unit on the basis of a magnetic force. Therefore, the display apparatus 10 according to the present disclosure may be mounted on the rear frame unit. Also, a plurality of display apparatuses 10 mounted on the rear frame unit may be continuously tiled in at least one of a first direction X and a second direction Y, and thus, a multi display apparatus or an infinitely-extendable display apparatus may be implemented. Here, the rear frame unit may be referred to as a rear structure, a display supporting unit, a tiling unit, a tiling structure, a cabinet unit, a module cabinet unit, or a cabinet structure. Also, the multi display apparatus may be referred to as a multi-panel display apparatus, a multi-screen display apparatus, or a tiling display apparatus.

Additionally, the display apparatus 10 according to an embodiment of the present disclosure may further include a circuit cover. The circuit cover may be coupled to a rear surface of the panel supporting member 600 to cover the driving circuit unit 500 exposed at the rear surface of the panel supporting member 600, and thus, may protect the driving circuit unit 500 from an external impact and may protect the driving circuit unit 500 from static electricity. The circuit cover according to an embodiment may include a metal material having a shape for covering the driving circuit unit 500 exposed at the rear surface of the panel supporting member 600. For example, the circuit cover may be referred to as a cover shield.

Figure 16:
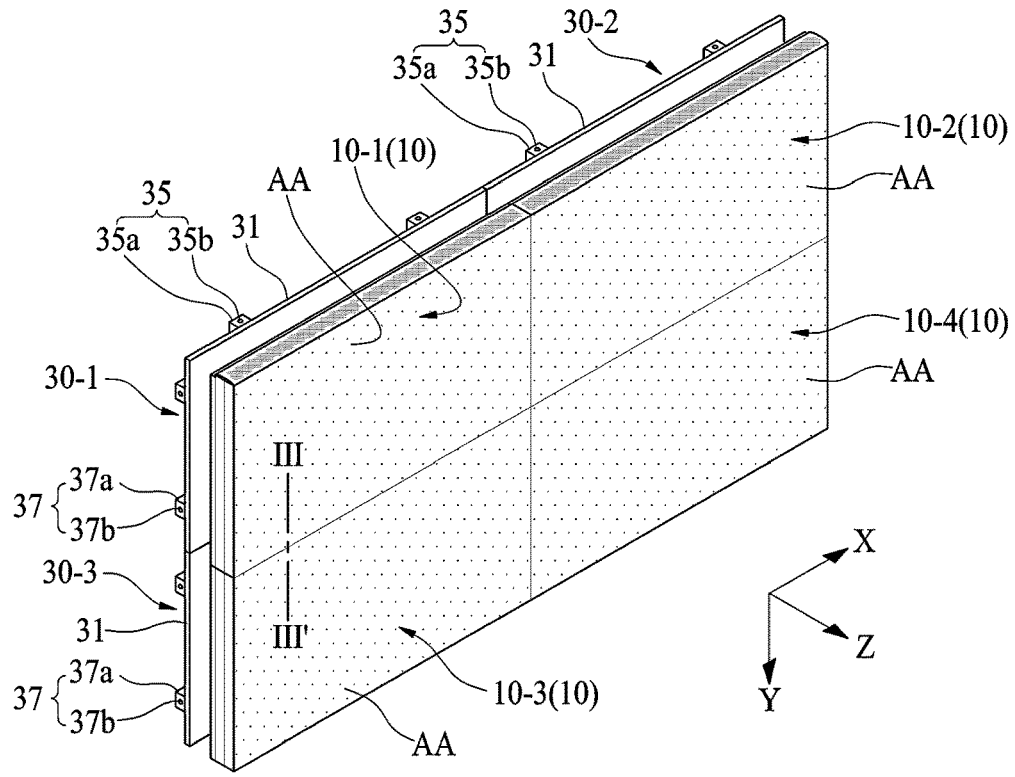
FIG. 16 is a diagram illustrating a multi display apparatus according to an embodiment of the present disclosure.
Figure 17:
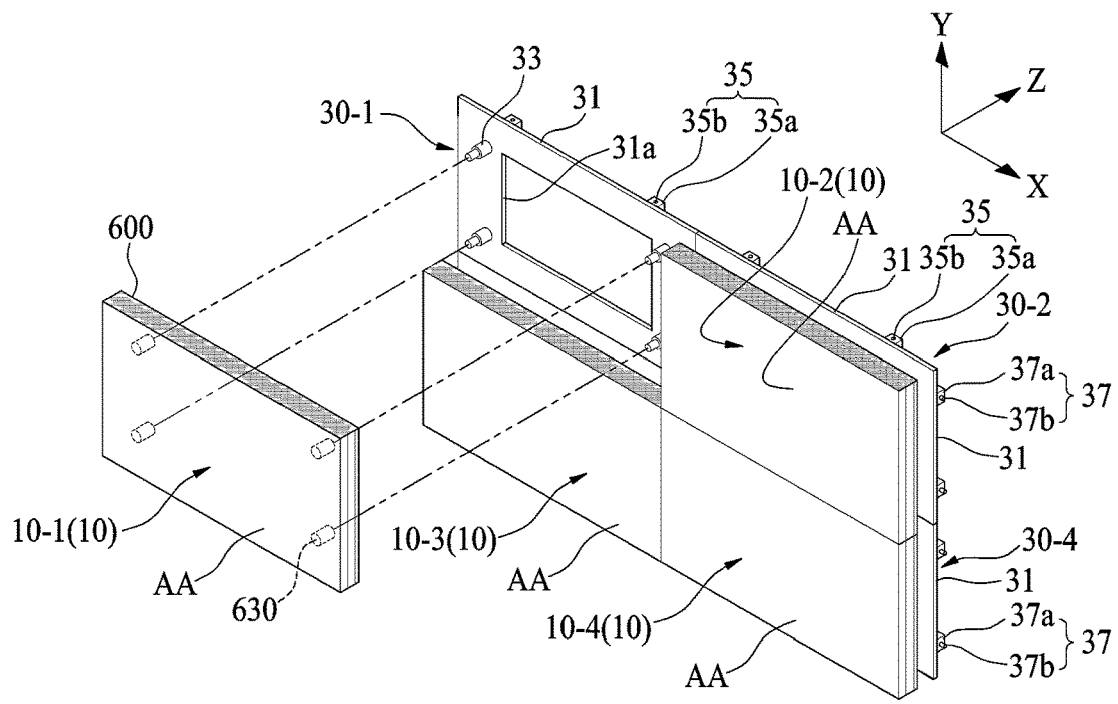
FIG. 17 is a diagram illustrating a tiling process performed on a display apparatus illustrated in FIG. 16.
Figure 18:
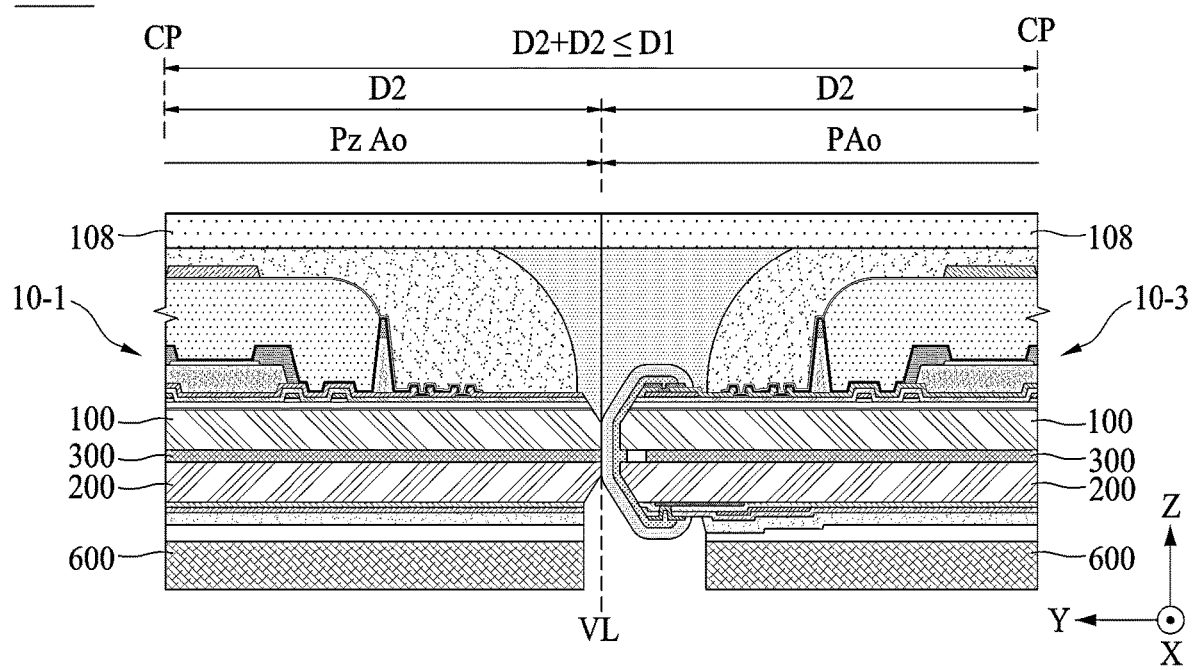
FIG. 18 is a cross-sectional view taken along line illustrated in FIG. 16.

FIG. 16 is a diagram illustrating a multi-display apparatus according to an embodiment of the present disclosure, FIG. 17 is a diagram illustrating a tiling process of a display apparatus illustrated in FIG. 16, and FIG. 18 is a cross-sectional view taken along line III-III' illustrated in FIG. 16.

Referring to FIGS. 16 to 18, the multi-display apparatus according to an embodiment of the present disclosure may include a plurality of display modules 10-1 to 10-4 and a plurality of rear frame units 30-1 to 30-4.

The plurality of display modules 10-1 to 10-4 may be arranged in an N×M form (where N is a positive integer of 2 or more and M is a positive integer of 2 or more), and thus, may each display an individual image or may divisionally display one image. Each of the plurality of display modules 10-1 to 10-4 may include the display apparatus 10 according to the present disclosure illustrated in FIGS. 1 to 15, and thus, its repetitive description is omitted.

The plurality of rear frame units 30-1 to 30-4 may be respectively coupled to the plurality of display modules 10-1 to 10-4 and may each support a corresponding display module of the plurality of display modules 10-1 to 10-4. The plurality of rear frame units 30-1 to 30-4 may be tiled in a first direction X and a second direction Y on the basis of a lateral coupling manner.

Each of the plurality of rear frame units 30-1 to 30-4 according to an embodiment may include a rear frame 31, a plurality of fastening pins 33, a plurality of first connection devices 35, and a plurality of second connection devices 37.

The rear frame 31 may be disposed on a rear surface of each of the display modules 10-1 to 10-4. The rear frame 31 according to an embodiment may include a plate shape having a size corresponding to the display modules 10-1 to 10-4. Also, the rear frame 31 may include a through hole 31*a* which enables a cable, connecting a driving system (or a main control board) of a multi display apparatus to a PCB of each of the display modules 10-1 to 10-4, to pass through. The through hole 31*a* may have a circular shape or a polygonal shape, which passes through a center portion of the rear frame 31.

Each of the plurality of fastening pins 33 may be disposed on a front surface of the rear frame 31. For example, the plurality of fastening pins 31 may be respectively disposed adjacent to corner portions of the rear frame 31 and may protrude from the front surface of the rear frame 31 by a certain length. That is, each of the plurality of fastening pins 33 may be fixed to the front surface of the rear frame 31 overlapping each of the plurality of fastening members 630 disposed in the panel supporting member 600 included in the display apparatus 10 of each of the display modules 10-1 to 10-4.

Each of the plurality of fastening pins 33 may be fixed to the front surface of the rear frame 31 by a fixing member such as a screw or a bolt. For example, the fixing member may pass through the rear frame 31 and may be fastened to a rear portion of the fastening pin 33, and thus, may fix the rear portion of the fastening pin 33 to the front surface of the rear frame 31.

One side portion of each of the plurality of fastening pins 33 may have a size which enables each fastening pin 33 to be inserted into the fastening groove 631 of a corresponding fastening member 630. For example, the one portion of each of the plurality of fastening pins 33 may have a first diameter which enables each fastening pin 33 to be inserted into the fastening groove 631 of a corresponding fastening member 630. Also, the other portion of each of the plurality of fastening pins 33 may have a second diameter which is greater than the first diameter, so as to contact the front portion of the fastening member 630.

Each of the plurality of fastening pins 33 according to an embodiment may include a metal material. Therefore, each of the plurality of fastening pins 33 may be inserted into the fastening groove of a corresponding fastening member 630 of the plurality of fastening members 630 by a magnetic force of the corresponding fastening member 630, and thus, may be fastened to the corresponding fastening member 630.

Optionally, each of the plurality of fastening pins 33 according to an embodiment may be coupled to the front surface of the rear frame 31 with a magnet block therebetween. The magnet block may be a neodymium magnet. In this case, the magnet block of each of the plurality of fastening pins 33 may be implemented to have an attractive force based on a magnetic force of the fastening member 630.

The plurality of first connection devices 35 may be arranged at certain intervals at first and second rear edge portions, which are parallel to the first direction (or a horizontal direction or a widthwise direction) X, of the rear surface of the rea frame 31. Each of the plurality of first connection devices 35 may be implemented to be connected to a first connection device of a rear frame disposed at an upper portion and to be connected to a first connection device of a rear frame disposed at a lower portion, with respect to the second direction (or a vertical direction or a lengthwise direction) Y.

Each of the plurality of first connection devices 35 according to an embodiment may include a first connection body 35*a* and a first connection member 35*b*.

The first connection body 35*a* may be disposed at each of first and second rear edge portions of the rear frame 31.

The first connection member 35*b* may be disposed on an outer surface of the first connection body 35*a* exposed in the second direction Y. The first connection member 35*b* may be a protrusion pin or a pin hole. According to an embodiment, a first connection member 35*b* of a first connection device 35 disposed at a first rear edge portion of the rear frame 31 may be a pin hole, and a first connection member 35*b* of a first connection device 35 disposed at a second rear edge portion of the rear frame 31 may be a protrusion pin.

The first connection member 35*b* including a protrusion pin may move in the second direction Y on the basis of a rotation thereof based on a handwork of a worker to move the rear frame 31 in the second direction Y. Therefore, the rotation of the first connection member 35*b* including the protrusion pin may be used to align an adjacent rear frame 31 in the second direction Y.

Each of the plurality of first connection devices 35 according to an embodiment may further include a first fine adjustment member disposed in the first connection body 35*a* including the first connection member 35*b* including a pin hole.

The first fine adjustment member may be disposed in the first connection body 35*a* and may be implemented to move the protrusion pin inserted into the pin hole in the first direction X or a third direction (or a forward and rearward direction or a thickness direction) Z parallel to a thickness direction of the display apparatus 10. The first fine adjustment member according to an embodiment may include a first fine adjustment bolt and a second fine adjustment bolt, which are disposed in the first connection body 35*a*. For example, the first fine adjustment bolt and the second fine adjustment bolt may each be a non-head bolt.

The first fine adjustment bolt may be disposed on the other surface of the first connection body 35*a* facing the first direction X and may move the protrusion pin inserted into the pin hole in the first direction X. A rotation of the first fine adjustment bolt may be used to align an adjacent rear frame 31 in the first direction X.

The second fine adjustment bolt may be disposed on a rear surface of the first connection body 35*a* and may move the protrusion pin inserted into the pin hole in the third direction Z. A rotation of the second fine adjustment bolt may be used to align an adjacent rear frame 31 in the third direction Z.

The plurality of second connection devices 37 may be arranged at certain intervals at third and fourth rear edge portions, which are parallel to the second direction Y, of the rear surface of the rea frame 31. Each of the plurality of second connection devices 37 may be implemented to be connected to a second connection device of a rear frame disposed at a left portion and to be connected to a second connection device of a rear frame disposed at a right portion, with respect to the first direction X.

Each of the plurality of second connection devices 37 according to an embodiment may include a second connection body 37a and a second connection member 37b.

The second connection body 37a may be disposed at each of third and fourth rear edge portions of the rear frame 31.

The second connection member 37b may be disposed on an outer surface of the second connection body 37a exposed in the first direction X. The second connection member 37b may be a protrusion pin or a pin hole. According to an embodiment, a second connection member 37b of a second connection device 37 disposed at a third rear edge portion of the rear frame 31 may be a pin hole, and a second connection member 37b of a second connection device 37 disposed at a fourth rear edge portion of the rear frame 31 may be a protrusion pin.

The second connection member 37b including a protrusion pin may move in the first direction X on the basis of a rotation thereof based on a handwork of the worker to move the rear frame 31 in the first direction X. Therefore, the rotation of the second connection member 37b including the protrusion pin may be used to align an adjacent rear frame 31 in the first direction X.

Each of the plurality of second connection devices 37 according to an embodiment may further include a second fine adjustment member disposed in the second connection body 37a including the second connection member 37b including a pin hole.

The second fine adjustment member may be disposed in the second connection body 37a and may be implemented to move the protrusion pin inserted into the pin hole in the second direction Y or the third direction Z. The second fine adjustment member according to an embodiment may include a third fine adjustment bolt and a fourth fine adjustment bolt, which are disposed in the second connection body 37a. For example, the third fine adjustment bolt and the fourth fine adjustment bolt may each be a non-head bolt.

The third fine adjustment bolt may be disposed on the other surface of the second connection body 37a facing the second direction Y and may move the protrusion pin inserted into the pin hole in the second direction Y. A rotation of the third fine adjustment bolt may be used to align an adjacent rear frame 31 in the second direction Y.

The fourth fine adjustment bolt may be disposed on a rear surface of the second connection body 37a and may move the protrusion pin inserted into the pin hole in the third direction Z. A rotation of the fourth fine adjustment bolt may be used to align an adjacent rear frame 31 in the third direction Z.

Each of the plurality of rear frame units 30-1 to 30-4 may support a corresponding display module of the plurality of display modules 10-1 to 10-4 and may be tiled in a 2×2 form in the first direction X and the second direction Y, and based on the tiling, the plurality of display modules 10-1 to 10-4 may implement a large-screen display apparatus.

Each of the plurality of display modules 10-1 to 10-4 may not include a bezel area (or a non-display area) surrounding all of a display area AA and may have an air-bezel structure where the display area AA is surrounded by air. That is, in each of the plurality of display modules 10-1 to 10-4, all of a first surface of a first substrate 100 may be implemented as the display area AA. Therefore, an image displayed by a multi display apparatus where the plurality of display modules 10-1 to 10-4 are tiled in a 2×2 form may be continuously displayed without a sense of discontinuity (for discontinuity) at a boundary portion between the plurality of display modules 10-1 to 10-4, and thus, the immersion of a viewer watching an image displayed by the multi display apparatus may be enhanced.

According to the present embodiment, in each of the plurality of display modules 10-1 to 10-4, a second interval D2 between a center portion CP of an outermost pixel Po and an outermost outer surface VL of the first substrate 100 may be implemented to be half or less of a first interval D1 between adjacent pixels. Accordingly, in two adjacent display modules connected to (or contacting) each other at side surfaces thereof in the first direction X and the second direction Y on the basis of a lateral coupling manner, an interval "D2+D2" between adjacent outermost pixel areas PAo may be equal to or less than the first interval D1 between two adjacent pixels.

Referring to FIG. 18, in first and third display modules 10-1 and 10-3 connected to (or contacting) each other at side surfaces thereof in the second direction Y, the interval "D2+D2" between a center portion CP of an outermost pixel area PAo of the first display module 10-1 and a center portion CP of an outermost pixel area PAo of the third display module 10-3 may be equal to or less than the first interval D1 between two adjacent pixels disposed in each of the first and third display modules 10-1 and 10-3.

Therefore, the interval "D2+D2" between center portions CP of outermost pixels Po of two adjacent display modules connected to (or contacting) each other at side surfaces thereof in the first direction X and the second direction Y may be equal to or less than the first interval D1 between two adjacent pixels disposed in each of the display modules 10-1 to 10-4, and thus, there may be no seam or boundary portion between two adjacent display modules, whereby there may be no dark area caused by a boundary portion provided between the display modules 10-1 to 10-4.

As a result, in a case where the display area AA of each of the plurality of display modules 10-1 to 10-4 is one screen and displays one image, a multi display apparatus according to the present disclosure may display an image which is not disconnected and is continuous at a boundary portion between the plurality of display modules 10-1 to 10-4.

In FIGS. 16 and 17, it is illustrated that the plurality of display modules 10-1 to 10-4 are tiled in a 2×2 form, but the present disclosure is not limited thereto and the plurality of display modules 10-1 to 10-4 may be tiled in an x×1 form, a 1×y form, or an x×y form. Here, x may be a natural number which is 2 or more, and y may be a natural number which is 2 or more.

Figure 19A:
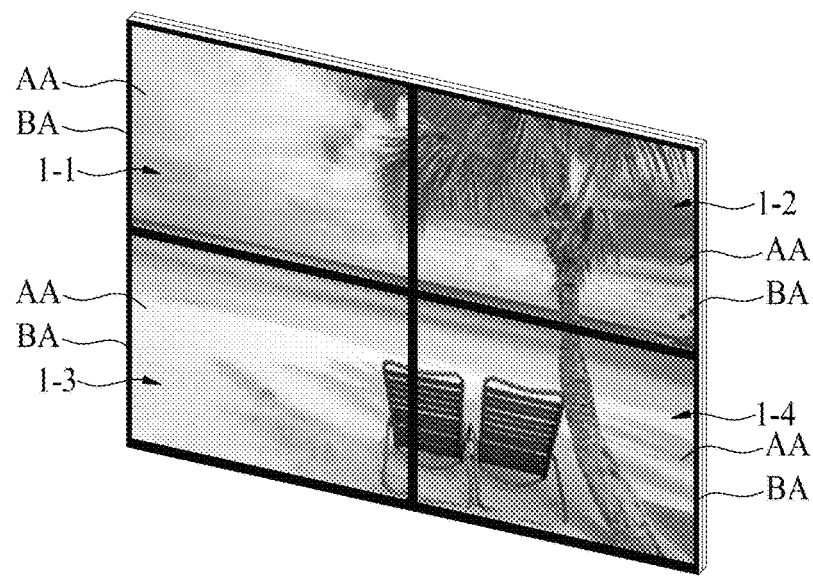
FIGS. 19A and 19B are diagrams illustrating images respectively displayed by a multi display apparatus according to a comparative example and a multi display apparatus according to the present disclosure.
Figure 19B:
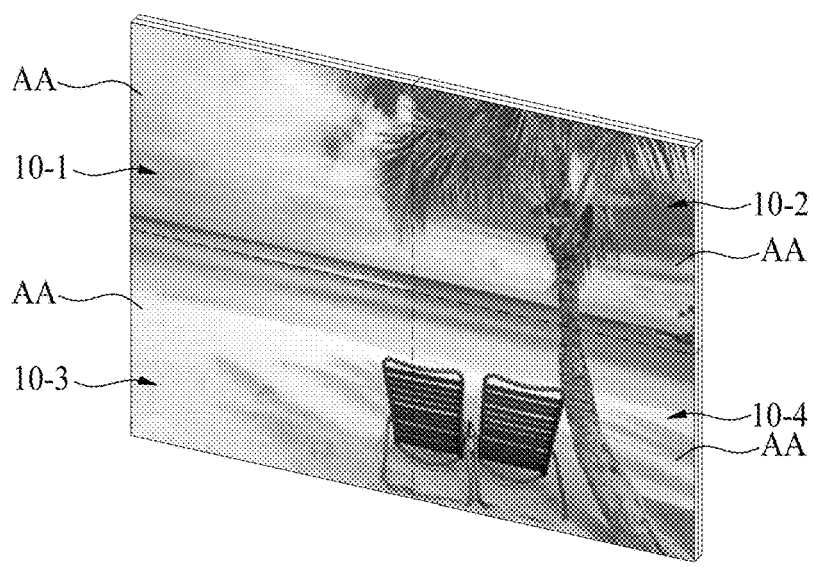

FIGS. 19A and 19B are diagrams illustrating images respectively displayed by a multi-display apparatus according to a comparative example and a multi-display apparatus according to the present disclosure. A dotted line illustrated in FIG. 19B represents a boundary portion between display modules and is irrelevant to an image displayed by a multi display apparatus.

Referring to FIG. 19A, the multi display apparatus according to the comparative example may be implemented by tiling a plurality of display modules 1-1 to 1-4 including a bezel area (or a non-display area) BA completely surrounding a display area AA, and thus, it may be seen that an image displayed by the multi display apparatus according to the comparative example is disconnected and displayed at a boundary portion between the plurality of display modules 1-1 to 1-4 due to the bezel area BA of each of the plurality of display modules 1-1 to 1-4. Therefore, in the multi display apparatus according to the comparative example, a sense of discontinuity (or discontinuity) of an image may occur in a boundary portion between the plurality of display modules 1-1 to 1-4 due to the bezel area BA of each of the plurality of display modules 1-1 to 1-4, and due to this, the immersion of a viewer watching an image may decrease.

Referring to FIG. 19B, the multi display apparatus according to the present disclosure may be implemented by tiling a plurality of display modules 10-1 to 10-4 including an air-bezel structure where a whole first surface of a first substrate 100 is a display area AA and is surrounded by air, and thus, it may be seen that an image displayed by the multi display apparatus according to the present disclosure is continuous at a boundary portion between the plurality of display modules 10-1 to 10-4 without a sense of discontinuity (or discontinuity) of the displayed image. Therefore, the multi display apparatus according to the present disclosure may display an image which is continuous at a boundary portion between the plurality of display modules 10-1 to 10-4 without a sense of discontinuity (or discontinuity) of the image.

As a result, even in a case where the plurality of display modules 10-1 to 10-4 are connected to one another at side surfaces thereof in a lattice form, the multi display apparatus according to the present disclosure may display an image which is continuous at the boundary portion between the plurality of display modules 10-1 to 10-4 without a sense of discontinuity (or discontinuity) of the image, thereby enhancing the immersion of a viewer watching an image.

A display apparatus and a multi display apparatus including the same according to the present disclosure will be described below.

A display apparatus according to some embodiments of the present disclosure may include a first substrate including a plurality of pixel areas provided in a display portion, a second substrate coupled to the first substrate, and a routing portion disposed on an outer surface of the first substrate and an outer surface of the second substrate, wherein the first substrate includes a passivation layer disposed on the display portion, a barrier pattern portion implemented in the passivation layer on an edge portion of the display portion, the barrier pattern portion including a barrier metal pattern, and a light emitting device layer including a light emitting device disposed on the barrier pattern portion and the plurality of pixel areas, and the light emitting device may be isolated by the barrier pattern portion.

According to some embodiments of the present disclosure, the light emitting device layer may further include a common electrode disposed on the light emitting device, and each of the light emitting device and the common electrode may be isolated by the barrier pattern portion.

According to some embodiments of the present disclosure, the common electrode may surround an isolation surface of the light emitting device isolated by the barrier pattern portion.

According to some embodiments of the present disclosure, the barrier metal pattern may include a material for collecting hydrogen.

According to some embodiments of the present disclosure, the barrier metal pattern may have a single-layer structure or a multi-layer structure including at least one material of titanium (Ti) and a molybdenum-titanium alloy (MoTi).

According to some embodiments of the present disclosure, the first substrate may further include an interlayer insulation layer disposed on the display portion and a passivation layer disposed on the interlayer insulation layer, the barrier metal pattern may be disposed on the interlayer insulation layer, and the barrier pattern portion may further include an opening portion passing through the passivation layer overlapping the barrier metal pattern, and an undercut area disposed between the barrier metal pattern and the passivation layer.

According to some embodiments of the present disclosure, the first substrate may further include a passivation layer disposed on the display portion and a dam pattern disposed on the passivation layer along an edge of the display portion, and the barrier pattern portion may surround the dam pattern.

According to some embodiments of the present disclosure, the barrier pattern portion and the dam pattern may be provided within an outermost pixel area among the plurality of pixel areas.

According to some embodiments of the present disclosure, the barrier pattern portion may further include a void portion disposed between the barrier metal pattern and the passivation layer and a void opening portion passing through the passivation layer overlapping the void portion to communicate with the void portion, and the passivation layer disposed in the barrier pattern portion may overlap both edge portions of the barrier metal pattern.

According to some embodiments of the present disclosure, the first substrate may further include a passivation layer disposed on the display portion, the barrier pattern portion may include an isolation structure for isolating the light emitting device, and the isolation structure may include an undercut area provided between both edge portions of the barrier metal pattern and the passivation layer.

According to some embodiments of the present disclosure, the first substrate may further includes an encapsulation layer disposed on the common electrode and the barrier pattern portion, and the encapsulation layer may seal the barrier pattern portion.

A display apparatus according to some embodiments of the present disclosure may include a first substrate including a plurality of pixel areas provided in a display portion, a dam pattern disposed in an outermost pixel area of the plurality of pixel areas, a barrier pattern portion disposed in the outermost pixel area to surround the dam pattern, a light emitting device layer including a common electrode and a light emitting device disposed on the plurality of pixel areas, and a second substrate coupled to the first substrate, wherein the barrier pattern portion may include an isolation structure for isolating the light emitting device and the common electrode.

According to some embodiments of the present disclosure, the first substrate may further include a passivation layer disposed on the display portion, and the isolation structure may include an undercut area provided in the passivation layer.

According to some embodiments of the present disclosure, the barrier pattern portion may further include a barrier metal pattern, the first substrate may further include a passivation layer disposed on the barrier metal pattern, and the undercut area may be disposed between the barrier metal pattern and the passivation layer.

According to some embodiments of the present disclosure, the barrier metal pattern may include a material for collecting hydrogen, or has a single-layer structure or a multi-layer structure including at least one material of titanium (Ti) and a molybdenum-titanium alloy (MoTi).

According to some embodiments of the present disclosure, the barrier metal pattern may further include a first island pattern isolated from the light emitting device, and a second island pattern disposed on the first island pattern and isolated from the common electrode.

According to some embodiments of the present disclosure, the first substrate may further include an encapsulation layer disposed on the common electrode and the barrier pattern portion, and the encapsulation layer may seal the barrier pattern portion.

A multi display apparatus according to some embodiments of the present disclosure may include a plurality of display modules arranged in at least one direction of a first direction and a second direction transverse to the first direction, wherein each of the plurality of display modules may include a first substrate including a plurality of pixel areas provided in a display portion, a second substrate coupled to the first substrate, and a routing portion disposed on an outer surface of the first substrate and an outer surface of the second substrate, wherein the first substrate may include a passivation layer disposed on the display portion, a barrier pattern portion implemented in the passivation layer on an edge portion of the display portion, the barrier pattern portion including a barrier metal pattern, and a light emitting device layer including a light emitting device disposed on the barrier pattern portion and the plurality of pixel areas, and the light emitting device may be isolated by the barrier pattern portion.

A multi display apparatus according to some embodiments of the present disclosure may include a plurality of display modules arranged in at least one direction of a first direction and a second direction transverse to the first direction, wherein each of the plurality of display modules may include a first substrate including a plurality of pixel areas provided in a display portion, a dam pattern disposed in an outermost pixel area of the plurality of pixel areas, a barrier pattern portion disposed in the outermost pixel area to surround the dam pattern, a light emitting device layer including a common electrode and a light emitting device disposed on the plurality of pixel areas, and a second substrate coupled to the first substrate, wherein the barrier pattern portion may include an isolation structure for isolating the light emitting device and the common electrode.

According to some embodiments of the present disclosure, in two adjacent display modules respectively including side surfaces contacting each other among the plurality of display modules, a second interval between center portions of adjacent outermost pixel areas may be equal to or less than a first interval between center portions of two adjacent pixel areas.

According to some embodiments of the present disclosure, each of the plurality of display modules may further include a panel supporting member, and the panel supporting member includes a supporting plate connected to a rear surface of the second substrate and a plurality of fastening members disposed on a rear surface of the supporting plate, the plurality of fastening members being magnetized by a magnet.

The display apparatus according to the present disclosure may be applied to all electronic devices including a display panel. For example, the display apparatus according to the present disclosure may be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation devices, automotive navigation devices, automotive display devices, TVs, wall paper display devices, signage devices, game machines, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus, comprising:
  a first substrate including a plurality of pixel areas provided in a display portion;
  a second substrate coupled to the first substrate; and
  a routing portion disposed on an outer surface of the first substrate and an outer surface of the second substrate,
  wherein the first substrate comprises:
  a passivation layer disposed on the display portion;
  a dam pattern disposed on the passivation layer along an edge of the display portion;
  a barrier pattern portion implemented in the passivation layer on an edge portion of the display portion, the barrier pattern portion including a barrier metal pattern; and
  a light emitting device layer including a light emitting device disposed on the barrier pattern portion and the plurality of pixel areas,
  wherein the light emitting device is isolated by the barrier pattern portion, and
  wherein the barrier pattern portion surrounds the dam pattern.

2. The display apparatus of claim 1, wherein the light emitting device layer further comprises a common electrode disposed on the light emitting device, and
  wherein each of the light emitting device and the common electrode is isolated by the barrier pattern portion.

3. The display apparatus of claim 2, wherein the common electrode surrounds an isolation surface of the light emitting device isolated by the barrier pattern portion.

4. The display apparatus of claim 2, wherein the first substrate further comprises an encapsulation layer disposed on the common electrode and the barrier pattern portion, and
  wherein the encapsulation layer seals the barrier pattern portion.

5. The display apparatus of claim 1, wherein the barrier metal pattern comprises a material for collecting hydrogen.

6. The display apparatus of claim 1, wherein the barrier metal pattern has a single-layer structure or a multi-layer structure including at least one material of titanium (Ti) and a molybdenum-titanium alloy (MoTi).

7. The display apparatus of claim 1, wherein the first substrate further comprises:

an interlayer insulation layer disposed on the display portion,
wherein the barrier metal pattern is disposed on the interlayer insulation layer, and
wherein the barrier pattern portion further comprises:
an opening portion passing through the passivation layer overlapping the barrier metal pattern; and
an undercut area disposed between the barrier metal pattern and the passivation layer.

8. The display apparatus of claim 1, wherein the barrier pattern portion and the dam pattern are provided within an outermost pixel area among the plurality of pixel areas.

9. The display apparatus of claim 1, wherein the barrier pattern portion further comprises:
a void portion disposed between the barrier metal pattern and the passivation layer; and
a void opening portion passing through the passivation layer overlapping the void portion to communicate with the void portion, and
wherein the passivation layer disposed in the barrier pattern portion overlaps both edge portions of the barrier metal pattern.

10. The display apparatus of claim 1, wherein:
the barrier pattern portion comprises an isolation structure for isolating the light emitting device, and
the isolation structure comprises an undercut area provided between both edge portions of the barrier metal pattern and the passivation layer.

11. A multi display apparatus, comprising:
a plurality of display modules arranged in at least one direction of a first direction and a second direction transverse to the first direction,
wherein each of the plurality of display modules comprises the display apparatus of claim 1.

12. The multi display apparatus of claim 11, wherein, in two adjacent display modules respectively including side surfaces contacting each other among the plurality of display modules, a second interval between center portions of adjacent outermost pixel areas is equal to or less than a first interval between center portions of two adjacent pixel areas.

13. The multi display apparatus of claim 11, wherein each of the plurality of display modules further comprises a panel supporting member, and
the panel supporting member comprises:
a supporting plate connected to a rear surface of the second substrate; and
a plurality of fastening members disposed on a rear surface of the supporting plate, the plurality of fastening members being magnetized by a magnet.

14. A display apparatus, comprising:
a first substrate including a plurality of pixel areas provided in a display portion;
a dam pattern disposed in an outermost pixel area of the plurality of pixel areas;
a barrier pattern portion disposed in the outermost pixel area to surround the dam pattern;
a light emitting device layer including a common electrode and a light emitting device disposed on the plurality of pixel areas; and
a second substrate coupled to the first substrate,
wherein the barrier pattern portion comprises an isolation structure for isolating the light emitting device and the common electrode.

15. The display apparatus of claim 14, wherein the first substrate further comprises a passivation layer disposed on the display portion, and
wherein the isolation structure comprises an undercut area provided in the passivation layer.

16. The display apparatus of claim 14, wherein:
the barrier pattern portion further comprises a barrier metal pattern,
the first substrate further comprises a passivation layer disposed on the barrier metal pattern, and
an undercut area is disposed between the barrier metal pattern and the passivation layer.

17. The display apparatus of claim 16, wherein the barrier metal pattern comprises a material for collecting hydrogen, or has a single-layer structure or a multi-layer structure including at least one material of titanium (Ti) and a molybdenum-titanium alloy (MoTi).

18. The display apparatus of claim 16, wherein the barrier metal pattern further comprises:
a first island pattern isolated from the light emitting device; and
a second island pattern disposed on the first island pattern and isolated from the common electrode.

19. The display apparatus of claim 14, wherein the first substrate further comprises an encapsulation layer disposed on the common electrode and the barrier pattern portion, and
wherein the encapsulation layer seals the barrier pattern portion.

* * * * *